(12) United States Patent
Novak et al.

(10) Patent No.: US 7,352,991 B2
(45) Date of Patent: Apr. 1, 2008

(54) SATELLITE SIGNAL DISTRIBUTION SYSTEMS

(75) Inventors: Abram Novak, Oceanside, NY (US); Joris Goemaere, Poperinge (BE)

(73) Assignee: National Antenna Systems, Oceanside, NY (US)

( * ) Notice: Subject to any disclaimer, the term of this patent is extended or adjusted under 35 U.S.C. 154(b) by 909 days.

(21) Appl. No.: 10/384,029

(22) Filed: Mar. 7, 2003

(65) Prior Publication Data

US 2003/0179723 A1 Sep. 25, 2003

Related U.S. Application Data

(60) Provisional application No. 60/366,472, filed on Mar. 21, 2002.

(51) Int. Cl.
*H04H 1/00* (2006.01)

(52) U.S. Cl. .................. 455/3.02; 455/3.01; 455/3.03; 455/12.1; 370/316; 370/480; 370/464; 370/481

(58) Field of Classification Search ............... 455/3.02, 455/3.01, 3.03, 12.1; 370/316, 480, 464, 370/481

See application file for complete search history.

(56) References Cited

U.S. PATENT DOCUMENTS

| | | | |
|---|---|---|---|
| 4,520,508 A | 5/1985 | Reichert | |
| 4,672,687 A | 6/1987 | Horton et al. | 455/277 |
| 4,802,239 A | 1/1989 | Ooto | 455/277 |
| 5,073,930 A * | 12/1991 | Green et al. | 725/69 |
| 5,263,182 A | 11/1993 | Park | 455/209 |
| 5,301,352 A * | 4/1994 | Nakagawa et al. | 725/71 |
| 5,485,196 A | 1/1996 | Nathan et al. | 348/7 |
| 5,565,805 A * | 10/1996 | Nakagawa et al. | 327/99 |
| 5,568,158 A | 10/1996 | Gould | 343/756 |
| 5,574,964 A | 11/1996 | Hamlin | 455/3.1 |
| 5,574,965 A | 11/1996 | Welmer | 455/3.2 |
| 5,787,335 A * | 7/1998 | Novak | 725/69 |
| 5,805,975 A | 9/1998 | Green, Sr. et al. | 455/3.2 |
| 5,926,744 A * | 7/1999 | Fukuzawa et al. | 725/69 |
| 5,959,592 A | 9/1999 | Petruzzelli | 343/840 |
| 5,970,386 A | 10/1999 | Williams | 455/4.1 |
| 6,122,482 A | 9/2000 | Green, Sr. et al. | 455/3.1 |
| 6,622,307 B1 * | 9/2003 | Ho | 725/120 |
| 2002/0021716 A1 * | 2/2002 | Terk | 370/493 |

FOREIGN PATENT DOCUMENTS

WO 9822992 5/1998

* cited by examiner

*Primary Examiner*—Rafael Perez-Gutierrez
*Assistant Examiner*—Khai Nguyen
(74) *Attorney, Agent, or Firm*—Gary M. Butter

(57) ABSTRACT

Various configurations and equipment are described for providing satellite television programming from multiple satellite antennas to receivers, particularly to receivers located in apartments within a multiple-dwelling unit and having one or more satellite television receivers. In some arrangements a multitude of signals are provided to the users independent of what programming is actually being used. In an alternate configuration the system provides the user with signals that are selected from the available signals according to the programming selected by the user.

11 Claims, 55 Drawing Sheets

SATELLITE SIGNAL DISTRIBUTION SYSTEMS

This Application claims the benefit of U.S. Provisional Application Ser. No. 60/366,934, filed Mar. 21, 2002.

This application relates to satellite antenna distribution systems. Such systems are described in prior U.S. Pat. No. 5,787,335, the specification and drawings of which are incorporated herein by reference. In addition, there is a related International Application published as WO 98/22992 which was published May 28, 1998, corresponding to pending U.S. patent application Ser. No. 09/284,934, filed Jun. 18, 1999, which is incorporated herein by reference.

BACKGROUND OF THE INVENTION

The present application relates to other new and improved systems for providing satellite signals to receivers and television sets located at various positions within a building or community, including, for example, a private houses or multiple dwelling units.

FIG. 1 is an illustration of a known system for delivering satellite signals from multiple satellites to satellite receivers attached to television sets. In FIG. 1 there is provided a four-way multiswitch 10 which has four inputs 12A, 14A, 12B, and 14B which are connected to satellite receiving antennas labeled Sat. A and Sat. B in FIG. 1. Each antenna provides signals of right-hand circular polarization and left-hand circular polarization. These signals are provided to input satellite terminals 12A, 14A, 12B, and 14B of switch 10. Switch 10 has four output terminals labeled 16A through 16D, each of which is connected to a respective satellite receiver 18A to 18D and a respective television set receiver 20A to 20D. The four-way multiswitch 10 is arranged to connect the signal from any of the outputs of each satellite antenna to a respective satellite receiver 18, so that the person using each television set can view signals on a channel which is broadcast by either satellite A or satellite B on either polarization from the satellite.

FIG. 2 shows a known arrangement wherein a 6×4 multiswitch 22 is used to connect signals from three satellite antennas, labeled Sat A, Sat B, and Sat C to any of four satellite receivers 18A to 18D and the associated television sets 20A to 20D. One characteristic of the prior art represented by FIGS. 1 and 2 is that a separate cable is required interconnecting the satellite system, including the multiswitch, with each satellite receiver of the system.

The use of separate cables can be a problem in connection with providing satellite signals to multiple locations within a house or a multiple dwelling unit. In particular, most of the multiple dwelling units are provided with a single cable run from a common utility room to the tenant's units. The routing of additional cables to provide independent satellite signals as well as off-air broadcast signals to television sets throughout a building is inconvenient in requiring the routing of cables through walls, etc. to each room that has a satellite receiver.

It is an object of the present invention to provide improved arrangements for providing satellite television signals over a shared television signal delivery system, such as a master antenna television system.

SUMMARY OF THE INVENTION

In accordance with the invention there is provided a multiplexer for frequency multiplexing at least three satellite antenna output signals having selected overlapping frequency bands onto a cable. The multiplexer includes a plurality of mixers, the plurality being one less than the number of satellite signals, each receiving one of the satellite antenna output signals. There is further provided a plurality of local oscillators, each associated with one of the mixers, each of the local oscillators having a frequency higher than the satellite antenna output signal frequency bands, which frequency is selected to convert one of the satellite antenna signals to a selected component frequency band higher than the satellite antenna output signal frequency bands as a difference signal output of each of the mixers, the component frequency bands being selected to provide non-overlapping signals according to the frequency bands of each of the satellite antenna output signals. There is provided a plurality of filters, one coupled to receive the output of each of the mixers and each having a passband selected to correspond to one of the component frequency bands. A combiner is provided for combining one of the satellite antenna output signals with component frequency band signals output from the filters In a preferred arrangement the multiplexer is provided with three satellite antenna signals and has two of the mixers, local oscillators and filters. The satellite antenna output signals may comprise wideband signals having a frequency band of 950 to 2025 MHz. The multiplexer may be arranged for multiplexing four satellite antenna signals and have three of the mixers, local oscillators and filters.

The multiplexer may be arranged for frequency multiplexing at least four satellite antenna output signals onto a cable, wherein the signals including first and second wideband satellite antenna output signals and third and fourth narrowband satellite antenna output signals. In this arrangement three mixers are coupled to receive the second, third and fourth satellite antenna signals. A first local oscillator provides a signal to the mixer coupled to receive the second satellite antenna signal, the first local oscillator having an output signal having a frequency higher than the frequency band of the first satellite antenna output signal, the first local oscillator frequency being selected to provide a mixer output difference signal having a first component frequency band higher than the first satellite antenna output signal. A second local oscillator provides a signal to the mixer coupled to receive the third satellite antenna signal, the second local oscillator has an output signal having a frequency lower than the frequency band of the first satellite antenna output signal and selected to provide a mixer output difference signal having a second component frequency band lower than the first satellite antenna output signal. A third local oscillator provides a signal to the mixer coupled to receive the fourth satellite antenna signal, the third local oscillator has an output signal having a frequency higher than the frequency band of the first satellite antenna output signal, the third local oscillator frequency being selected to provide a mixer output sum signal having a third component frequency band higher than the first component frequency band. A plurality of filters is provided, one coupled to receive the output of each of the mixers, and each having a passband selected to correspond to a corresponding one of the component frequency bands. A combiner is provided for combining the first satellite antenna output signal with component frequency band signals output from the filters.

In a preferred arrangement the wideband satellite antenna output signals comprise wideband signals having a frequency band of 950 to 2025 MHz.

In accordance with the invention there is provided a demultiplexer for use with a satellite signal receiver, arranged to receive satellite signals in a satellite antenna output signal frequency band, for demultiplexing at least three satellite antenna signals provided with frequency multiplexing on a cable, including a first multiplexed satellite antenna signal in the satellite antenna output signal frequency band, and other component satellite antenna signals multiplexed with frequency inversion to higher, non-overlapping frequency bands. The demultiplexer includes a first plurality of filters, each for selecting one of the multiplexed satellite signals, a second plurality of mixers, the second plurality being one less than the first plurality, each mixer arranged to receive from corresponding ones of the filters one of the other component satellite antenna signals and a local oscillator signal. There is provided a second plurality of local oscillators, each associated with one of the mixers, each having a frequency higher than the satellite antenna output signal frequency band, and each having a frequency selected to convert one of the other component satellite antenna signals to the satellite antenna signal frequency band as a difference output signal of the associated mixer. There is also provided a switch for selecting a signal output from the output of a filter corresponding to the satellite antenna output signal frequency or the output signal from one of the mixers.

In a preferred arrangement the demultiplexer further includes a second plurality of filters each having a passband corresponding to the satellite antenna output signal frequency band and arranged between the mixers and the switch. The switch may be a multiswitch having a first plurality of inputs for receiving signal outputs from the filter and the mixers and a third plurality of outputs for connecting any of the inputs to any of the outputs.

In accordance with the invention there is provided a customer device for providing selectable satellite signals and off-air television signals multiplexed on a single input cable to a plurality of satellite receivers arranged to receive satellite signals in a satellite antenna output frequency band, wherein the satellite receivers provide a control signal on an input cable representing selection of a satellite signal to be received the customer device includes a first filter for separating off-air signals from the input cable; a second filter for selecting first satellite signals from the input cable, the first satellite signals being in the satellite antenna output frequency band; a third filter for selecting satellite signals in a component frequency band higher than the satellite antenna output frequency band; a mixer coupled to receive signals from the third filter and local oscillator signals and a local oscillator coupled to the mixer and providing a signal for converting the component frequency band satellite signals to the satellite antenna output frequency band. There is provided a multiswitch having at least two input terminals, one coupled to receive the first satellite signals from the first filter and a second coupled to receive output signals from the mixer, and a plurality of output terminals corresponding to the plurality of satellite receivers. The multiswitch is responsive to switch signals to selectively connect any one of the input terminals to any of the output terminals. There is provided a plurality of multiplexers for combining off-air television signals with output signals from the output terminals and providing combined signals to a plurality of device output terminals. There is provided a signal splitter coupled to receive signals from the first filter and supply the signals to the plurality of multiplexers; and a control unit connected to receive control signals from satellite receivers connected to the device output terminals and provide the switch signals to the multiswitch.

In a preferred arrangement the customer device is further provided with a filter having a passband corresponding to the satellite antenna output frequency band arranged between the mixer and the multiswitch. The customer device may include a plurality of the mixers and wherein the multiswitch may have additional input terminals connected to receive signals from the plurality of mixers, and wherein the control unit is arranged to respond to additional control signals to provide the switch signals. The control unit may be arranged to respond to an additional signal comprising a tone signal.

In accordance with the invention there is provided a customer device for providing selectable satellite signals and off-air television signals multiplexed on a single input cable to a satellite receiver arranged to receive satellite signals in a satellite antenna output frequency band, wherein there is provided a satellite selection signal representing selection of a satellite signal to be received. The customer device includes a first filter for separating off-air signals from the input cable, a second filter for selecting first satellite signals from the input cable, the first satellite signals being in the satellite antenna output frequency band and a third filter for selecting satellite signals in at least two component frequency bands higher than the satellite antenna output frequency band. A mixer is coupled to receive signals from the third filter and signals from a local oscillator providing first and second selectable local oscillator signals, each for converting one of the component frequency band satellite signals to the satellite antenna output frequency band, the local oscillator being selectable in response to a local oscillator control signal. There is provided a switch having at least two input terminals, one coupled to receive the first satellite signals from the first filter and a second coupled to receive output signals from the mixer, and an output terminal. The switch is responsive to switch signals to selectively connect one of the input terminals to the output terminal. A control unit is connected to receive satellite selection signals and provide the local oscillator control signals and the switch signals.

In accordance with the invention there is provided a customer device for providing selectable satellite signals and off-air television signals multiplexed on a single input cable to a plurality of satellite receivers arranged to receive satellite signals in a wideband satellite antenna output frequency band, wherein the satellite receivers provide a control signal on an input cable representing selection of a satellite signal to be received the device includes a first filter for separating off-air signals from the input cable, a second filter for selecting first satellite signals from the input cable, the first satellite signals being in the satellite antenna output frequency band and a third filter for selecting satellite signals in a component frequency band higher than the satellite antenna output frequency band. A mixer is coupled to receive signals from the third filter and signals from a local oscillator and provides a signal for converting the component frequency band satellite signals to the satellite antenna output frequency band. A multiswitch is provided having at least two input terminals, one coupled to receive the first satellite signals from the first filter and a second coupled to receive output signals from the mixer, and a plurality of output terminals corresponding to the plurality of satellite receivers. The multiswitch is responsive to switch signals to selectively connect any one of the input terminals to any of the output terminals. A plurality of multiplexers are provided for combining off-air television signals with output signals from the output terminals and providing combined signals to a plurality of device output terminals. A signal splitter is coupled to receive signals from the first filter and supply the signals to the plurality of multiplexers. A control unit is connected to receive control signals from satellite receivers connected to the device output terminals and provide the switch signals to the multiswitch.

In a preferred arrangement the customer device further includes a fourth filter for selecting satellite signals in a second component frequency band lower than the satellite antenna output frequency band, a second mixer coupled to receive signals from the fourth filter and a local oscillator coupled to the second mixer and providing a signal for converting the second component frequency band to the satellite antenna output frequency band, and wherein the multiswitch has at least three inputs, including an input coupled to the second mixer. The device may further include a fifth filter for selecting satellite signals in a third component frequency band higher than the satellite antenna output frequency band, a third mixer coupled to receive signals from the fifth filter and a local oscillator coupled to the third mixer and providing a signal for converting the third component frequency band to the satellite antenna output frequency band, and wherein the multiswitch has at least four inputs, including an input coupled to the third mixer.

In accordance with the invention there is provided an improvement in a satellite antenna signal distribution system for a multiple dwelling unit, wherein signals from a plurality of satellite antennas are provided for distribution on a plurality of distribution cables, the signals being provided in overlapping satellite antenna output frequency bands, and wherein there is provided a single cable for providing television signals to each dwelling within the multiple dwelling unit. According to the improvement, the distribution cables and the dwelling unit cables are connected to a multiswitch arranged to connect any of the distribution cables to any of the dwelling unit cables in accordance with signals provided on the dwelling unit cables.

In accordance with the invention there is provided a customer device for providing selectable satellite signals and off-air television signals multiplexed on a single input cable to a satellite receiver arranged to receive satellite signals in a wideband satellite antenna output frequency band, wherein the satellite receivers provide a control signal on an input cable representing selection of a satellite signal to be received. The device includes a first filter for separating off-air signals from the input cable, a second filter for selecting first satellite signals from the input cable, the first satellite signals being in the satellite antenna output frequency band and a third filter for selecting satellite signals in a first component frequency band lower than the satellite antenna output frequency band and having a bandwidth less than the bandwidth of the wideband satellite antenna output frequency band. A first mixer is coupled to receive signals from the third filter and signals from a local oscillator providing a signal for converting the first component frequency band satellite signals to a band comprising a first portion of the satellite antenna output frequency band. A fourth filter is provided for selecting satellite signals in a second component frequency band higher than the satellite antenna output frequency band and having a bandwidth less than the bandwidth of the wideband satellite antenna output frequency band. A second mixer is coupled to receive signals from the fourth filter and signals from a local oscillator providing a signal for converting the second component frequency band satellite signals to a band comprising a second portion of the satellite antenna output frequency band. A combiner is provided for combining frequency converted outputs of the first and second mixers. A switch, responsive to switch signals, has at least two input terminals, one coupled to receive the first satellite signals from the first filter and a second coupled to receive output signals from the combiner, and an output terminal. A control unit is connected to receive control signals from a satellite receiver connected to the output terminals and provide the switch signals to the switch.

In accordance with the invention there is provided a system for providing independently selectable satellite television signals to a user having a plurality of satellite television receivers from shared satellite signal receiving antennas. The system includes a multiswitch having a first number of inport ports corresponding to a first number of available satellite signals derived from a plurality of satellite antennas and having a second number of output terminals corresponding to the satellite receiver capacity of the system. The multiswitch is responsive to supplied control signals to selectively connect any of the input ports to any of the output terminals. A frequency converting multiplexer is provided for receiving first and second satellite signals from first and second output terminals of the multiswitch and for supplying a user output signal having the first and second satellite signals on first and second non-overlapping frequency bands. A cable is connected to the multiplexer for transferring the user output signal to a user location. A frequency converting demultiplexer at the user location provides the first and second satellite signals to first and second satellite receivers in the same satellite frequency band. A control signal apparatus is associated with the frequency converting demultiplexer for receiving selection signals from the receivers and for signalling the selection signals over the cable to a control unit associated with the multiswitch. The control unit provides control signals to the multiswitch in accordance with selection signals provided by the receivers.

The selection signals are preferrably converted to digital code signals and sent over the cable to the control unit.

In accordance with the invention there is provided a method for providing independently selectable satellite television signals to a user having a plurality of satellite television receivers from shared satellite signal receiving antennas. Satellite signals derived from a plurality of satellite antennas are secectively connected by a multiswitch to a plurality of output terminals corresponding to the satellite receiver capacity of the system, in response to supplied control signals. First and second satellite signals from first and second output terminals of the multiswitch are supplied to a user over a single cable having the first and second satellite signals on first and second non-overlapping frequency bands. The satellite signals are demultiplexed at the user location for providing the first and second satellite signals to first and second satellite receivers in the same satellite frequency band. Apparatus associated with the frequency converting demultiplexer receives selection signals from the receivers and signalls the selection signals over the cable to a control unit associated with the multiswitch. Control signals are provided to the multiswitch in accordance with selection signals provided by the receivers.

For a better understanding of the present invention, together with other and further embodiments, reference is made to the following description, taken in conjunction with the accompanying drawings, and its scope will be pointed out in the appended claims.

DESCRIPTION OF THE INVENTION

Figure 1:
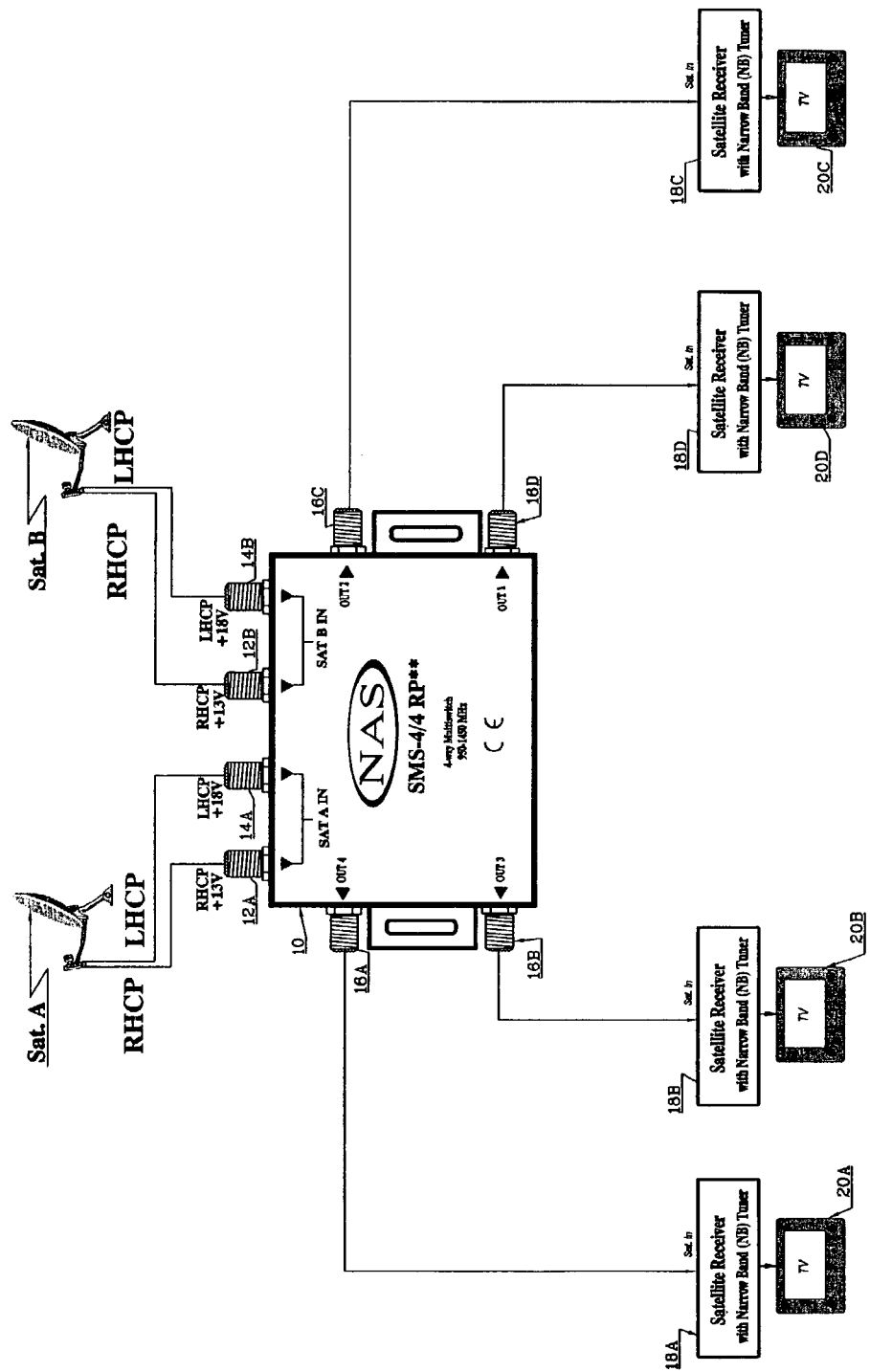
FIG. 1 is an illustration of a prior art satellite television switching system for a single family dwelling.
Figure 2:
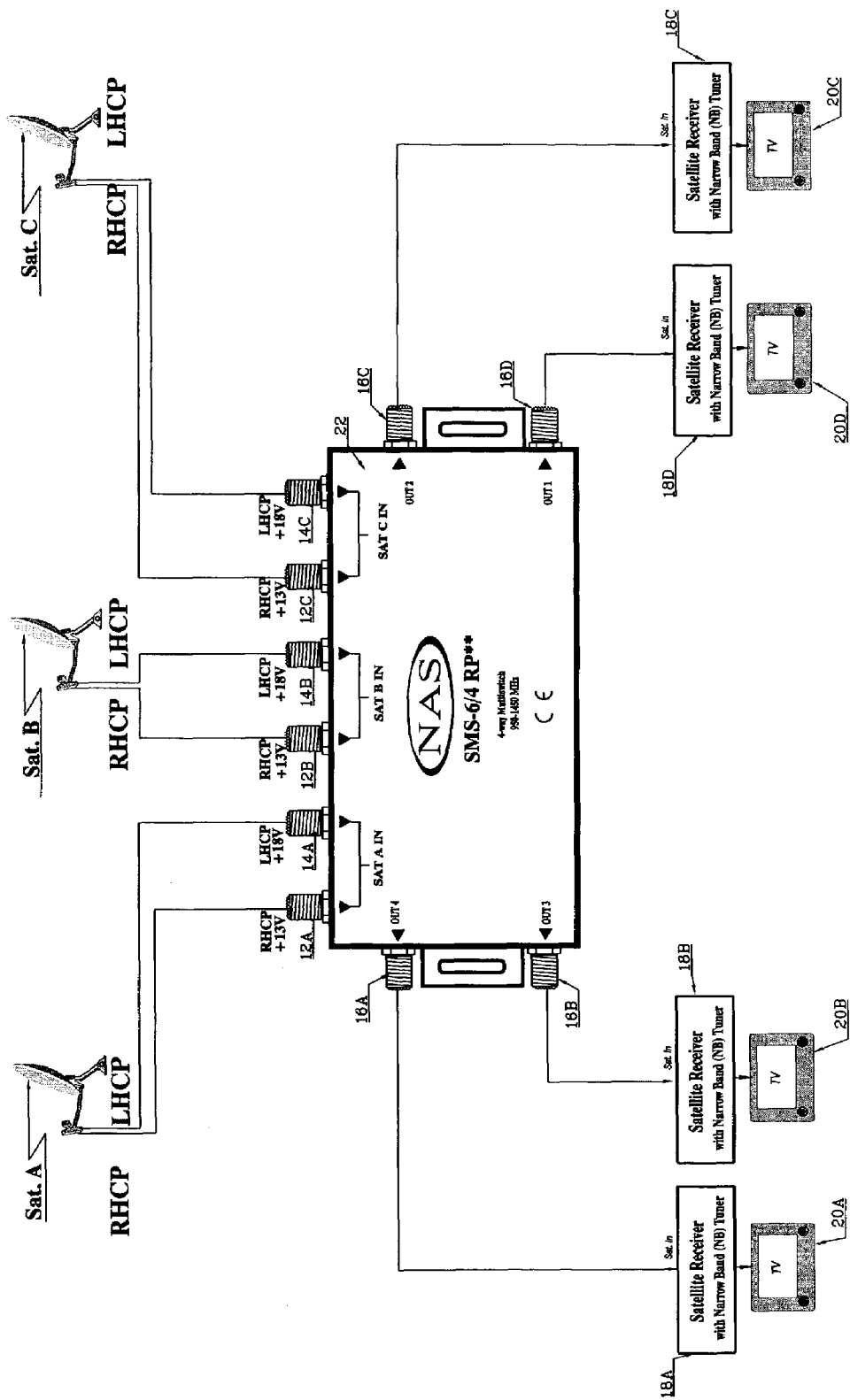
FIG. 2 is an illustration of another prior art satellite television switching system for a single family dwelling.
Figure 3:
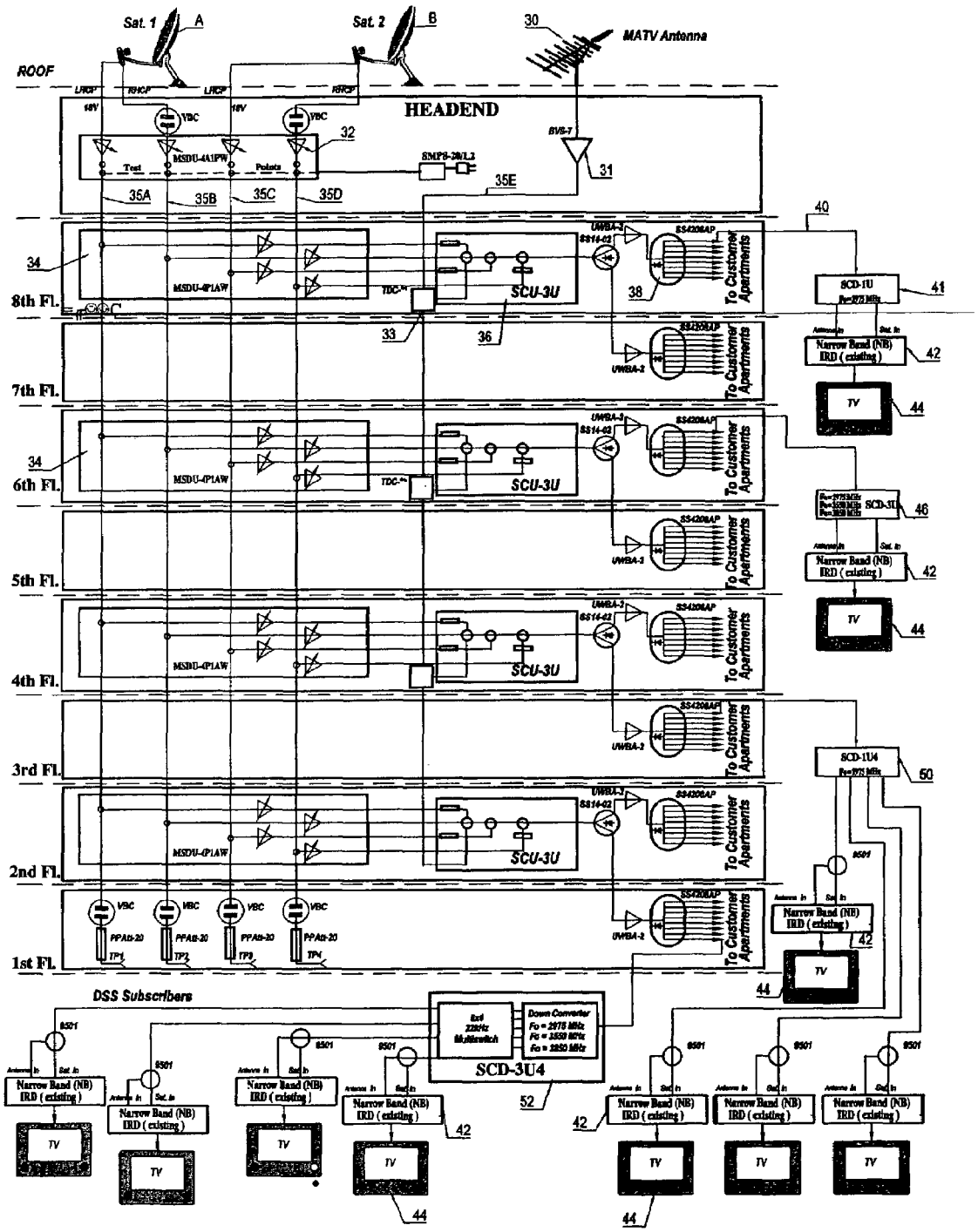
FIG. 3 is an illustration of a first embodiment of a satellite signal delivery system in accordance with the present invention.

FIG. 3 is a first satellite antenna signal delivery system according to the invention which is shown installed in a multiple dwelling unit, for example, having eight floors with, for example, eight apartments on each floor. In the system shown in FIG. 1, two satellite receiving antennas, labeled A and B, and an off-air antenna 30 are located on the building roof. The left-hand and right-hand circularly polarized output signals from each satellite receiver are provided to an amplifier 32 to amplify the signals, and the signals are thereafter distributed to the floors of the building using vertical cable drops 35A to 35D, each satellite signal being provided to a separate vertical cable drop.

The signal from off-air antenna 30 is likewise amplified in amplifier 31 and provided to a fifth cable drop 35E, wherein it is connected to couplers 33 for further distribution within the building.

The four satellite antenna signal cables are provided to coupler/amplifier units 34 which derive a portion of each satellite antenna signal and provide amplification of that signal which is thereafter provided to a multiplexer 36. Multiplexer 36 is arranged to take the four satellite signals and off-air signals and combine them in a frequency multiplexed manner for distribution to satellite receivers and other receivers on each floor of the apartment building. The output of multiplexer 36 is provided to signal dividers 38 and thereafter through individual cables 40 to units 41 within each apartment.

Figure 14:
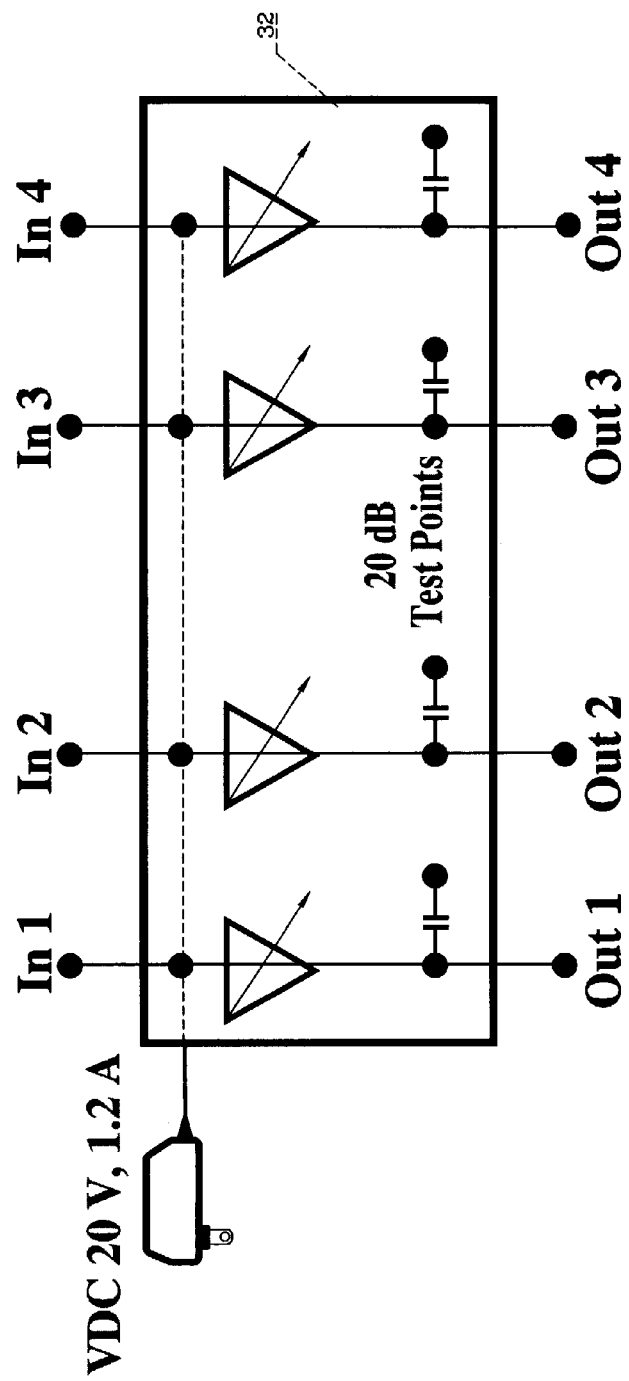
FIG. 14 illustrates a multi signal amplifier useful in connection with the systems of the present invention.
Figure 17:
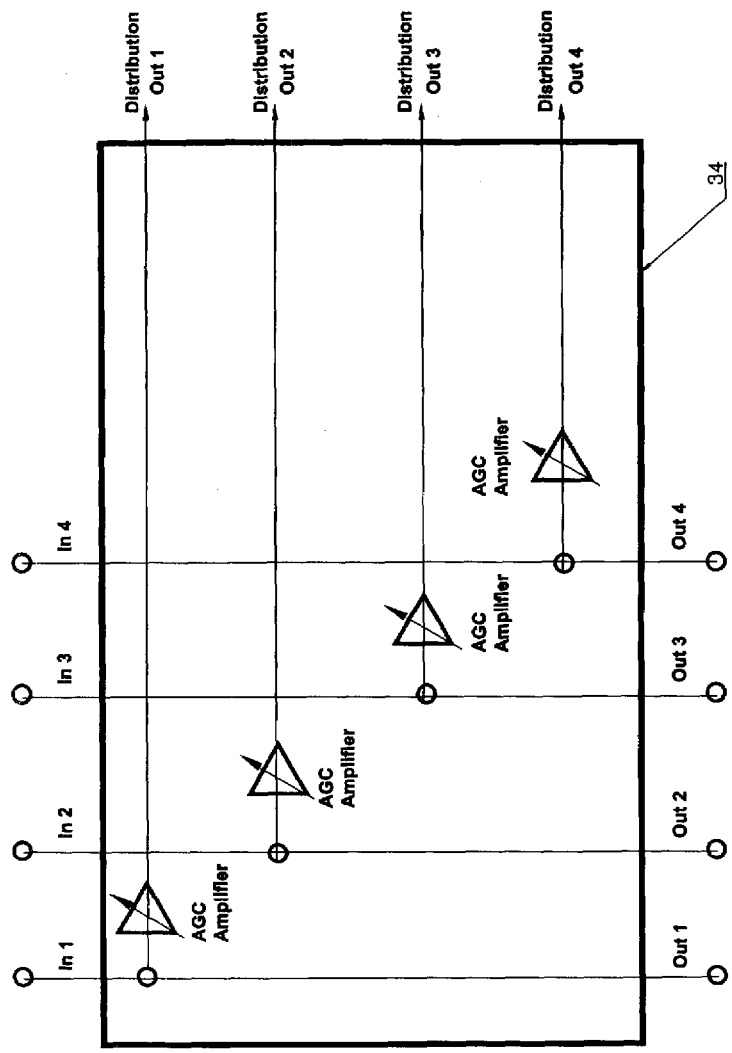
FIG. 17 illustrates another multiple coupler and amplifier unit useful in connection with the systems of the present invention.
Figure 34:
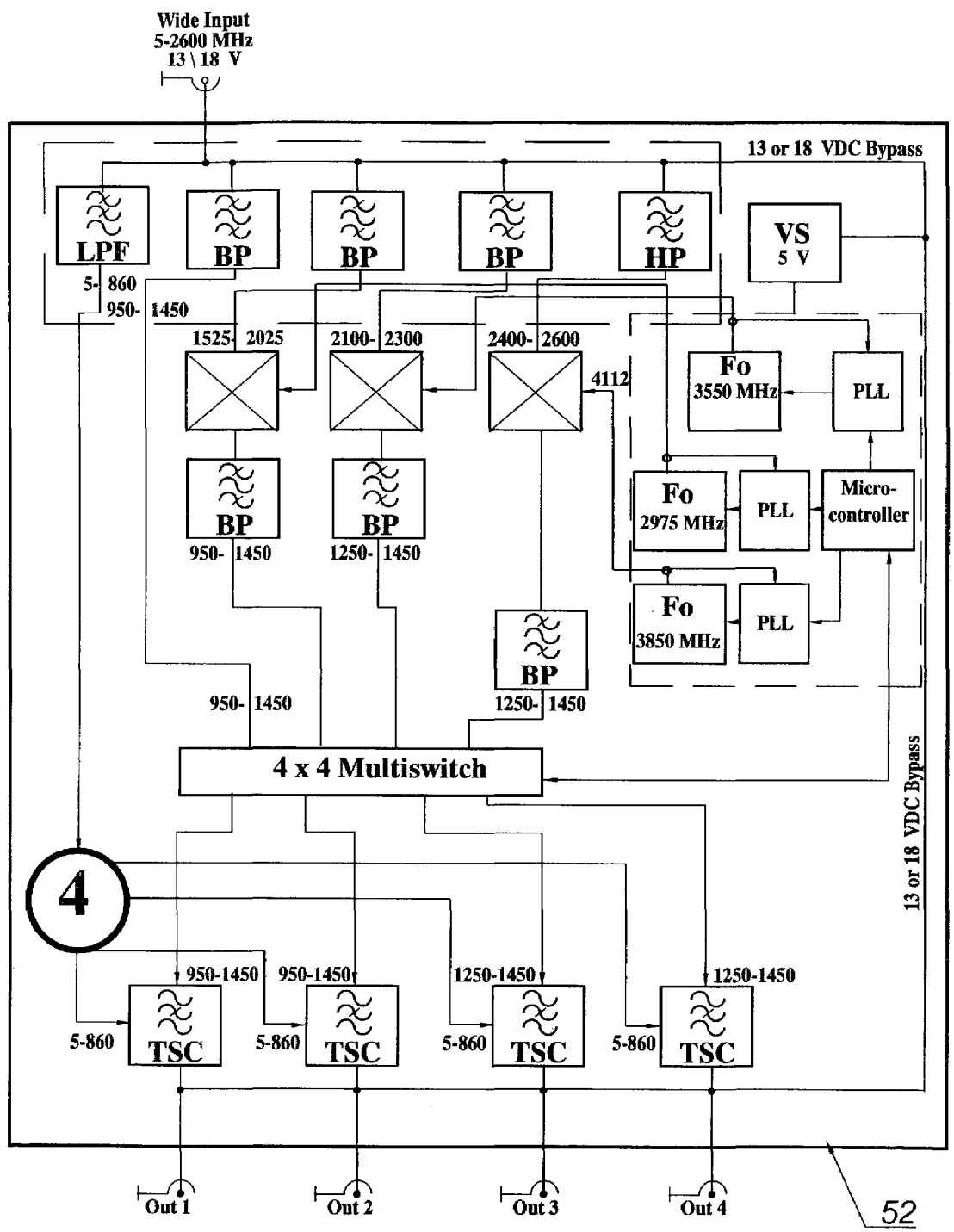
FIG. 34 illustrates another frequency converter demultiplexer useful in connection with the systems of the present invention.

A variety of units may be provided within each apartment. Units 41 provide for the multiplexing of the signal on cable 40 to provide a narrow-band satellite signal to be provided to a satellite receiver 42 as well as an antenna signal supplied to a separate port of satellite receiver 42. Satellite receiver 42 is connected to television set 44. Alternately, a wide-band satellite customer device 46, as will be further described, may be provided which separates and demultiplexes the four satellite signals to provide multiple selection of satellite signals to a satellite receiver 42 coupled to a television set 44. According to the service ordered and paid for by the customer the customer may receive signals from a single satellite using unit 41 or from multiple satellites using satellite customer device 46. An additional satellite customer device 52, see FIG. 34, is illustrated as including a multi-switch 37 to provide output signals from the antenna signal or one of the four satellite signals to satellite receivers 42 connected to multiple television sets 44, for example, which may be within a single apartment of the building. A schematic diagram for the satellite signal amplifying unit 32 is illustrated in FIG. 14. A schematic diagram for the coupling unit 34 is illustrated in FIG. 17.

Figure 35:
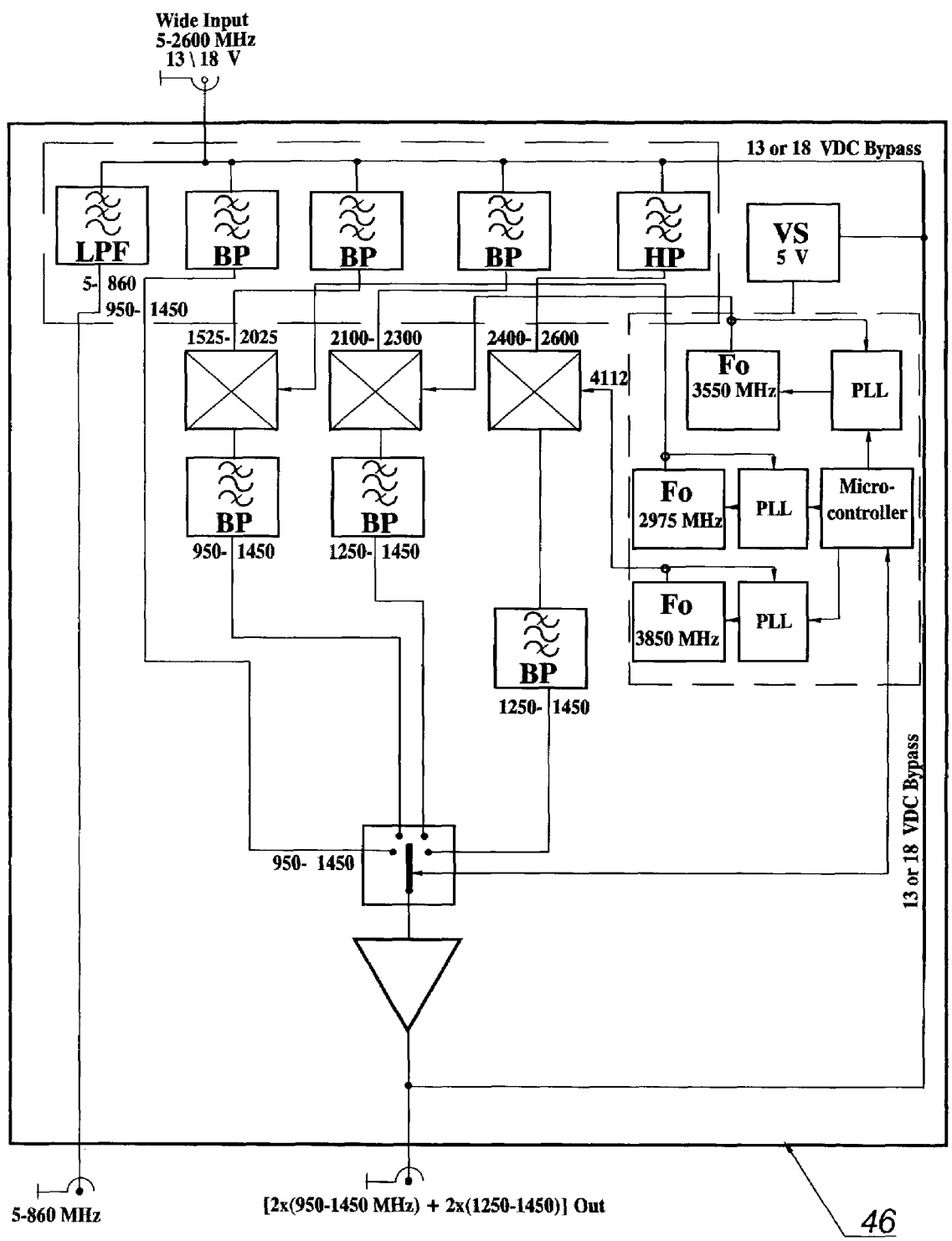
FIG. 35 illustrates another frequency converter demultiplexer useful in connection with the systems of the present invention.
Figure 36:
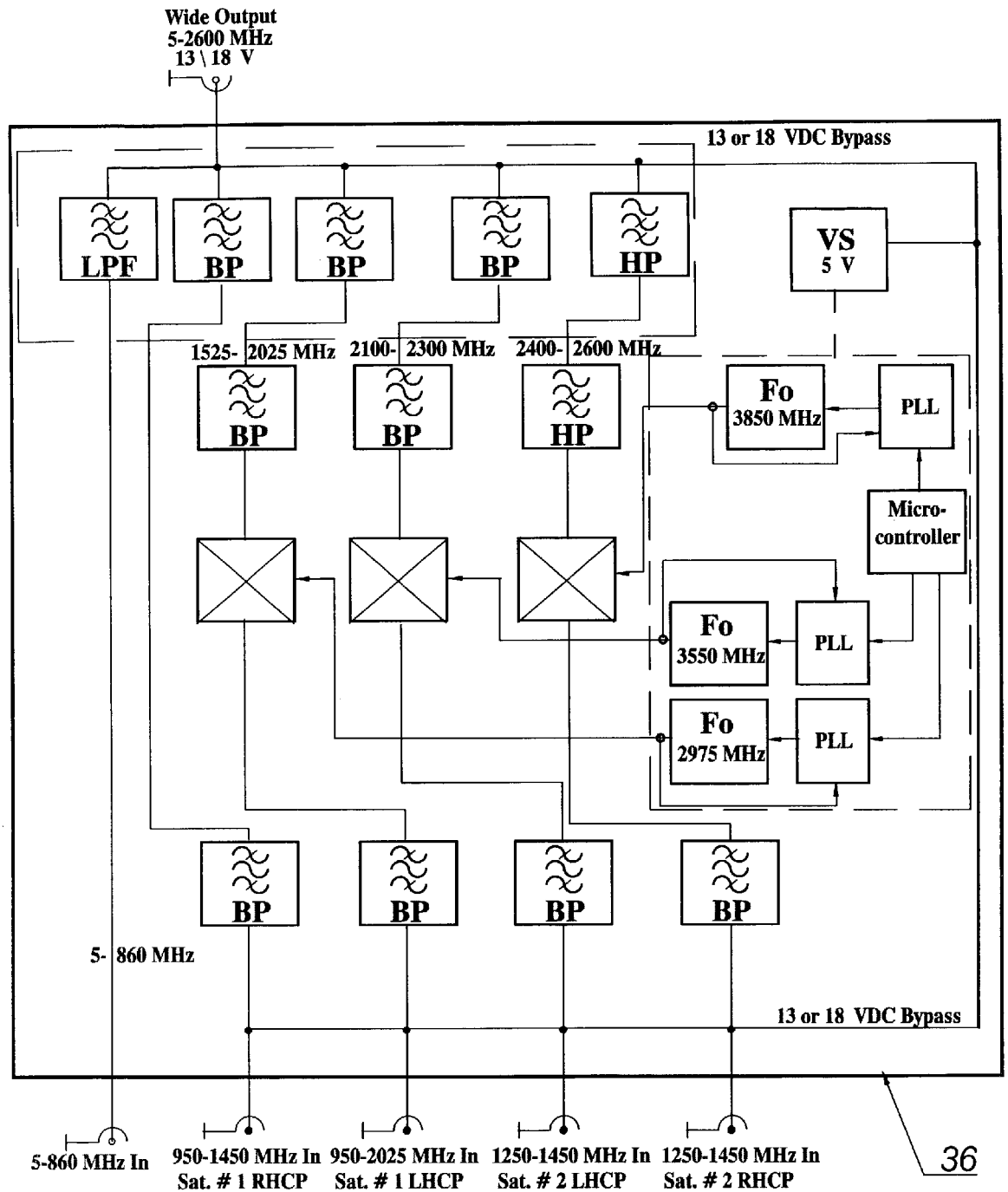
FIG. 36 illustrates another frequency converter multiplexer useful in connection with the systems of the present invention.
Figure 37:
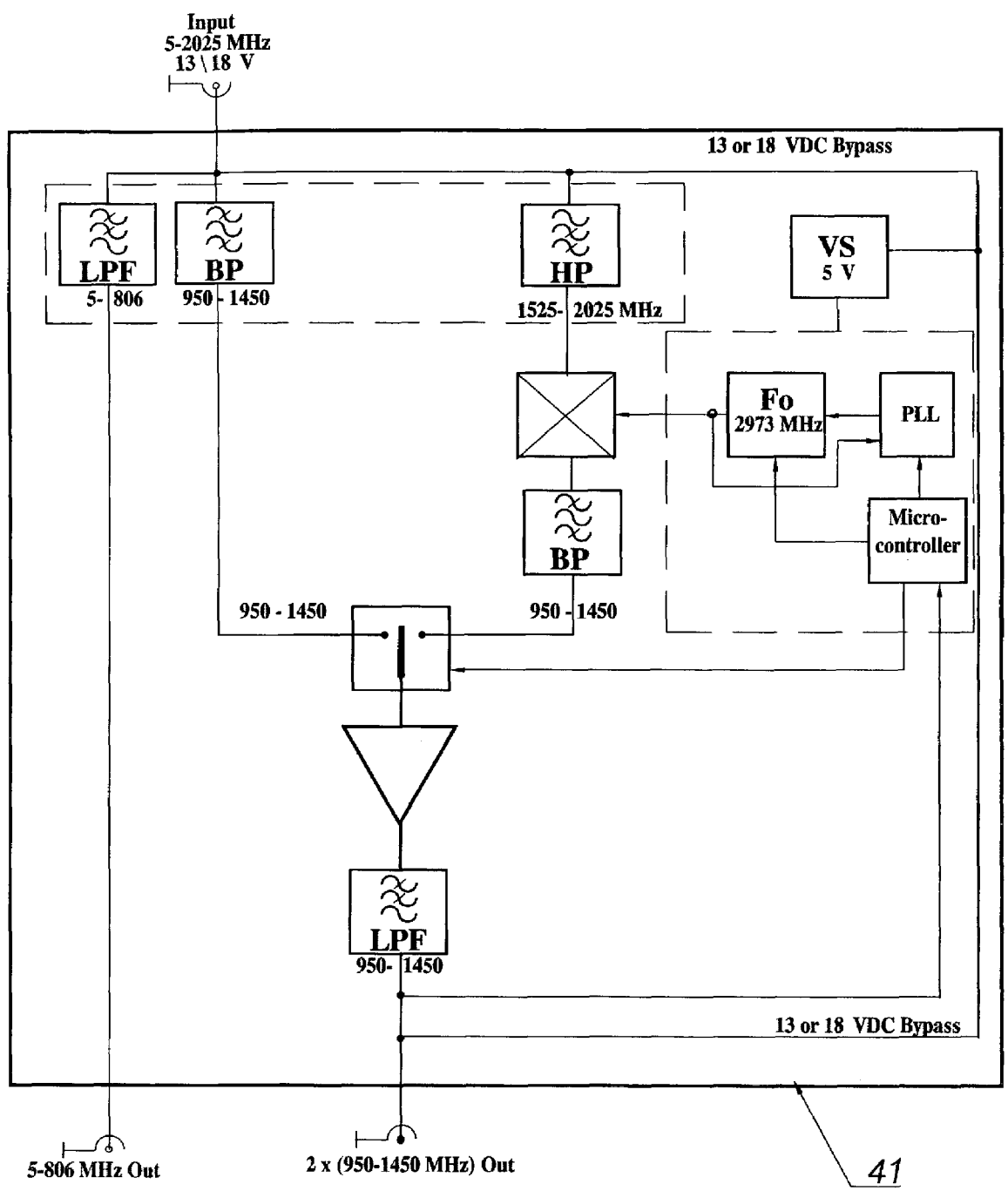
FIG. 37 illustrates another frequency converter demultiplexer useful in connection with the systems of the present invention.

One example of a satellite conversion unit 36 for receiving an off-air antenna signal, using a coupler 33 and for receiving four satellite signals from a coupler/amplifier unit 34 is illustrated in FIG. 36. This unit converts signals from the off-air signal and from four satellite bands provided by two, or three satellites into a wide-band output having a frequency range of 5 to 2600 MHz. This signal is provided by signal splitter 38 to cables 40 provided to individual apartments. An example of a corresponding satellite customer device 46 for receiving multiple bands from a satellite is shown in FIG. 35. This device receives signals in the four satellite bands provided at the output of satellite conversion unit 36 and convert the satellite signals to a single band of 950 to 1450 MHz which is output to a satellite receiver. Another example of a satellite customer device 41 for use with a narrow-band satellite receiver 42 is shown in FIG. 37.

A multiple output satellite customer device 52 is illustrated in FIG. 34. The device of FIG. 34 likewise converts the four bands of satellite signals into a output bands of 950 to 1450 MHz or 1250-1450 MHz. and also provides a multiswitch 37 whereby the output of any of the satellite signals can be transferred to an individual satellite receiver 42 connected to a television set 44. Multiswitch 37 is arranged to connect any of the inputs to any of the outputs in response to supplied control signals. At the output terminals there are provided multiplexers TSC for combining the off-air signals with each of the satellite output signals.

The off-air signals are separated from the input combined signals using a low pass filter.

Figure 4:
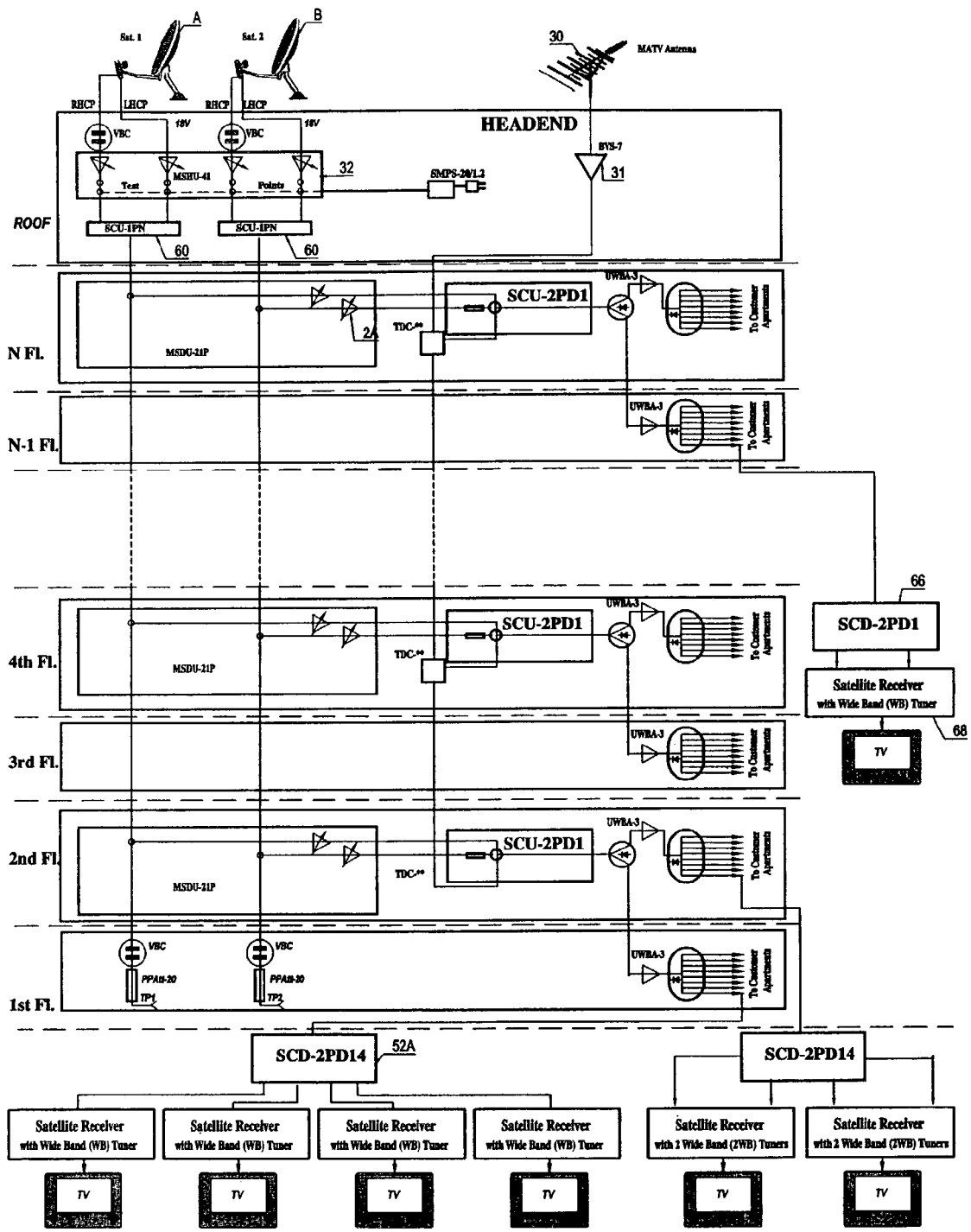
FIG. 4 is an illustration of a second embodiment of a satellite signal delivery system in accordance with the present invention.
Figure 10:
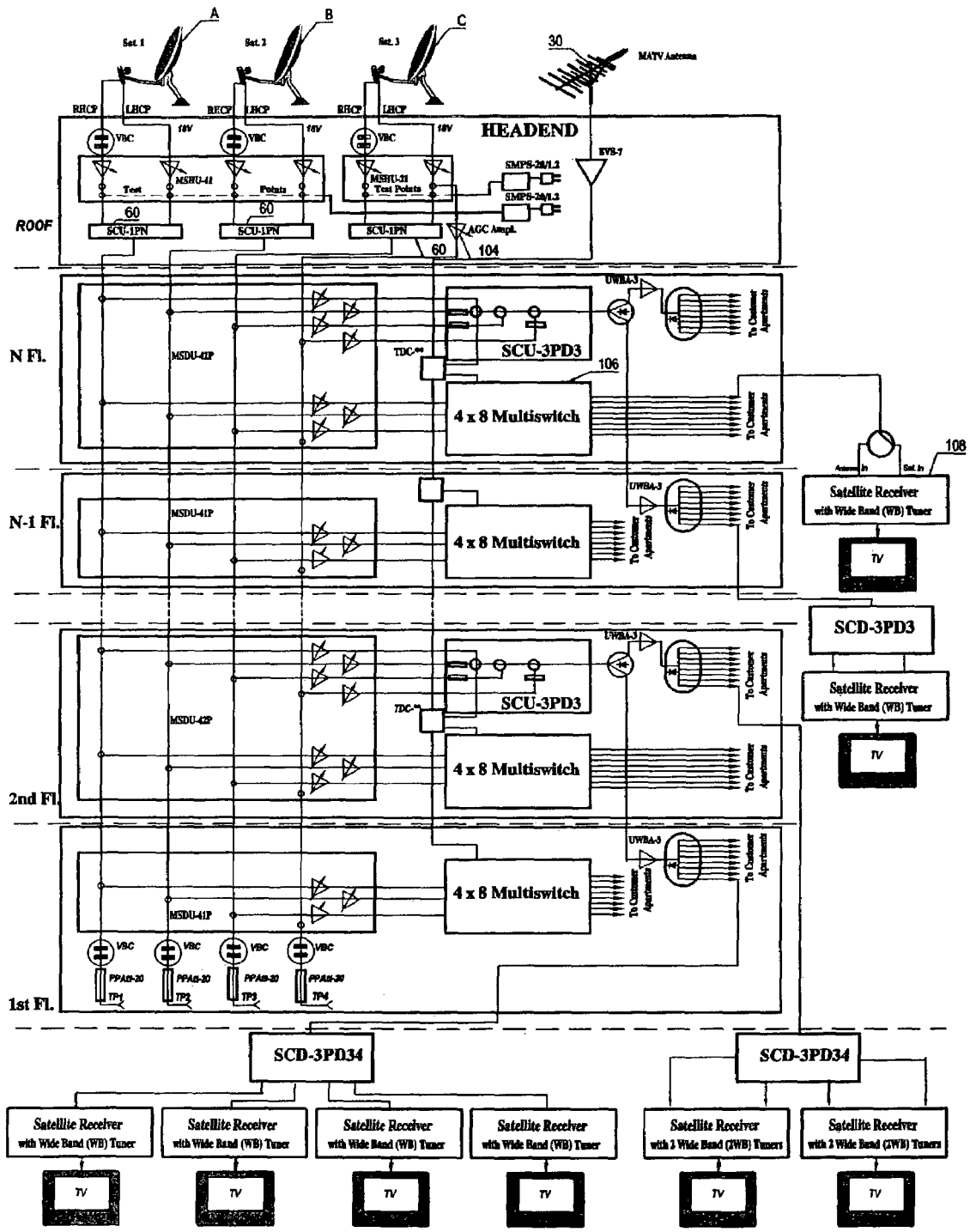
FIG. 10 is an illustration of a eighth embodiment of a satellite signal delivery system in accordance with the present invention.

FIG. 4 shows another example of a satellite signal delivery system wherein the satellite signals from two satellite receiving antennas A and B are converted to different frequency bands before being provided to the cable drop system. Accordingly, there are provided frequency converters 60 for receiving the left-hand and right-hand circular polarization signals from each of the satellite receiving antennas A and B. The frequency converters 60 provide one of the satellite signals to a higher frequency band so that two signals can be provided through one antenna cable drop to the equipment on each floor of the building. An example of a suitable frequency converting arrangement for providing a combined band of 950 to 2025 MHz satellite signal from right-hand and left-hand circularly polarized satellite signals is shown in FIG. 10 of the referenced International Application. It should be understood, that the local signal from the off-air antenna received on terminal 104 need not be combined in this unit, but can be supplied on a separate cable drop as shown in FIG. 4.

Figure 15:
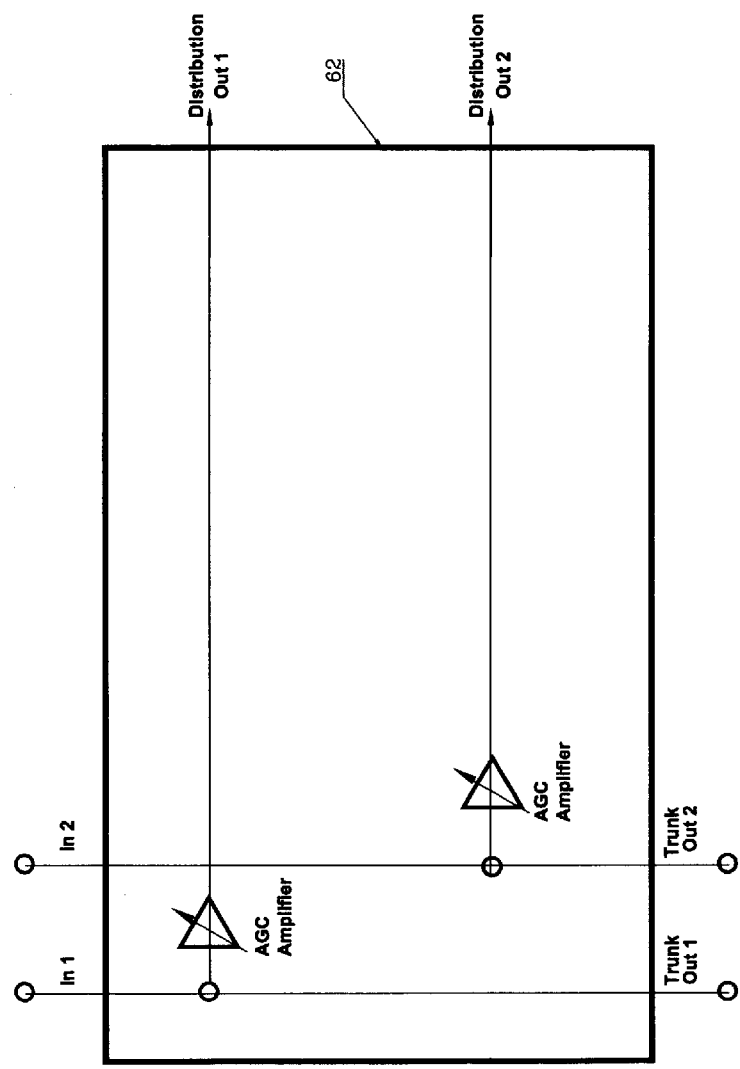
FIG. 15 illustrates a multiple coupler and amplifier unit useful in connection with the systems of the present invention.
Figure 19:
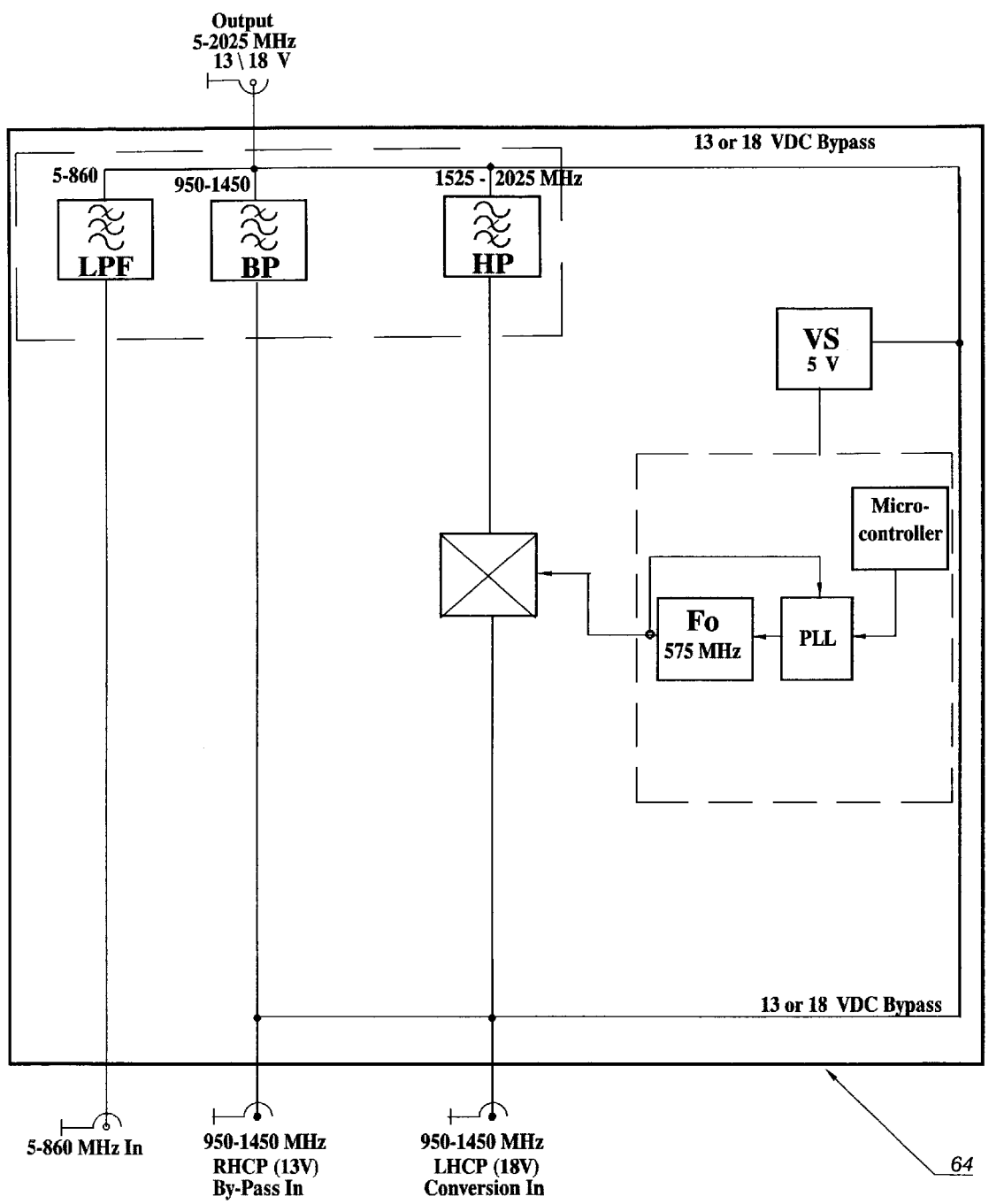
FIG. 19 illustrates a frequency converter multiplexer useful in connection with the systems of the present invention.
Figure 20:
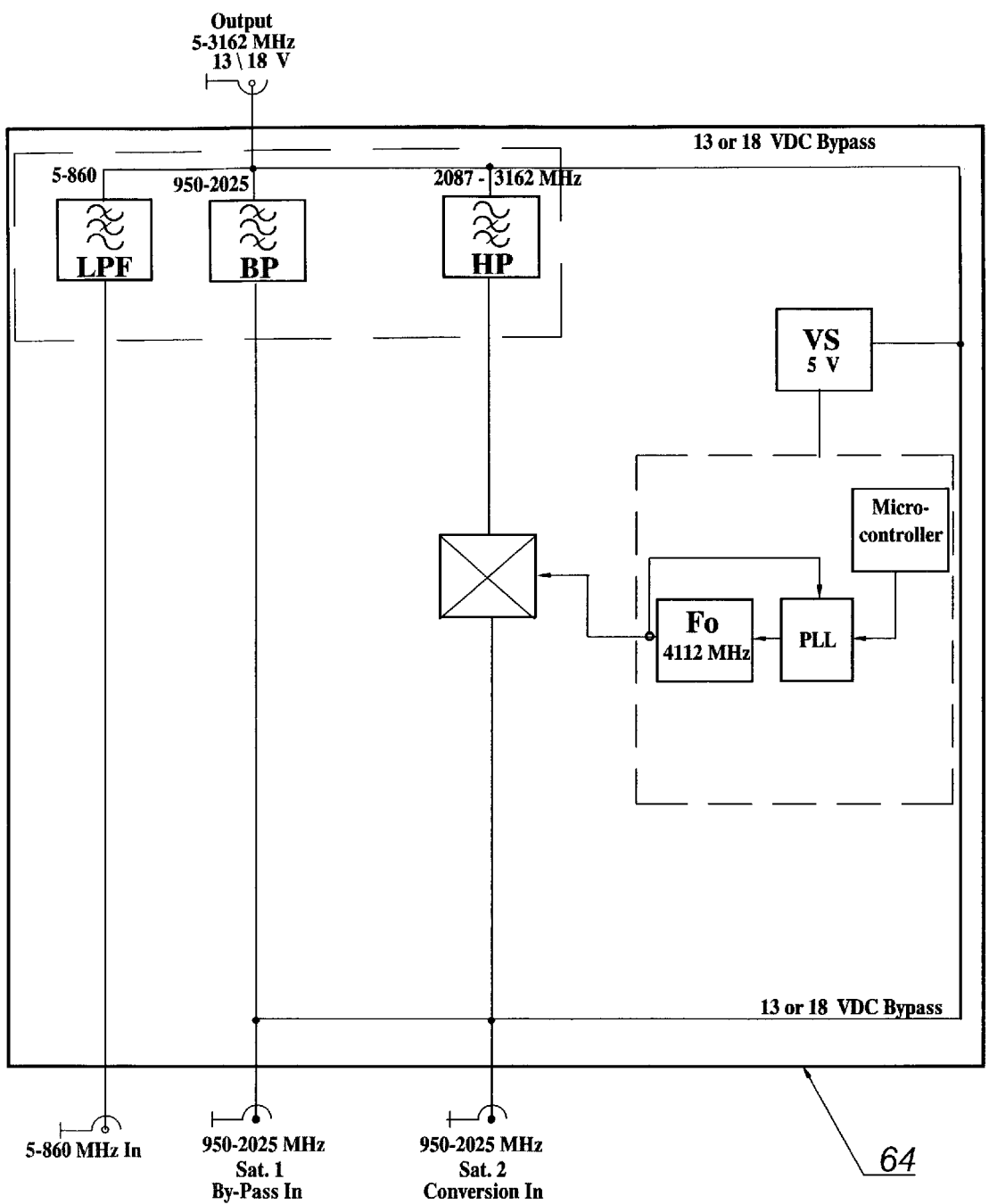
FIG. 20 illustrates another frequency converter multiplexer useful in connection with the systems of the present invention.
Figure 26:
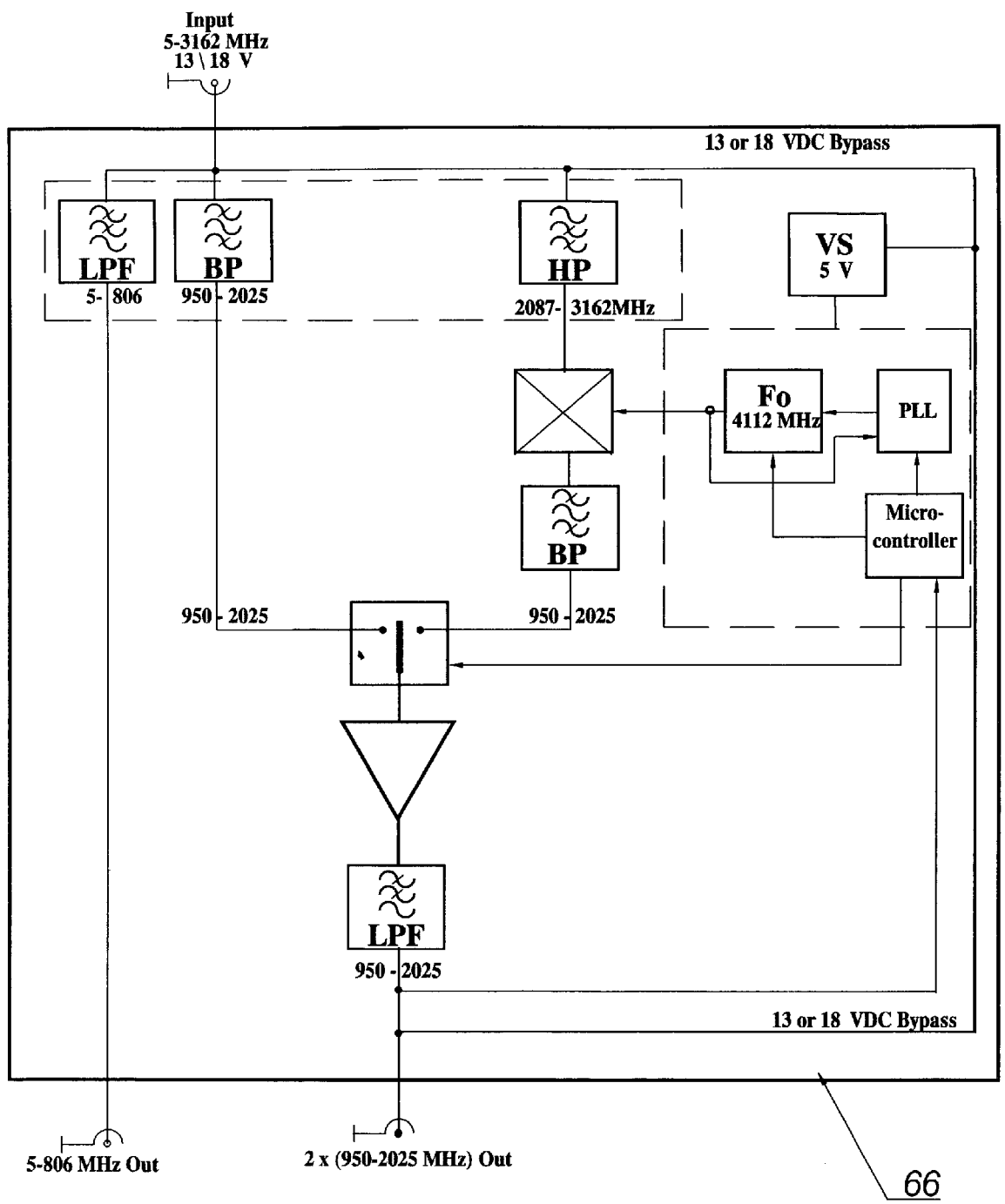
FIG. 26 illustrates another frequency converter demultiplexer useful in connection with the systems of the present invention.
Figure 32:
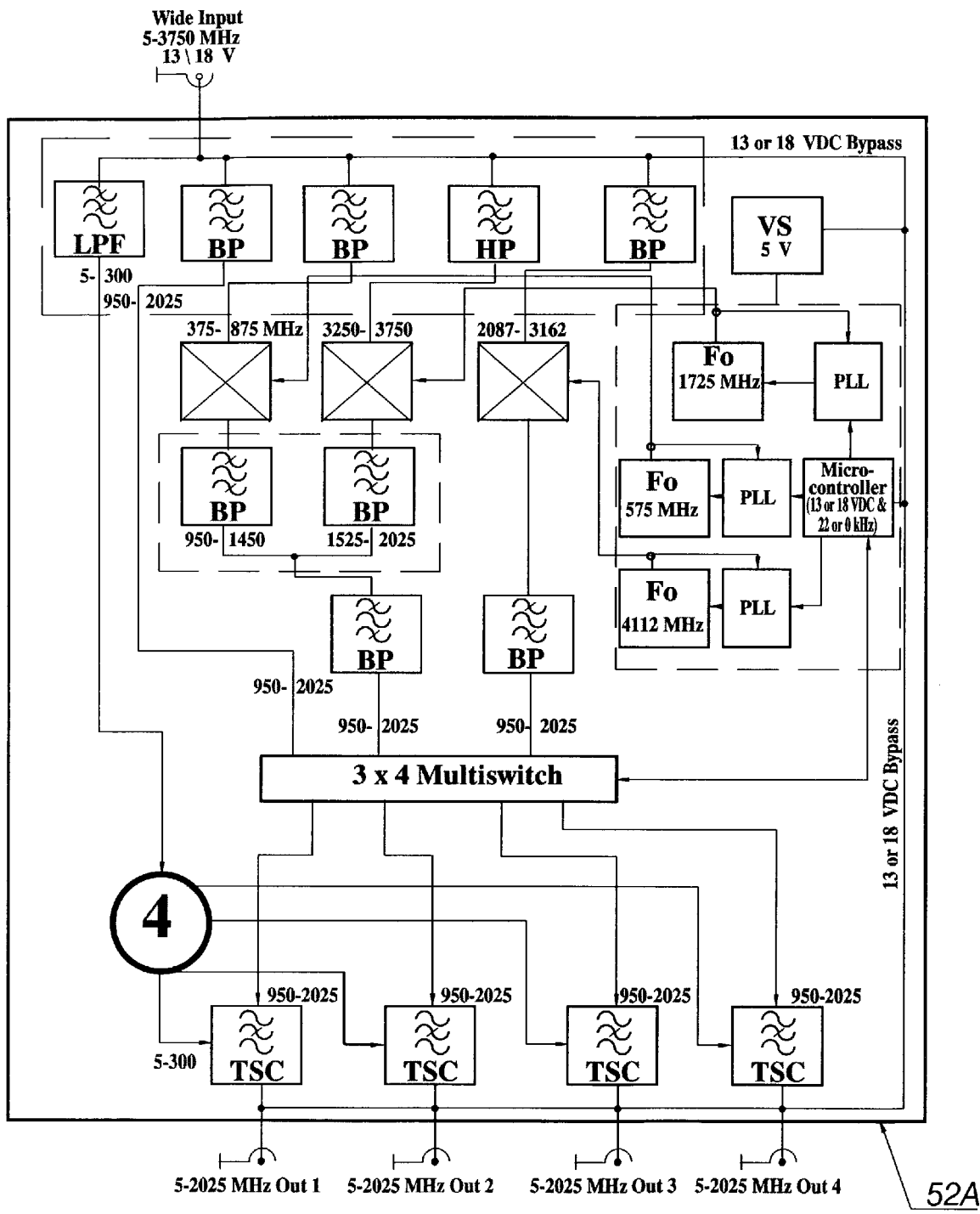
FIG. 32 illustrates another frequency converter demultiplexer useful in connection with the systems of the present invention.

As shown in FIG. 4, the combined right and left-hand satellite signals from each antenna A, B are provided by coupling unit 62, shown in FIG. 15, which is provided with amplifiers 2A, to satellite converter unit 64, shown in FIG. 19, wherein the two signals are placed on adjacent frequency bands on a single output cable which is provided through a divider to satellite customer devices 66 and satellite receiver 68 at the customer's apartment. A suitable satellite up-converter device 64 for use in the arrangement of FIG. 4 is illustrated in FIG. 20. A suitable satellite customer device 66 is shown in FIG. 26. Customer device 66 uses an RF switch 66A to alternatevely connect the selected satellite signal to the satellite output terminal. This device is to be used with a multiband wide-band satellite tuner which receives the frequencies 950 to 2025 MHz. Where multiple satellite receivers are provided in an apartment, wideband customer device 52A, shown in FIG. 32 may be used. While the device 52A is arranged for receiving signals corresponding to three wide band satellite signals, its application to two satellite systems will be evident to those skilled in the art.

Figure 5:
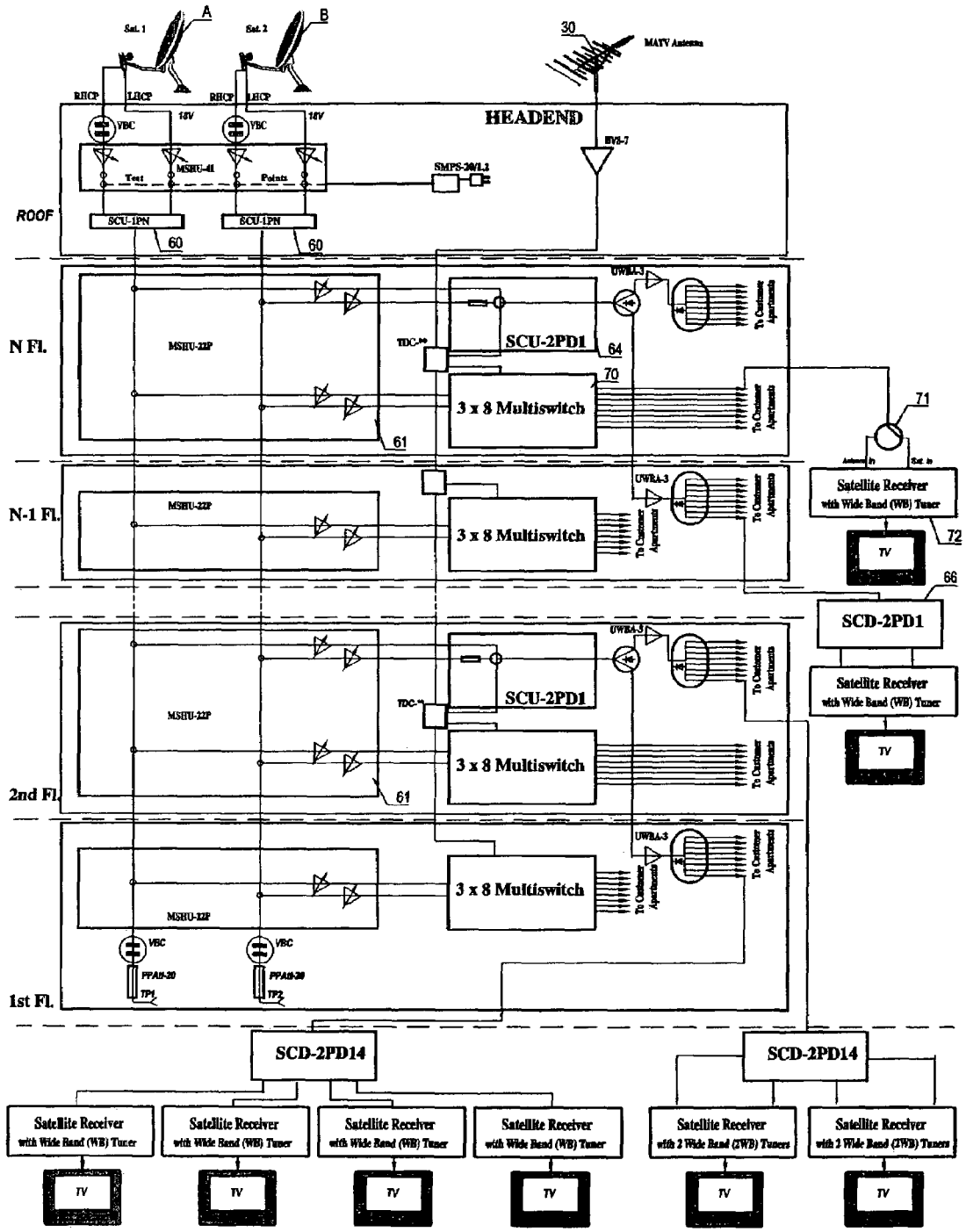
FIG. 5 is an illustration of a third embodiment of a satellite signal delivery system in accordance with the present invention.
Figure 16:
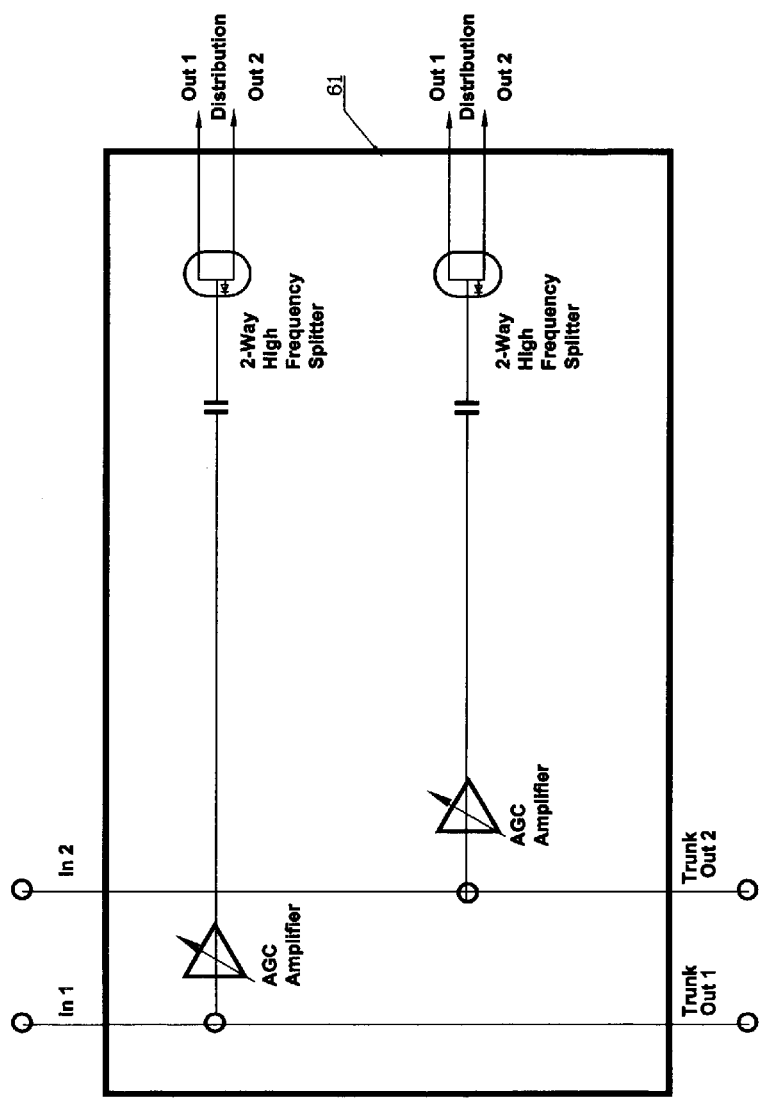
FIG. 16 illustrates another multiple coupler and amplifier unit useful in connection with the systems of the present invention.

FIG. 5 shows a further alternate arrangement for a satellite signal delivery system for a multiple dwelling unit. In the system of FIG. 5 the signals from first and second satellite antennas A and B are delivered by two cable drops connected to frequency converters 60. Dual taps 61, shown in FIG. 16, provide signals to satellite conversion device 64, and additionally, or as an alternative, to a 3×8 multiswitch system 70. The 3×8 multiswitch is arranged to connect any of eight outputs to either of the two satellite signal drop cables or to the off-air drop cable connected to antenna 30. Accordingly, using a signal provided over a satellite cable from an apartment, a user can operate the multiswitch 70 to connect to alternately the combined signal from satellite A, the combined signal from satellite B or the off-air signal from antenna 30.

A diplexer or switch 71 is provided at the customer's receiver for providing the signals to either the satellite or off-air inputs of satellite receiver 72, which is configured for wide-band satellite reception. Using the 3×8 multiswitch 70 is unnecessary to do a frequency conversion prior to distribution of signals to the individual subscriber's apartment. This arrangement may be more suitable where the only one receiver is required in the customer premises. In this case, the cable from the customer apartment, having only one receiver 72, will be connected to the multiswitch 70 output, while the cable from the customer apartment, having two or more receivers will be connected to the frequency converter 72 via power divider 38.

Figure 6:
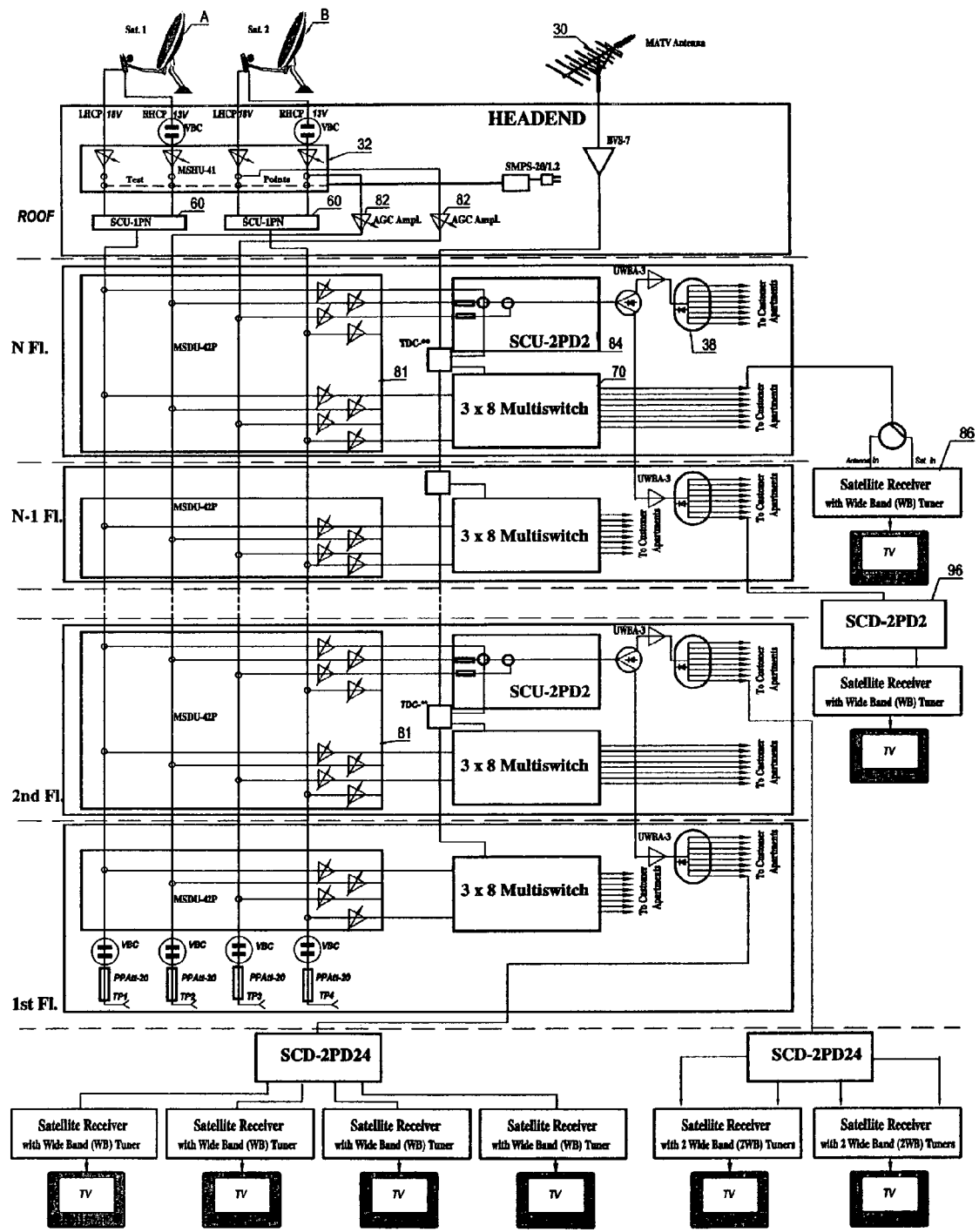
FIG. 6 is an illustration of a fourth embodiment of a satellite signal delivery system in accordance with the present invention.
Figure 18:
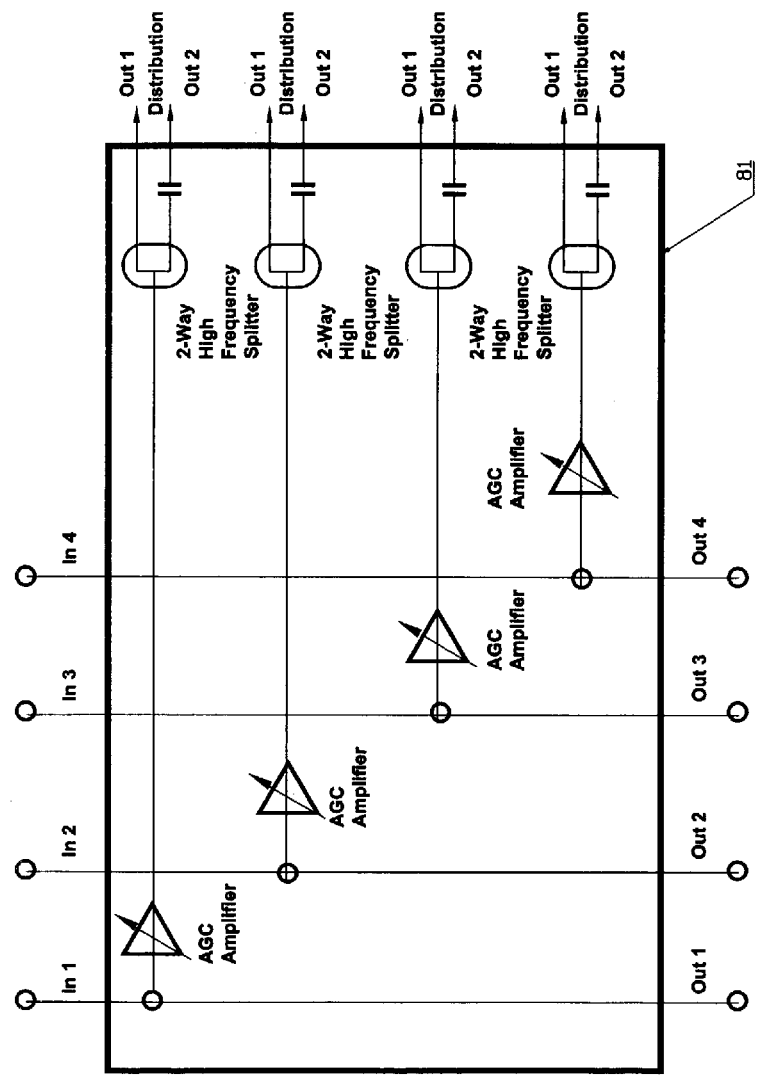
FIG. 18 illustrates another multiple coupler and amplifier unit useful in connection with the systems of the present invention.
Figure 21:
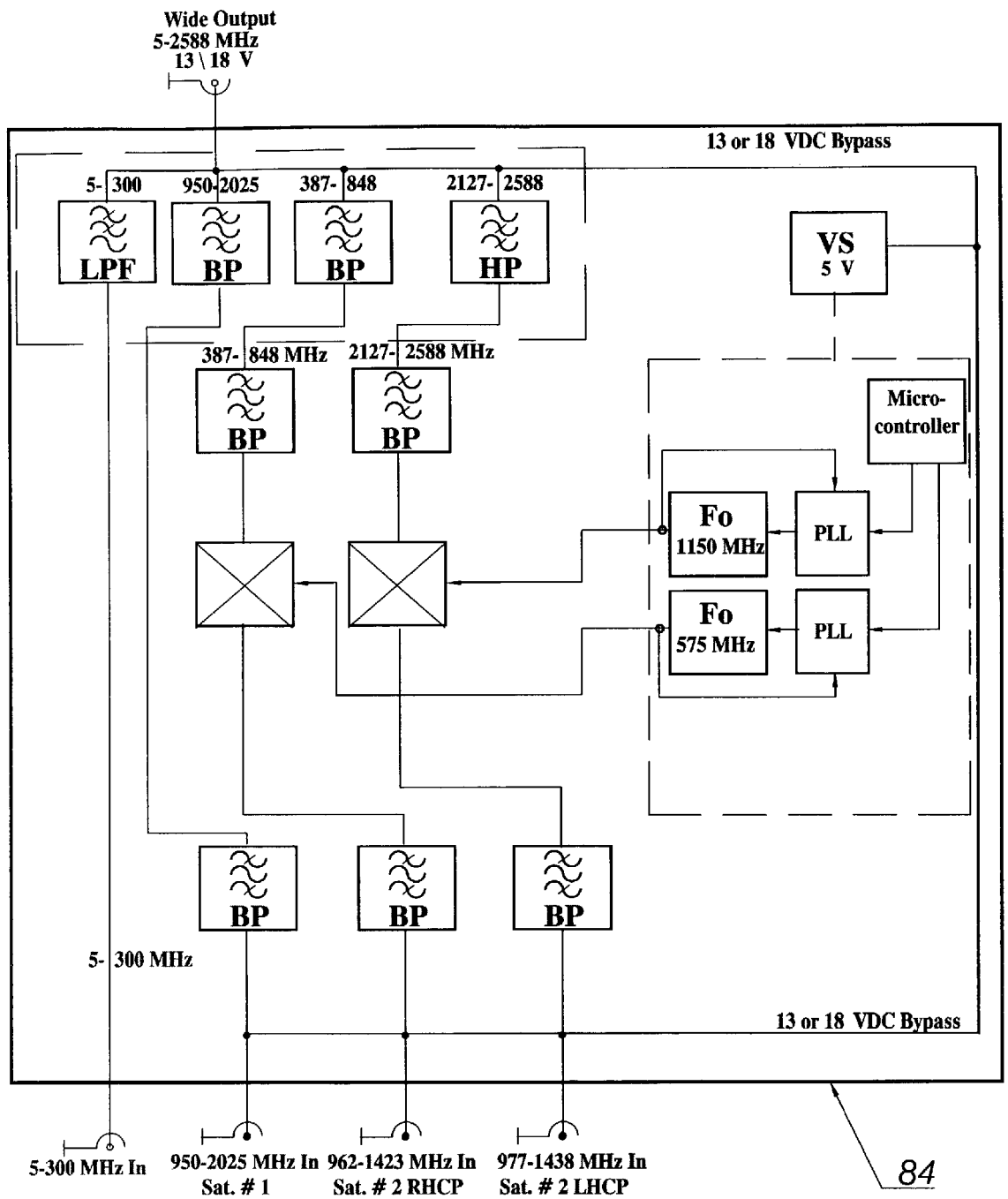
FIG. 21 illustrates another frequency converter multiplexer useful in connection with the systems of the present invention.

FIG. 6 shows another alternate embodiment wherein a variety of services may be provided to subscribers within the same building. In the system of FIG. 6 there are provided two cable drops carrying combined satellite signals which are output from satellite converter units 60 and there are provided two additional cable drops each of which is carrying a single polarization satellite signal from satellite antenna B which is provided by individual amplifiers 80 and 82. Signals are coupled by multistap 81, shown in FIG. 18, to satellite signal converter unit 84, which is illustrated in FIG. 21, and which receives the signal from satellite A as a combined broadband signal and receives the individual left and right-hand polarization signals from satellite B which are provided by amplifiers 80 and 82. These signals are combined to a single wide-band output signal which is provided to the power divider 38 and thereafter to customer devices which convert the signals to usable off-air and satellite signals. In addition, the arrangement of FIG. 6 includes a multiswitch 70 which is configured to select either the combined output from one of satellite converter unit 60, connected to antenna A or the combined output from satellite converter unit 60 connected to antenna B and connect the combined signals to satellite receivers 86 arranged for wide-band reception. Alternately, a customer satellite conversion device 96, shown in FIG. 28 may be used. Using the arrangement of FIG. 6, the required bandwidth for cable transmission is reduced compared to the arrangement of FIG. 5.

Figure 7:
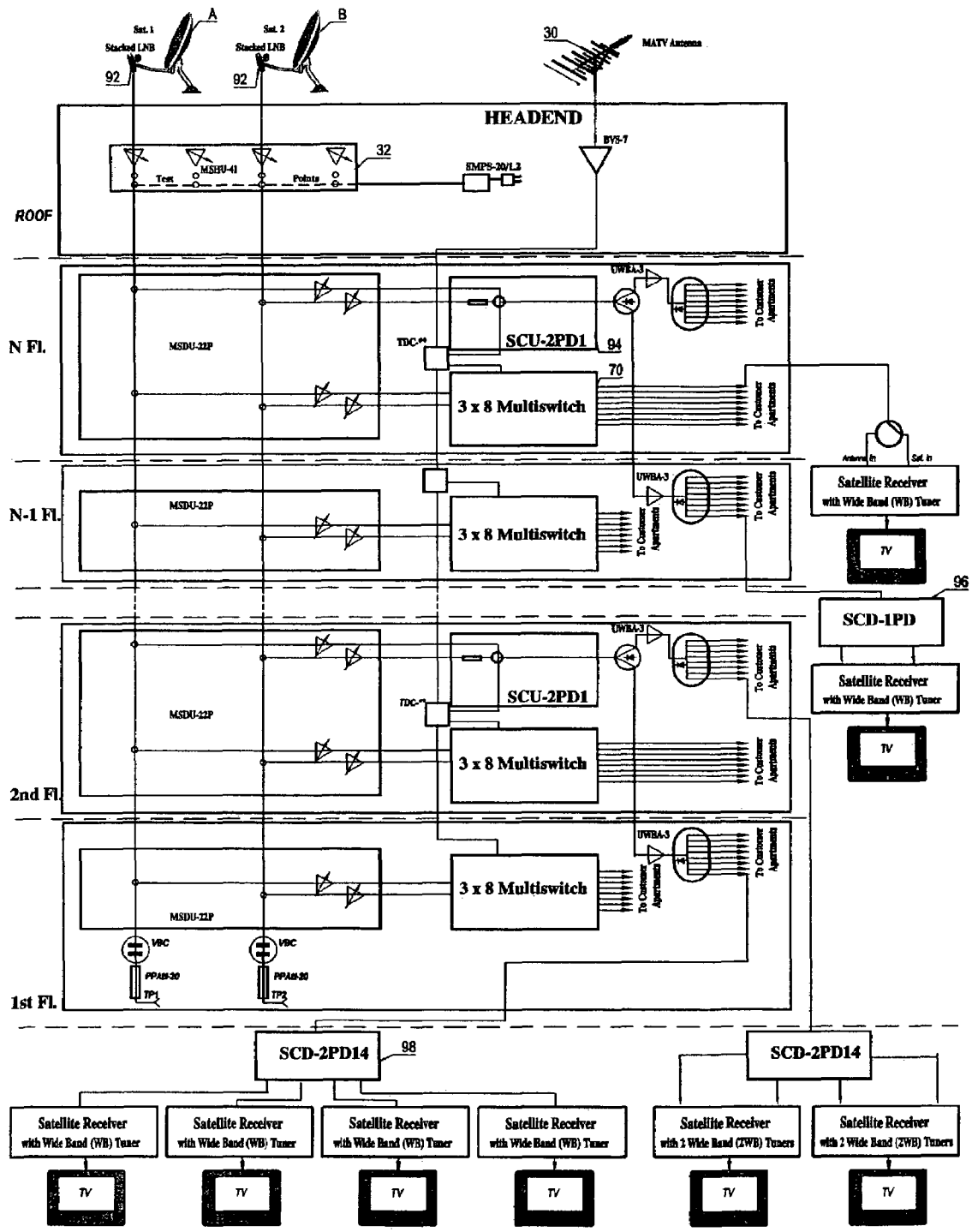
FIG. 7 is an illustration of a fifth embodiment of a satellite signal delivery system in accordance with the present invention.

FIG. 7 shows still another alternate embodiment of the invention wherein the left and right-hand polarization signals received on satellite antenna A and satellite antenna B are stacked in frequency at the satellite antennas A and B and thereafter provided by an amplifier 32 to cable drops connected to satellite converter units 94 and switches 70 located at various positions within the building.

Figure 24:
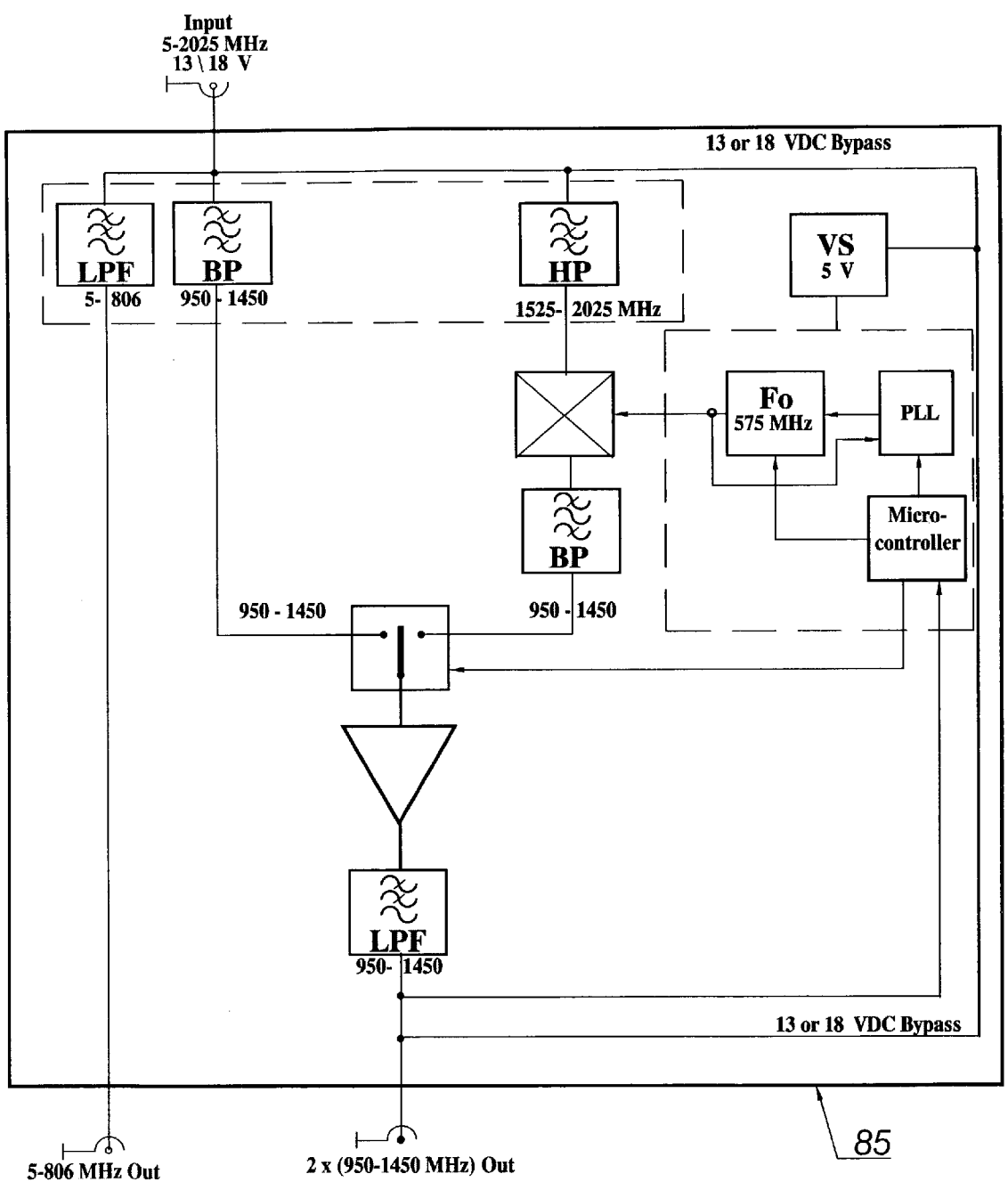
FIG. 24 illustrates a frequency converter demultiplexer useful in connection with the systems of the present invention.

Referring to FIG. 24, there is shown a satellite customer device 85, which is useful in connection with receiving wideband signals from a single satellite, where subscribers have a narrow band satellite receiver.

Figure 27:
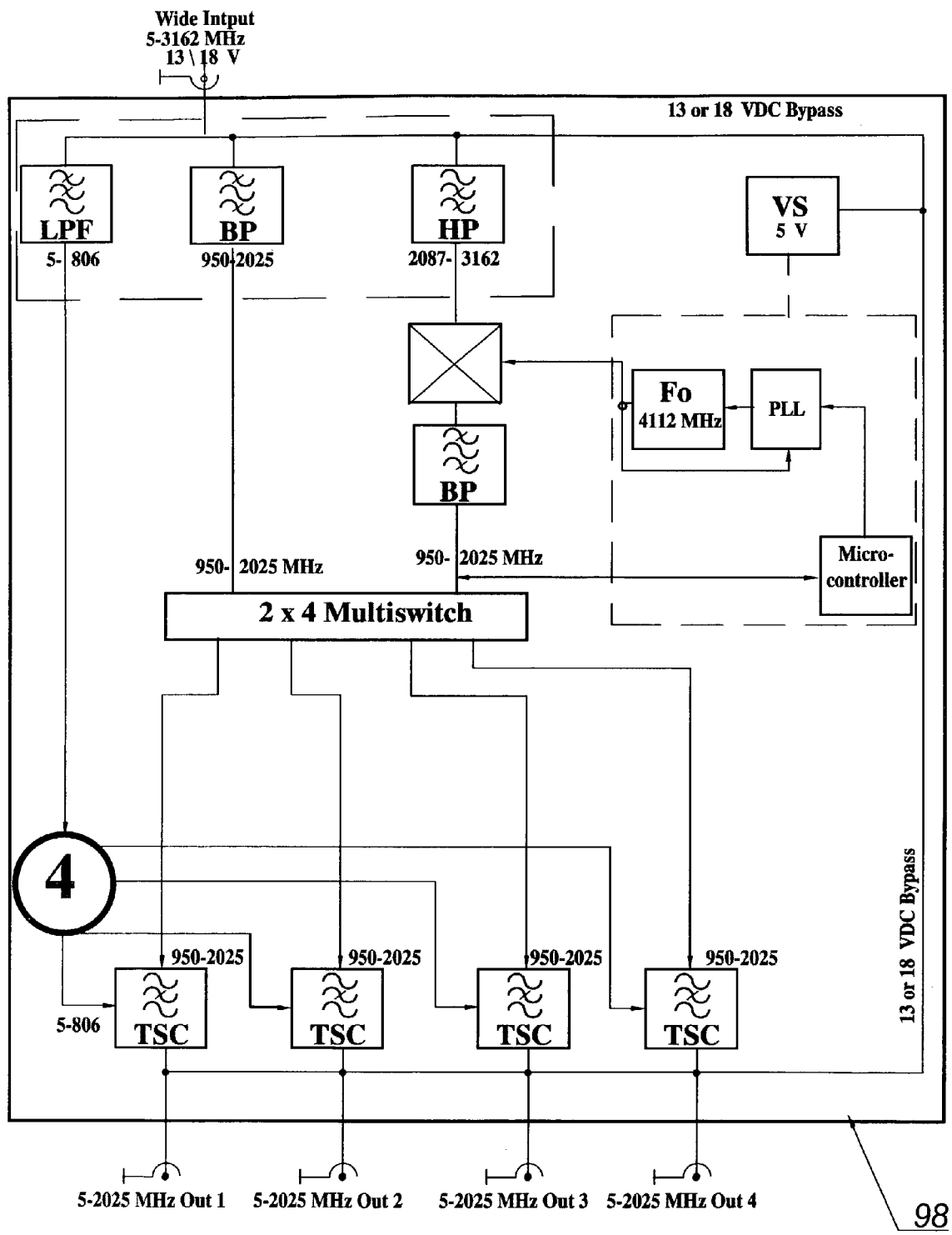
FIG. 27 illustrates another frequency converter demultiplexer useful in connection with the systems of the present invention.
Figure 28:
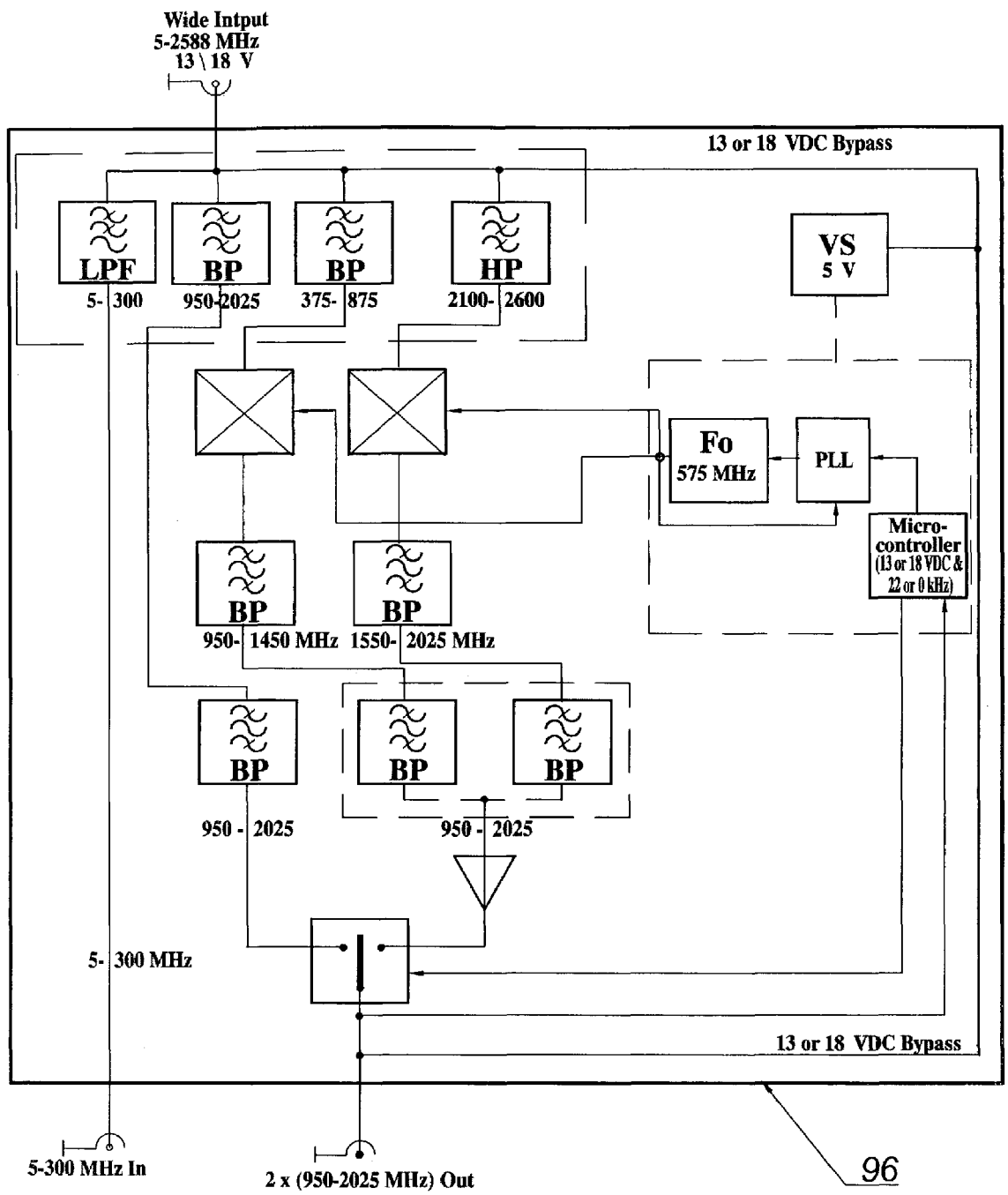
FIG. 28 illustrates another frequency converter demultiplexer useful in connection with the systems of the present invention.

In the embodiment illustrated in FIG. 7, each of the satellite antennas A and B is provided with a stacked, low-noise LNR 90, 92 for providing the left-hand and right-hand circularly polarized satellite signals over a single wide band satellite channel through amplifier 32 to the drop cables connected to the satellite converter unit 94 and multiswitches 70 located on the various floors of the building. In the arrangement of FIG. 7 the signals can be provided to subscribers through the satellite converter unit 94 which stacks the two outputs from the cable drop into a wide-frequency band of 5 to 3162 MHz. The customer device 96, which is shown in FIG. 28 converts the received satellite signals to a pair of satellite signal bands of 950 to 2025 MHz which are thereafter provided to satellite receivers capable of wide-band reception. An alternate satellite customer device 98, shown in FIG. 27, may be provided with a multiswitch to enable either of the two satellite signals as well as the off-air antenna signal to be supplied to satellite receivers at multiple television sets.

Figure 8:
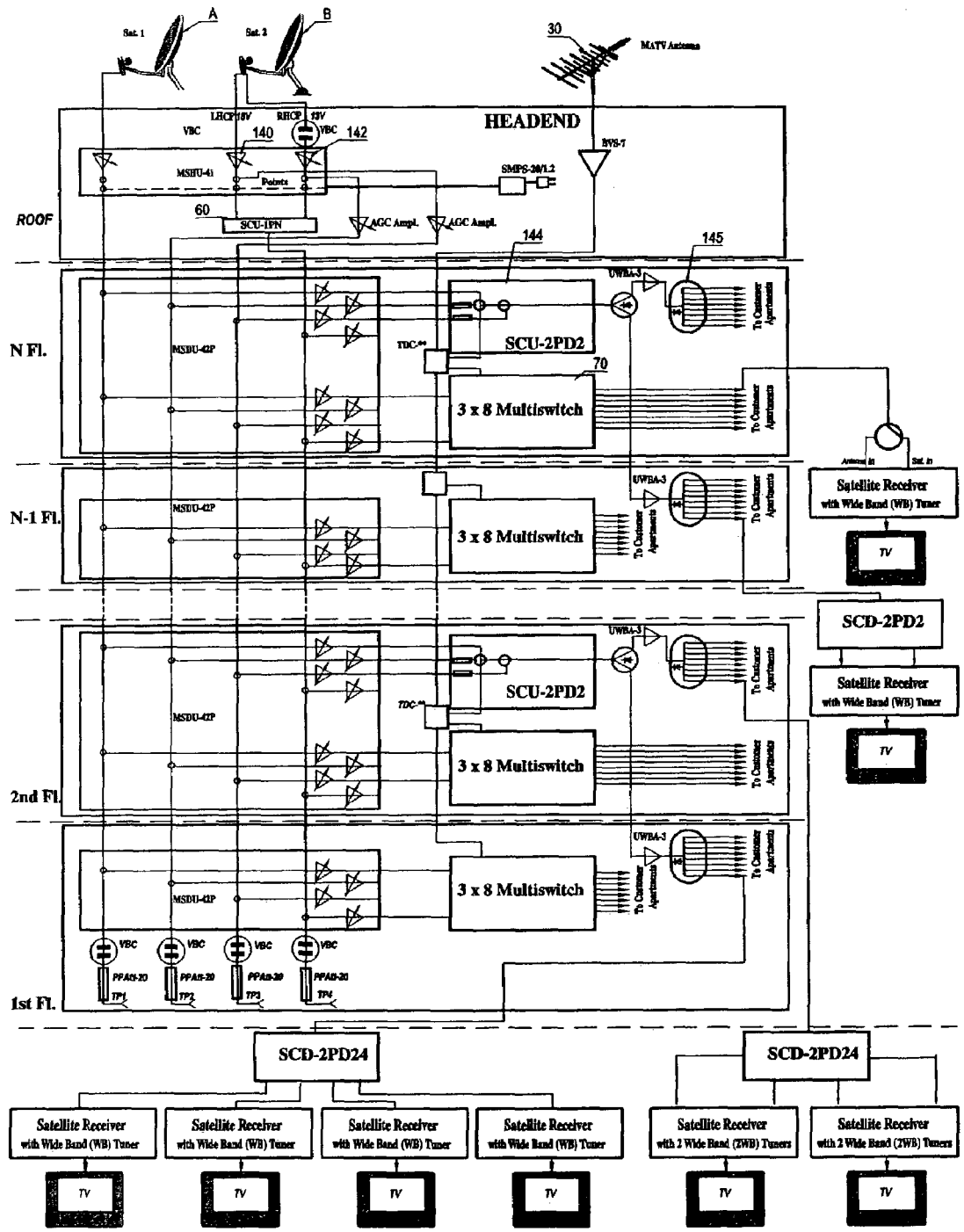
FIG. 8 is an illustration of a sixth embodiment of a satellite signal delivery system in accordance with the present invention.

FIG. 8 shows another arrangement in which the signals from satellite antenna A are stacked for provision to a drop cable as a combined left and right-hand polarization wideband satellite signal. Likewise signals from satellite antenna B are provided to a drop cable as combined signals but are also provided by amplifiers 140 and 142 to separate drop cables. In the arrangement of FIG. 8 a satellite converter unit 144 provides signals from satellite antenna A as a combined signal, and from satellite antenna B via amplifiers 140 and 142 as individual narrow-band signal to be provided by a power divider 145 to customers. A multiswitch 70 can also be used to provide combined satellite signals from converter unit 60 to customers.

Figure 9:
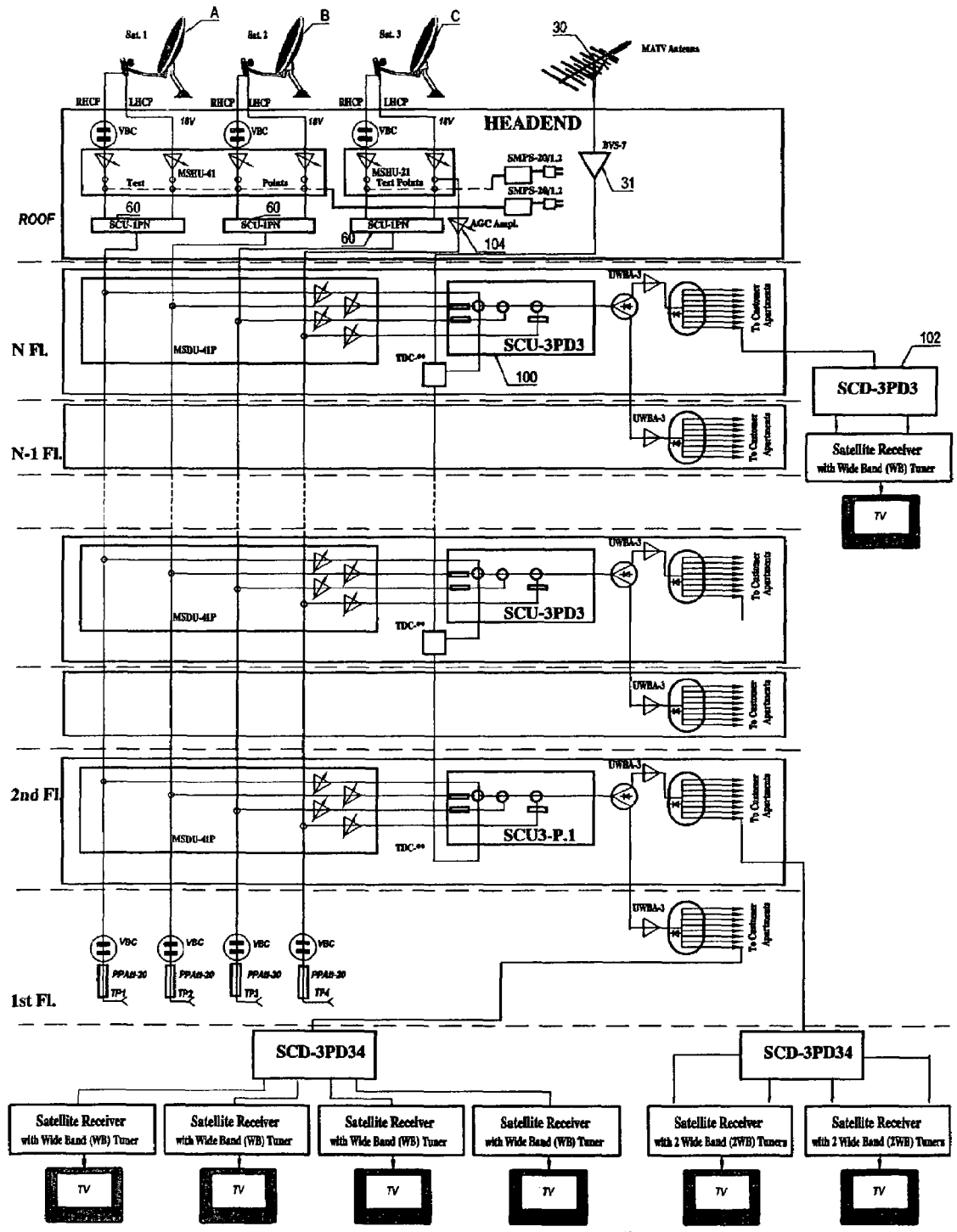
FIG. 9 is an illustration of a seventh embodiment of a satellite signal delivery system in accordance with the present invention.
Figure 22:
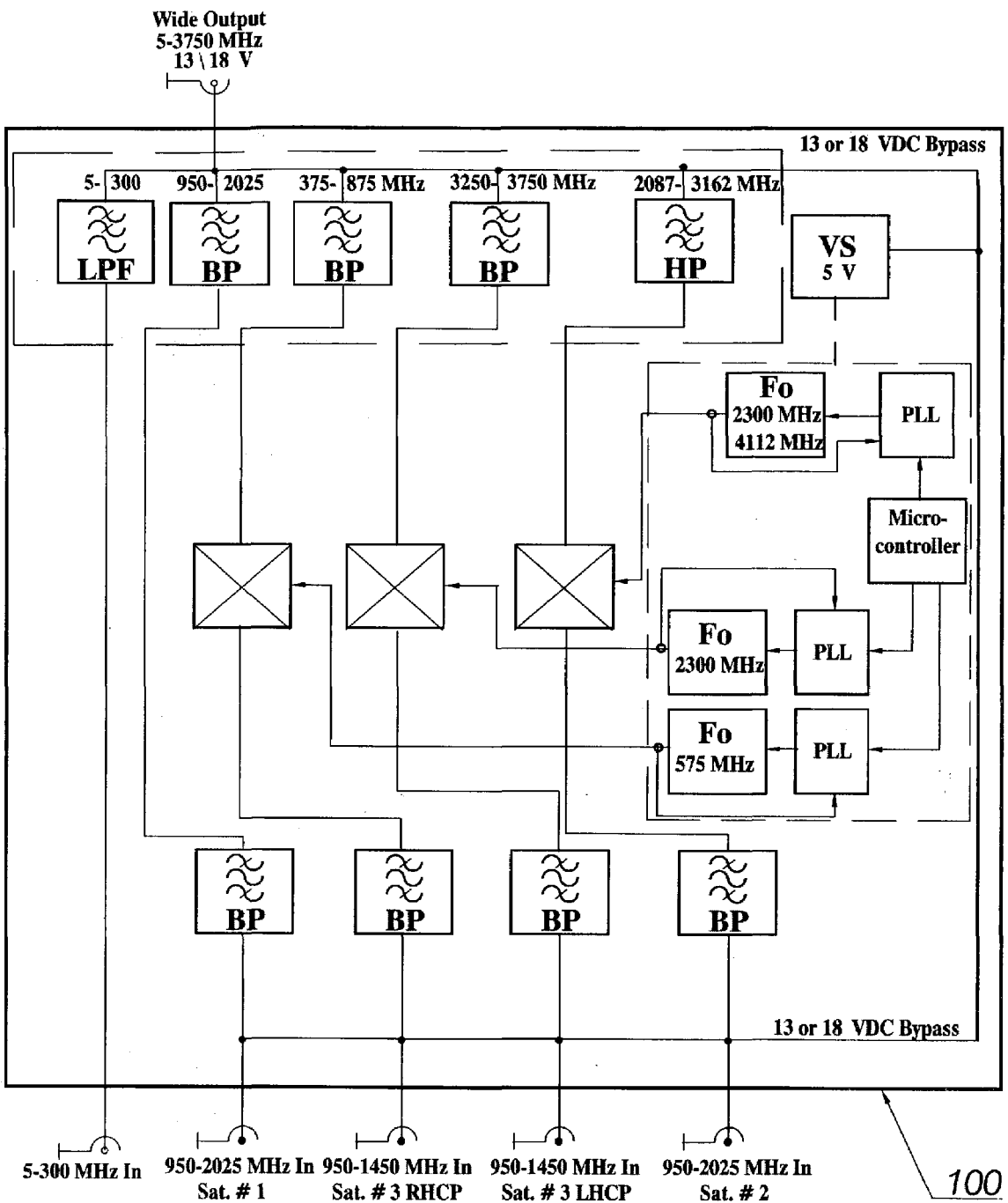
FIG. 22 illustrates another frequency converter multiplexer useful in connection with the systems of the present invention.
Figure 30:
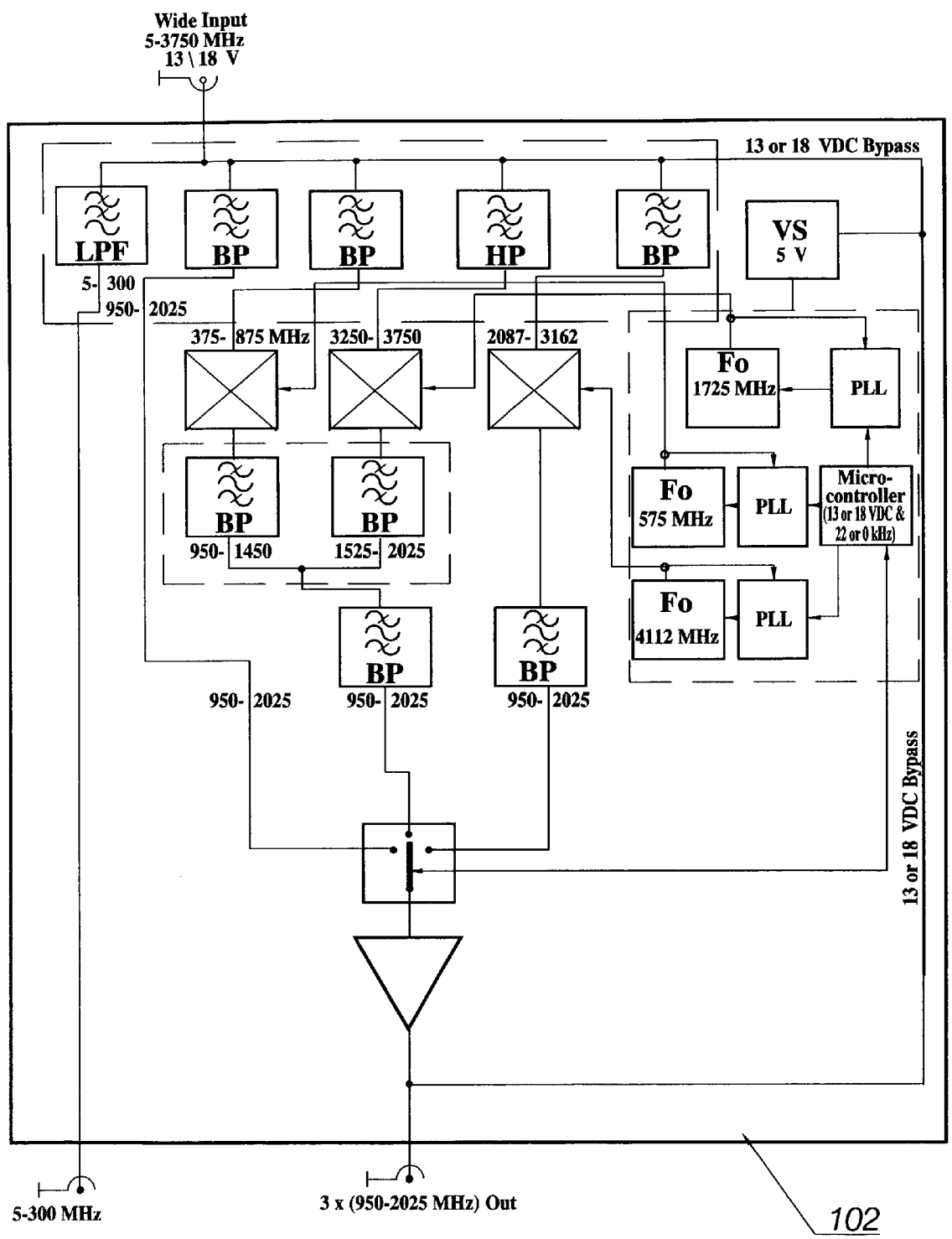
FIG. 30 illustrates another frequency converter demultiplexer useful in connection with the systems of the present invention.

FIG. 9 shows an arrangement for providing customers with signals from three satellites. Signals from each satellite are provided to converter units 60 and provided to drop cables as combined wide-band signals. One channel of signals from satellite antenna C is also provided to amplifier 104 and provided to a separate drop cable as well as the cable for off-air signals provided by amplifier 31. In the system of FIG. 9 the satellite converter unit 100, shown in FIG. 22, provides the signals to as a single wide-band signal to customers, which are provided with a satellite customer device 102 shown in FIG. 30 for converting the signals to a wide-band signal capable of being received in a satellite receiver.

In the example of FIG. 10, which is similar to FIG. 9, there are additionally provided switches 106, which provide selected satellite signals from the drop cables to wide-band satellite receivers 108.

Figure 11:
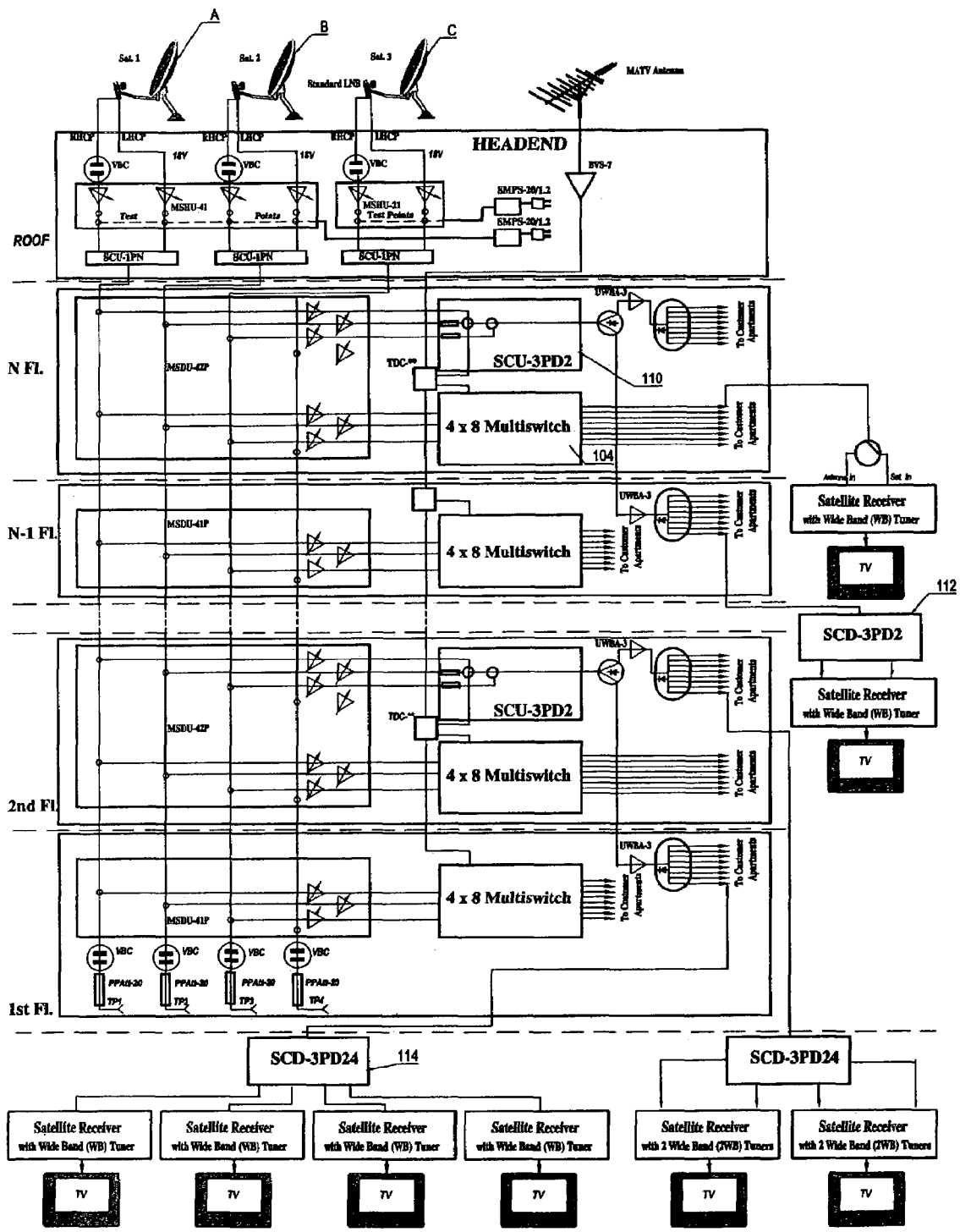
FIG. 11 is an illustration of a ninth embodiment of a satellite signal delivery system in accordance with the present invention.
Figure 23:
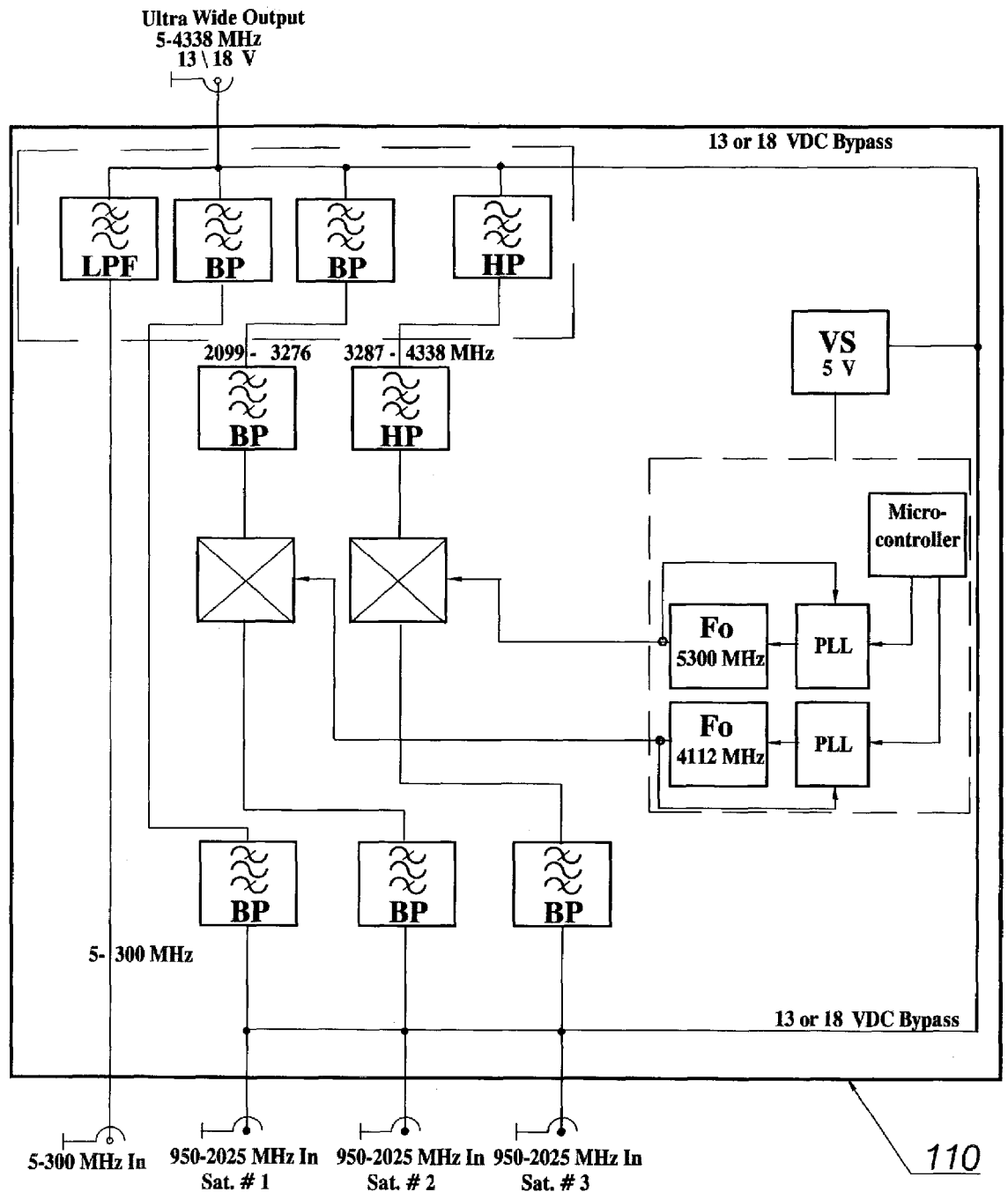
FIG. 23 illustrates another frequency converter multiplexer useful in connection with the systems of the present invention.
Figure 31:
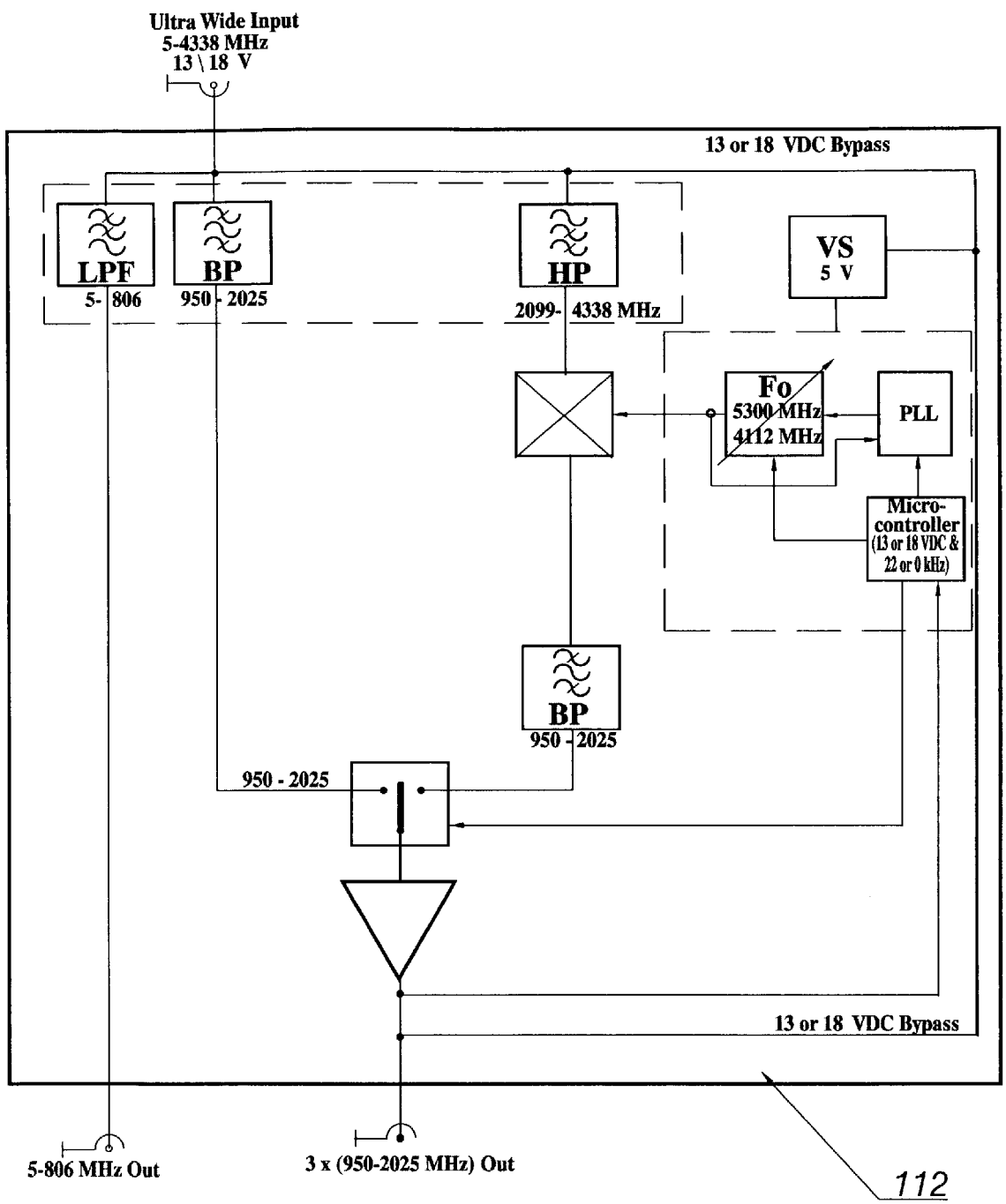
FIG. 31 illustrates another frequency converter demultiplexer useful in connection with the systems of the present invention.
Figure 33:
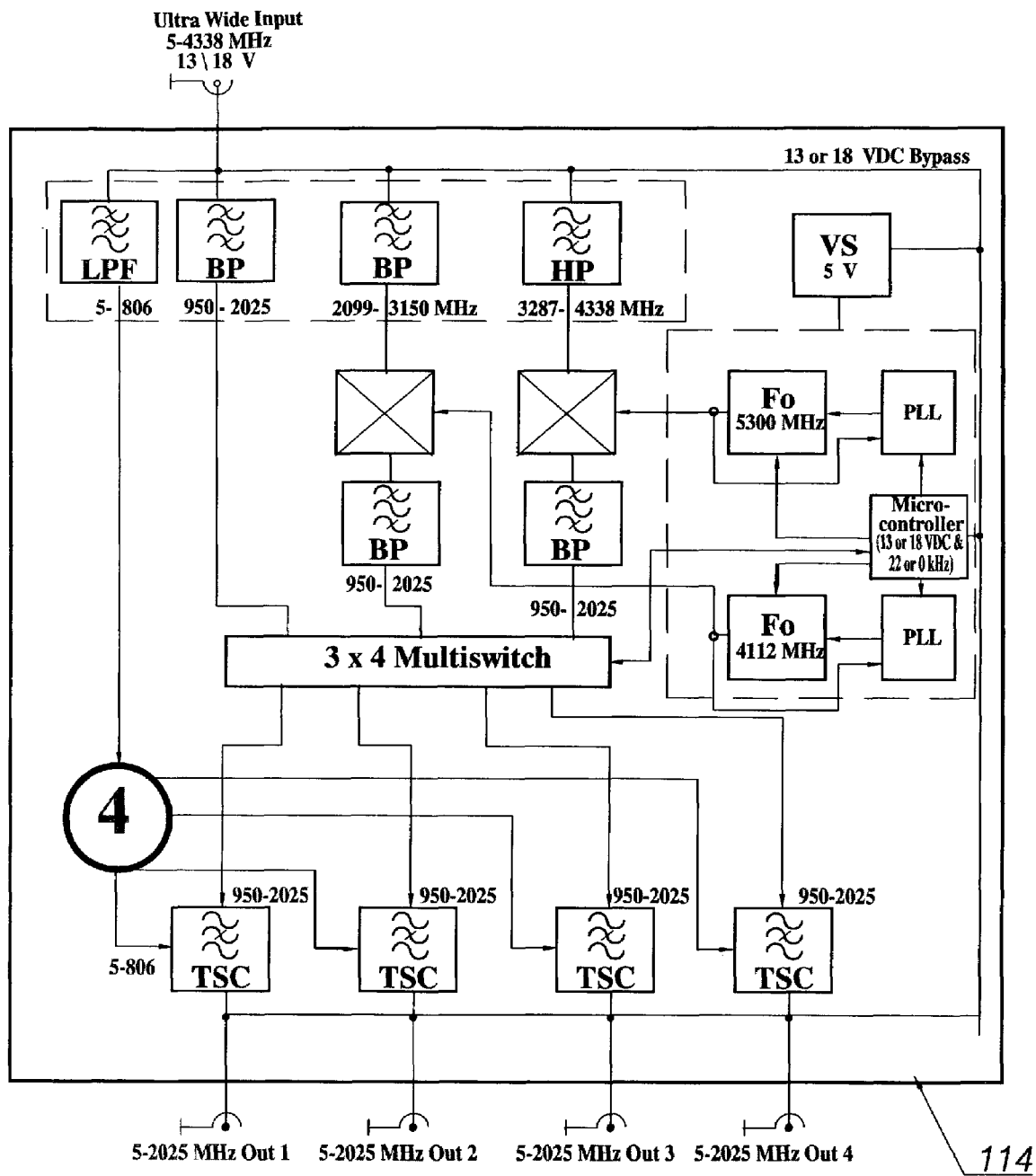
FIG. 33 illustrates another frequency converter demultiplexer useful in connection with the systems of the present invention.

In the exemplary arrangement of FIG. 11, signals from three satellites are likewise provided to customers through a satellite conversion unit 110 which has only three satellite inputs, and the signals are also provided to multiswitch 106 which is arranged to select between the antenna signal and each of the three combined satellite signals. The input signal to the splitter arrangement of the FIG. 11 system may be provided by an ultra wide-band signal conversion unit 110 shown in FIG. 23. A customer device for receiving the ultra wide-band signal 112 is shown in FIG. 31. Where a customer has multiple satellite receivers, an ultra wide-band customer device 114, which is shown in FIG. 33, may be provided.

Figure 12:
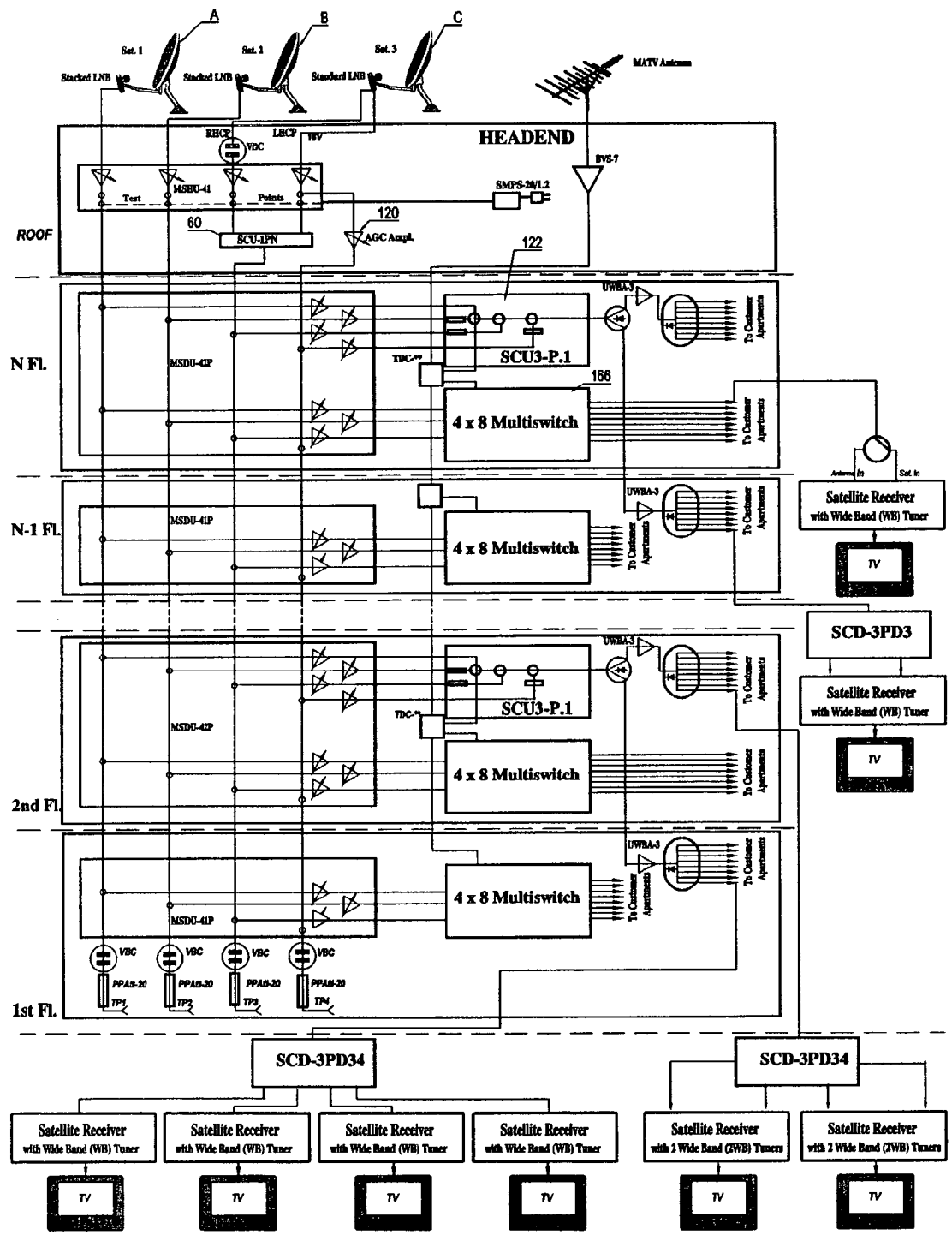
FIG. 12 is an illustration of a tenth embodiment of a satellite signal delivery system in accordance with the present invention.

FIG. 12 shows a variation of the system wherein satellite antennas A and B have receivers that provide stacked wide-band satellite outputs while satellite antenna C provides separate left and right-hand polarization outputs which are combined in satellite conversion unit 60. The satellite outputs are provided on drop cables to satellite conversion units 122 which combine the signals to be provided to the customer, and to a 4×8 multiswitch 166 which selects the signals to be provided to a customer satellite receiver arranged for wide-band reception.

Figure 13:
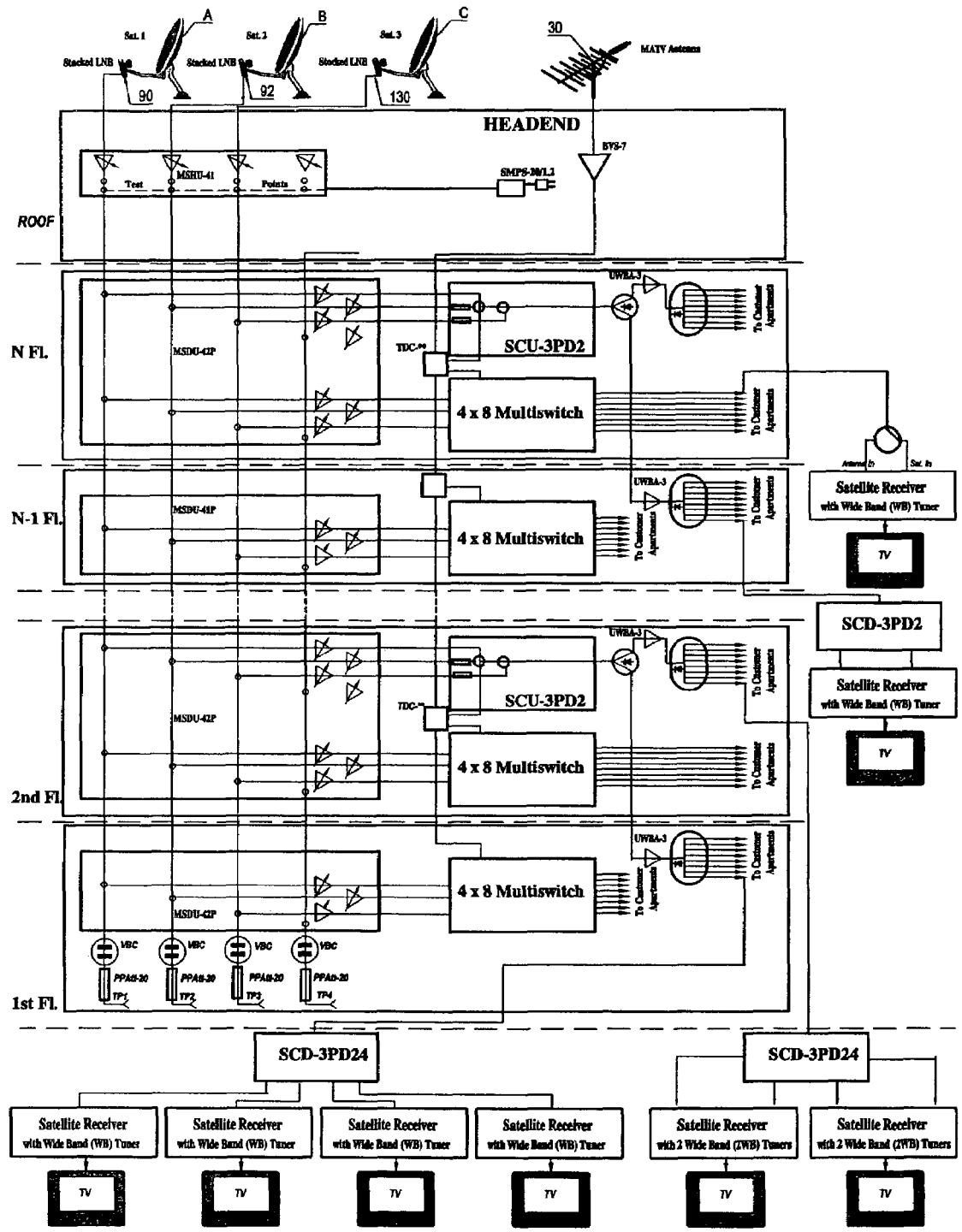
FIG. 13 is an illustration of a eleventh embodiment of a satellite signal delivery system in accordance with the present invention.

FIG. 13 shows an arrangement where all three satellite receiver antennas A, B and C have stacked LNR's units 90, 92 and 130, the outputs of which are provided to drop cables for combining in satellite converter units located on the various floors or for providing to customers through a multiswitch.

Figure 39:
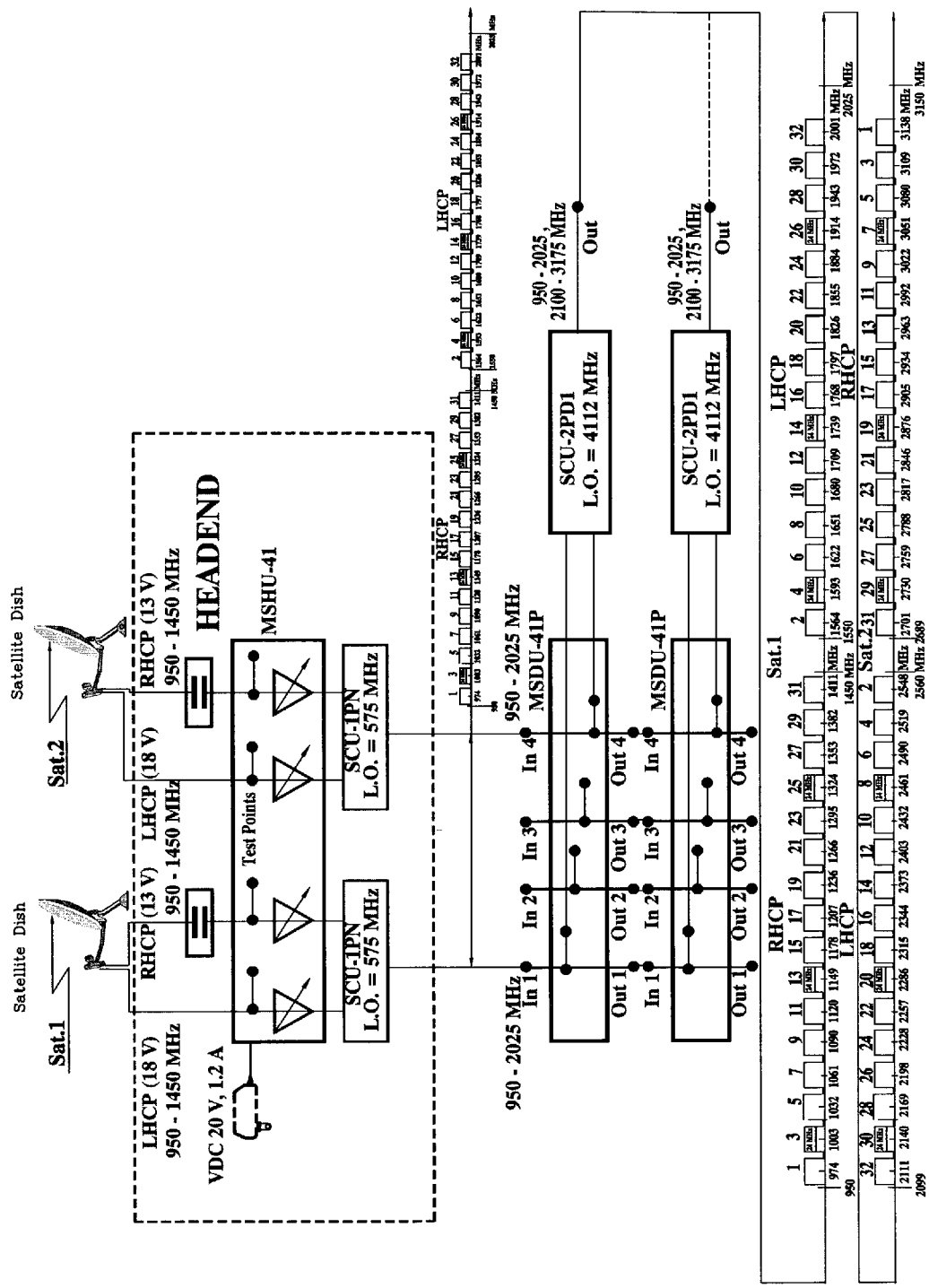
FIG. 39 illustrates a frequency plan useful for one embodiment of the present invention.

FIG. 39 shows a frequency plan for providing satellite signals to customers from two satellite antennas.

Figure 40:
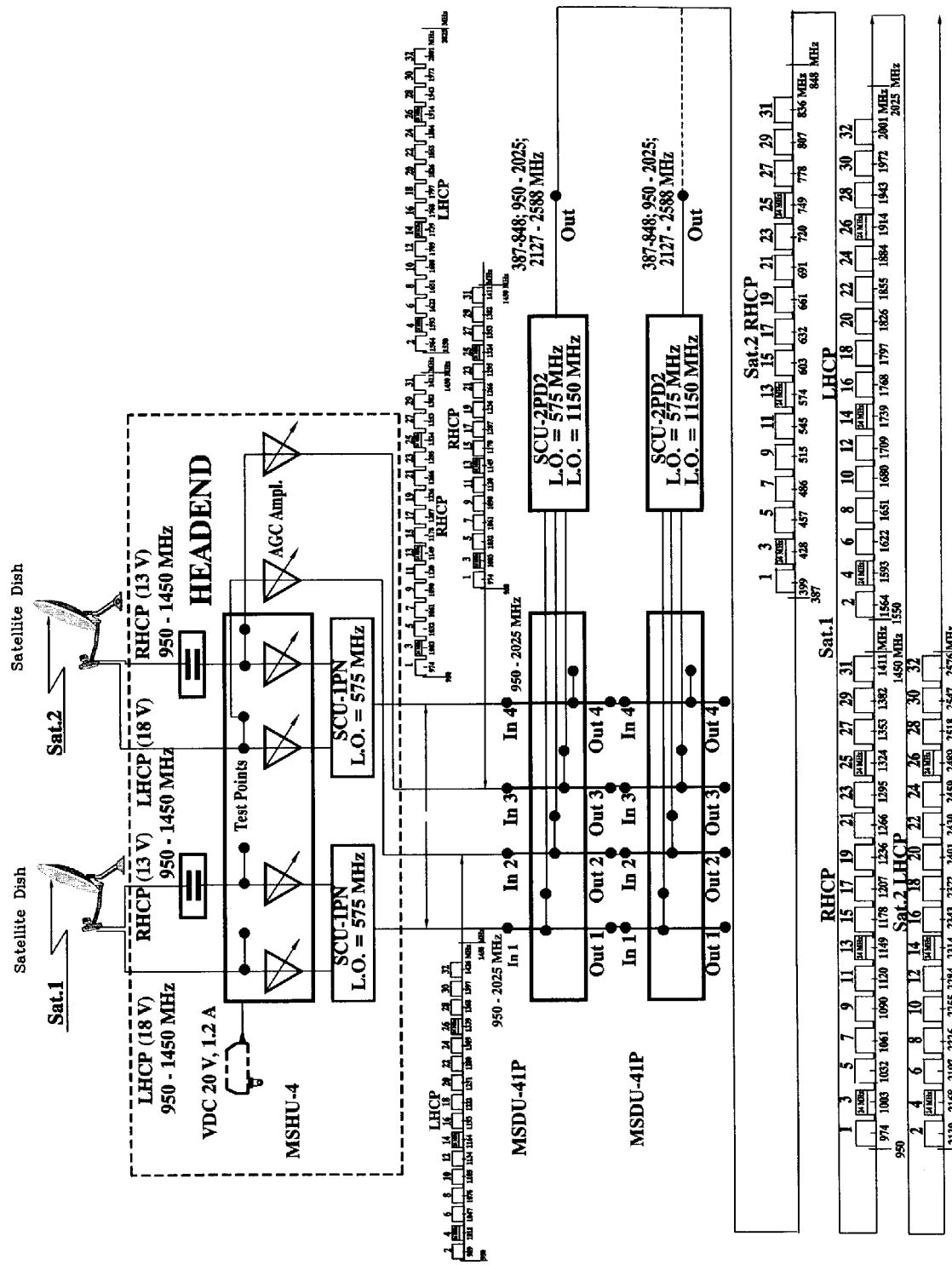
FIG. 40 illustrates another frequency plan useful for one embodiment of the present invention.

FIG. 40 shows another frequency plan for providing satellite signals from two satellites for distribution within a building wherein one of the satellite signals is provided both as a combined wide-band signal and as separate narrow-band signals to accommodate a variety of customer equipment within the building.

Figure 41:
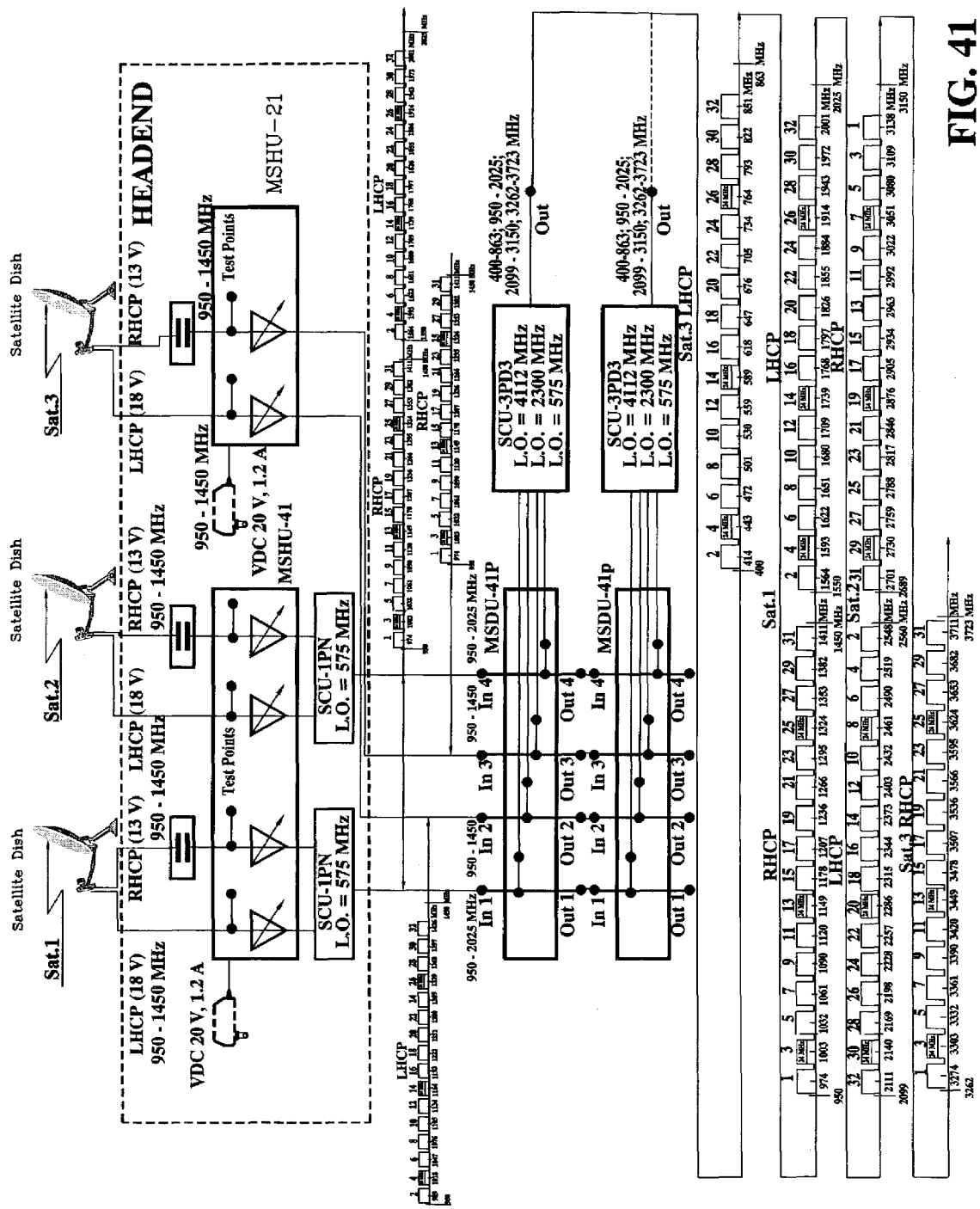
FIG. 41 illustrates another frequency plan useful for one embodiment of the present invention.

FIG. 41 illustrates a frequency plan for a three satellite system.

Figure 42:
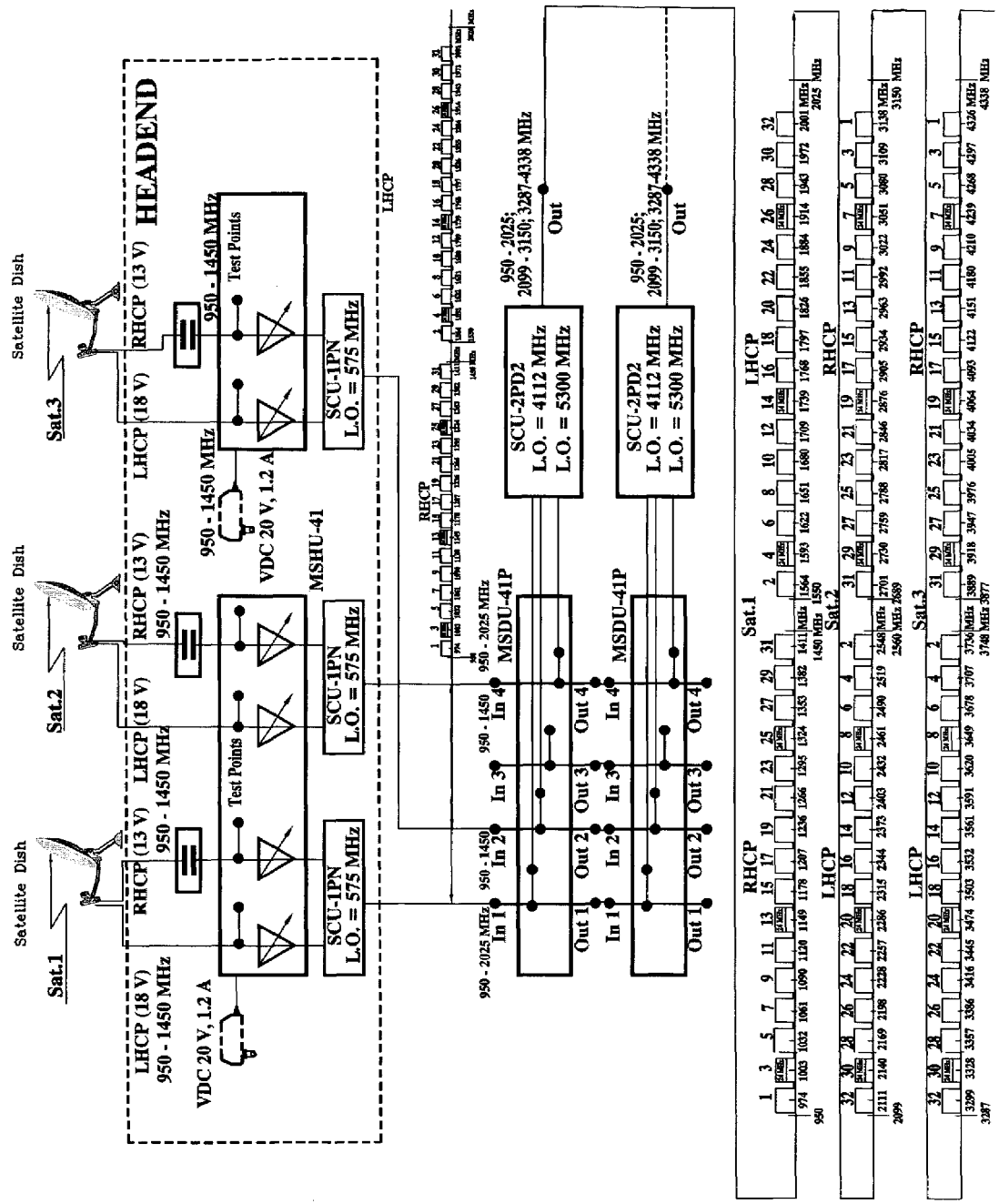
FIG. 42 illustrates another frequency plan useful for one embodiment of the present invention.

FIG. 42 illustrates another frequency plan for distribution of signals received from three satellite antennas.

Figure 25:
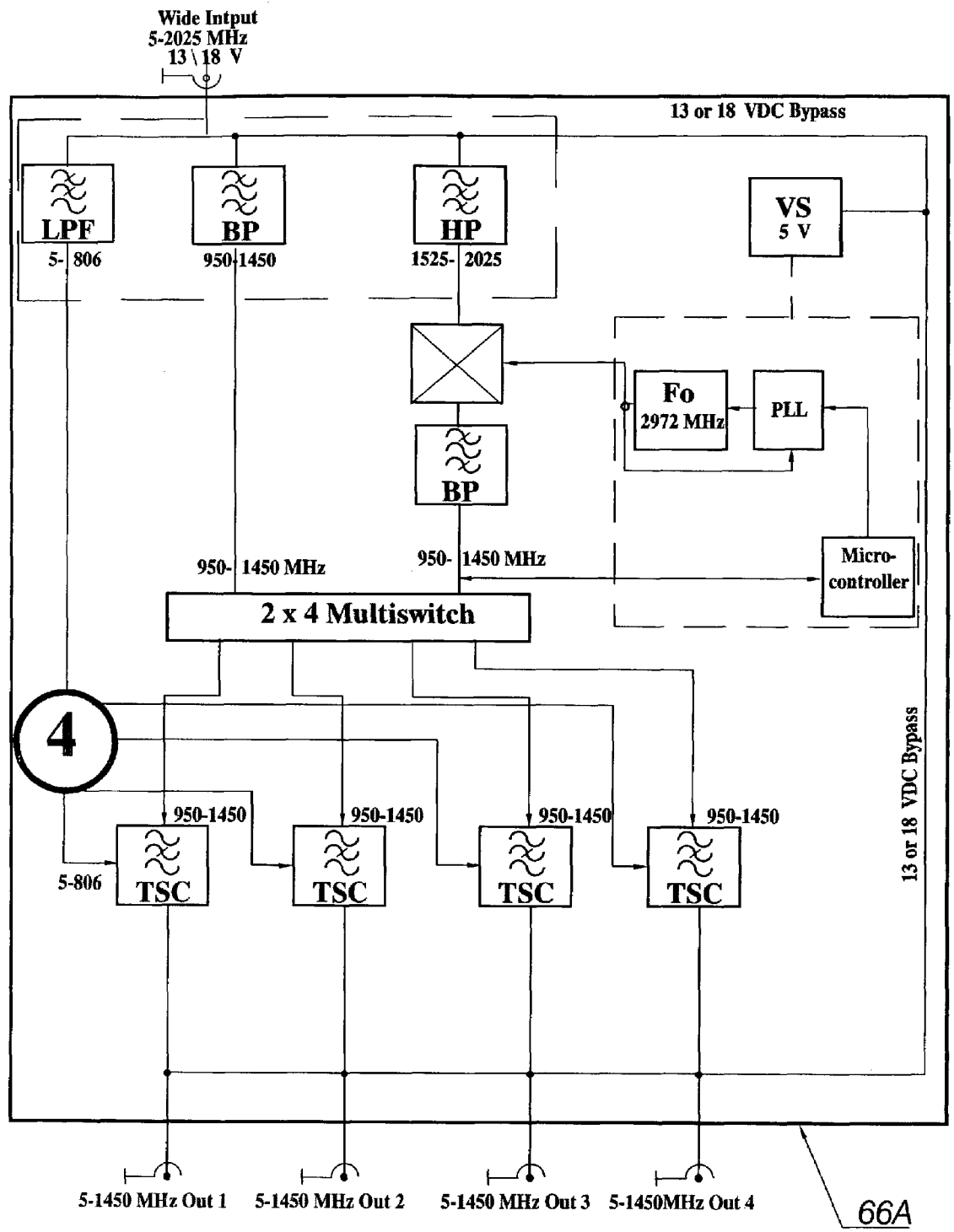
FIG. 25 illustrates another frequency converter demultiplexer useful in connection with the systems of the present invention.

FIG. 25 shows a customer device 66A for use in providing a wide band signal to multiple wide band receivers, which includes a multiswitch 67.

Figure 29:
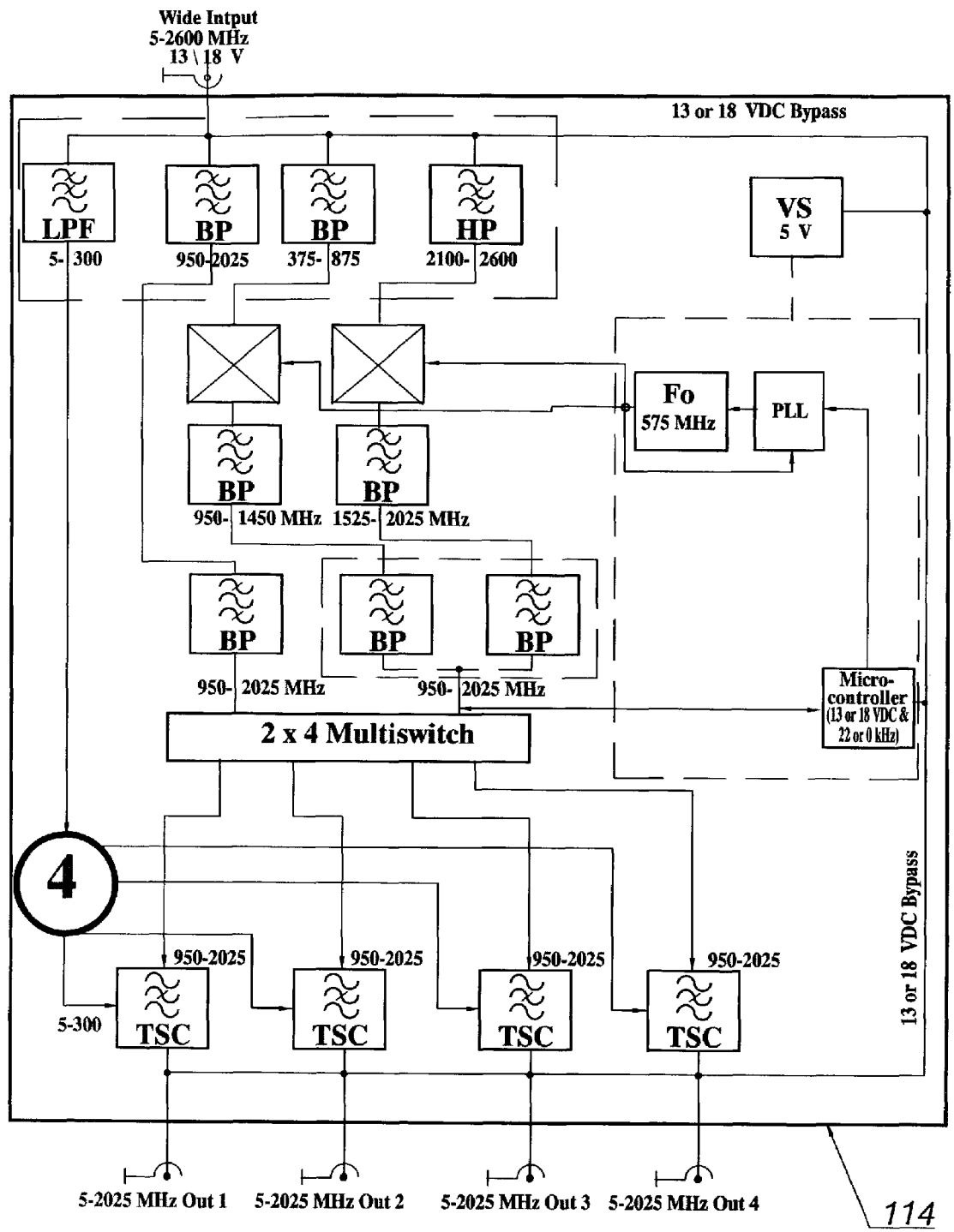
FIG. 29 illustrates another frequency converter demultiplexer useful in connection with the systems of the present invention.

FIG. 29 shows a wide-band customer device 114, having a multiswitch 67 for providing signals to wide band receivers The above discussion relates to Direct Broadcast Multisatellite delivery systems in which all satellite transmission bands are stacked in frequency, and all transmissions are basically provided or available to a satellite customer drop independent of the particular programming that the customer selects for viewing. The total number of satellite transmission bands is limited by the highest signal frequency allowed by coax cables and distribution splitters.

Figure 43:
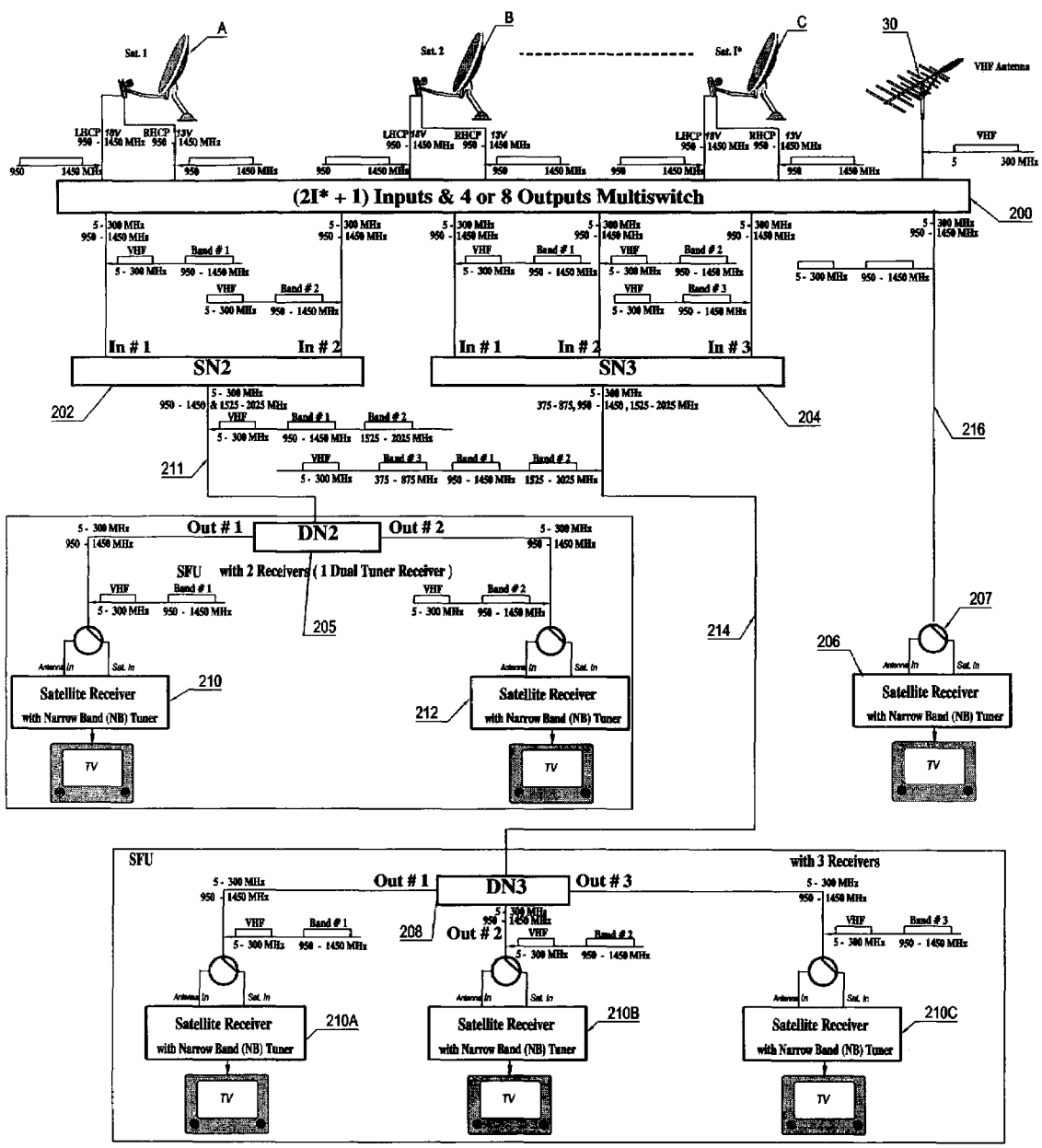
FIG. 43 illustrates an embodiment of the invention wherein satellite signals are multiplexed according to user selection of signals.
Figure 44:
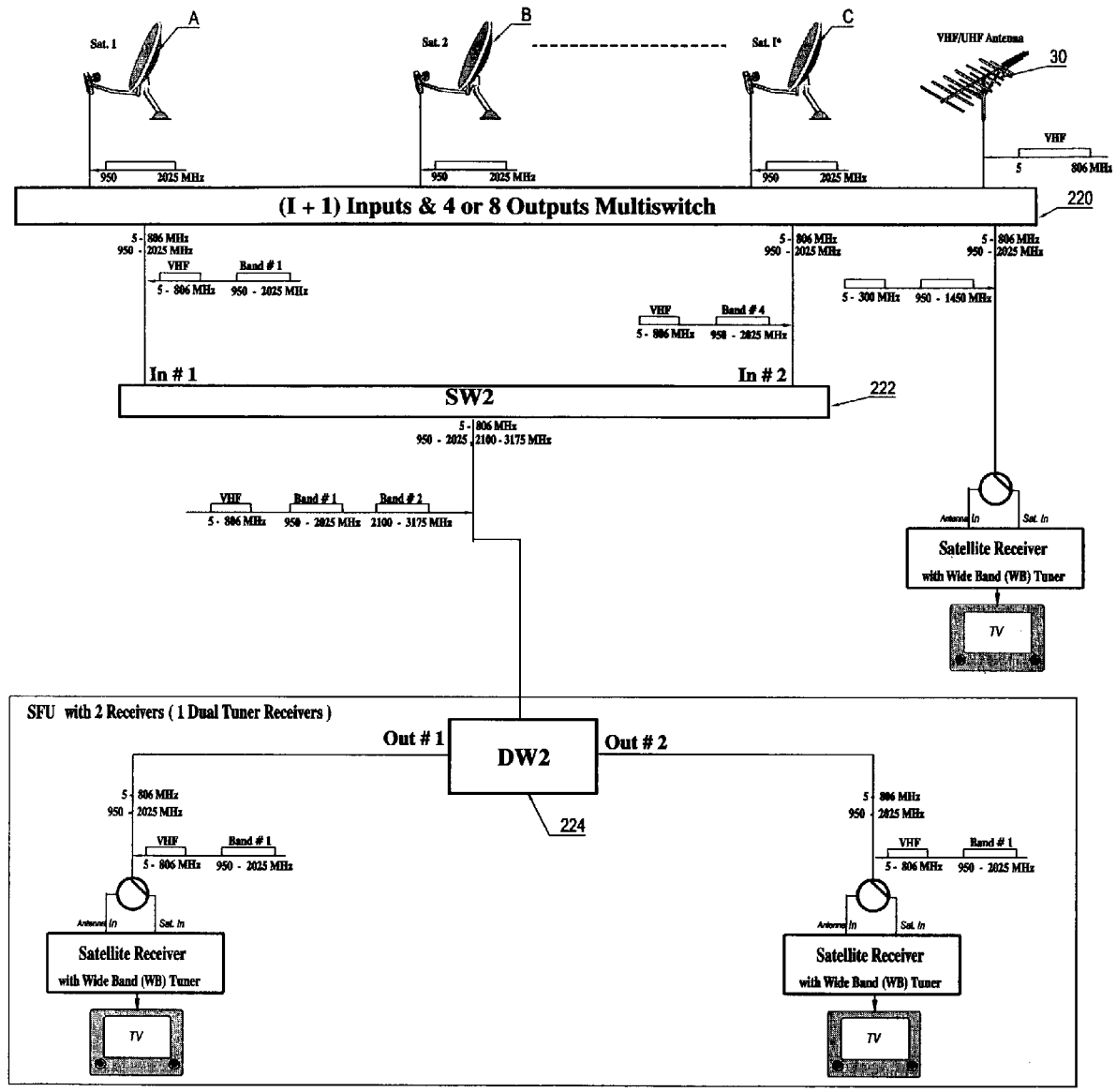
FIG. 44 illustrates another embodiment of the invention wherein satellite signals are multiplexed according to user selection of signals.
Figure 45:
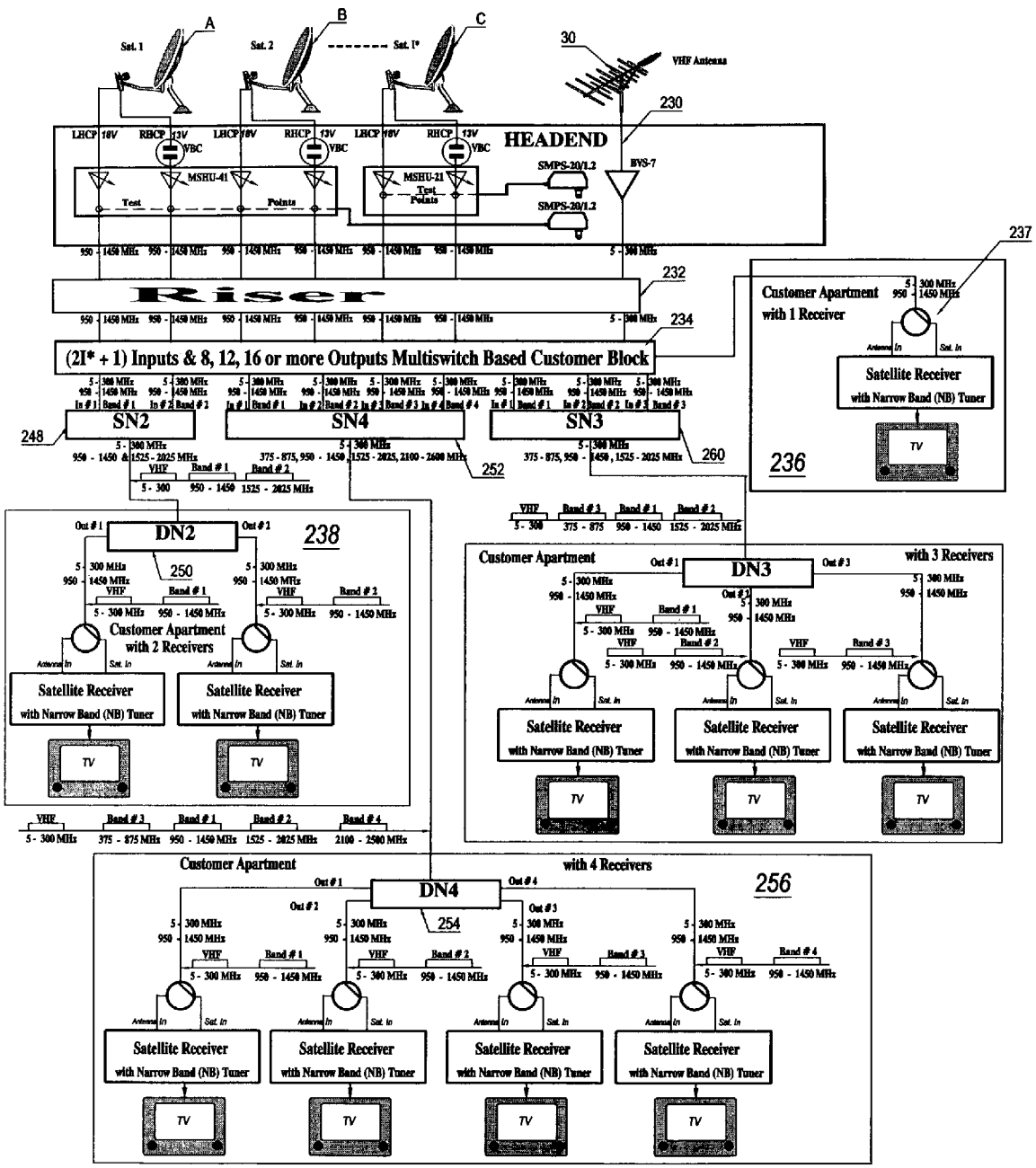
FIG. 45 illustrates another embodiment of the invention wherein satellite signals are multiplexed according to user selection of signals.

FIGS. 43-45 relate to an arrangement wherein the multiple satellite receivers are connected to a head-end multiswitch output via satellite Virtual Subscriber Lines (SVSL) and wherein the satellite signals, corresponding to the receiver's selection are stacked in frequency bands. In this arrangement up to 5 satellite receivers can be connected to the multiswitch via single subscriber line.

There is no limitation on the number of satellite bands to be available to a multiple receivers via single customer drop, since the customer's cable carries only the satellite signals selected by the customer. The number satellite bands will be determined by a multiswitch In the system of FIG. 43 signals are provided from three satellite antennas, A, B, and C as well as from off-air antenna 30. The signals are provided to an input multiplexing switch 200, which has two inputs corresponding to each satellite antenna and an input corresponding to the off-air antenna 30. The system of FIG. 43 includes six outputs from the input multiswitch 200 which are provided to two input stacking device 202, three input stacking device 204, and directly to a satellite receiver 206 by way of a multiplexer 207. It should be understood that the number of outputs from multiswitch 200 will correspond to the number of receivers to be serviced. Operation of multiswitch 200 can connect any of the six satellite inputs, in combination with the off-air antenna signal, to any of the outputs of multiswitch 200. The stacking devices 202 and 204 are arranged to multiplex signals on to a single cable for delivery of customer selected satellite signals to customer receivers. In the case of the customer serviced by device 202, there are provided two satellite receivers 210, 212. Cable 211 which connects device 202 to customer device 205 is arranged to provide a set of signals that multiplexes the off-air signal with two satellite bands which are selected from the six satellite inputs from satellite antennas A, B, and C by multiswitch 200. Accordingly, in the system of FIG. 43, signals supplied to any particular customer device 205 over customer cable 211 are selected according to the channel or channels the satellite receivers 210 and 212 in the customer's apartment or quarters are tuned to. Device 204 is similar to device 202 but selects three of the satellite signals for supply over cable 214 to customer device 208. Accordingly, device 204 makes available the off-air signal from antenna 30, and provides three different frequency bands of satellite signals that are selected from the six satellite signals available at the input to multiswitch 200 according to the signals selected by the satellite receivers connected to customer device 208. Customer device 208 receives the off-air signals and three bands of satellite signals and distributes them to satellite receivers 210A, 210B and 210C connected to the customer's television sets according to the channel selected by the customer.

Figure 51:
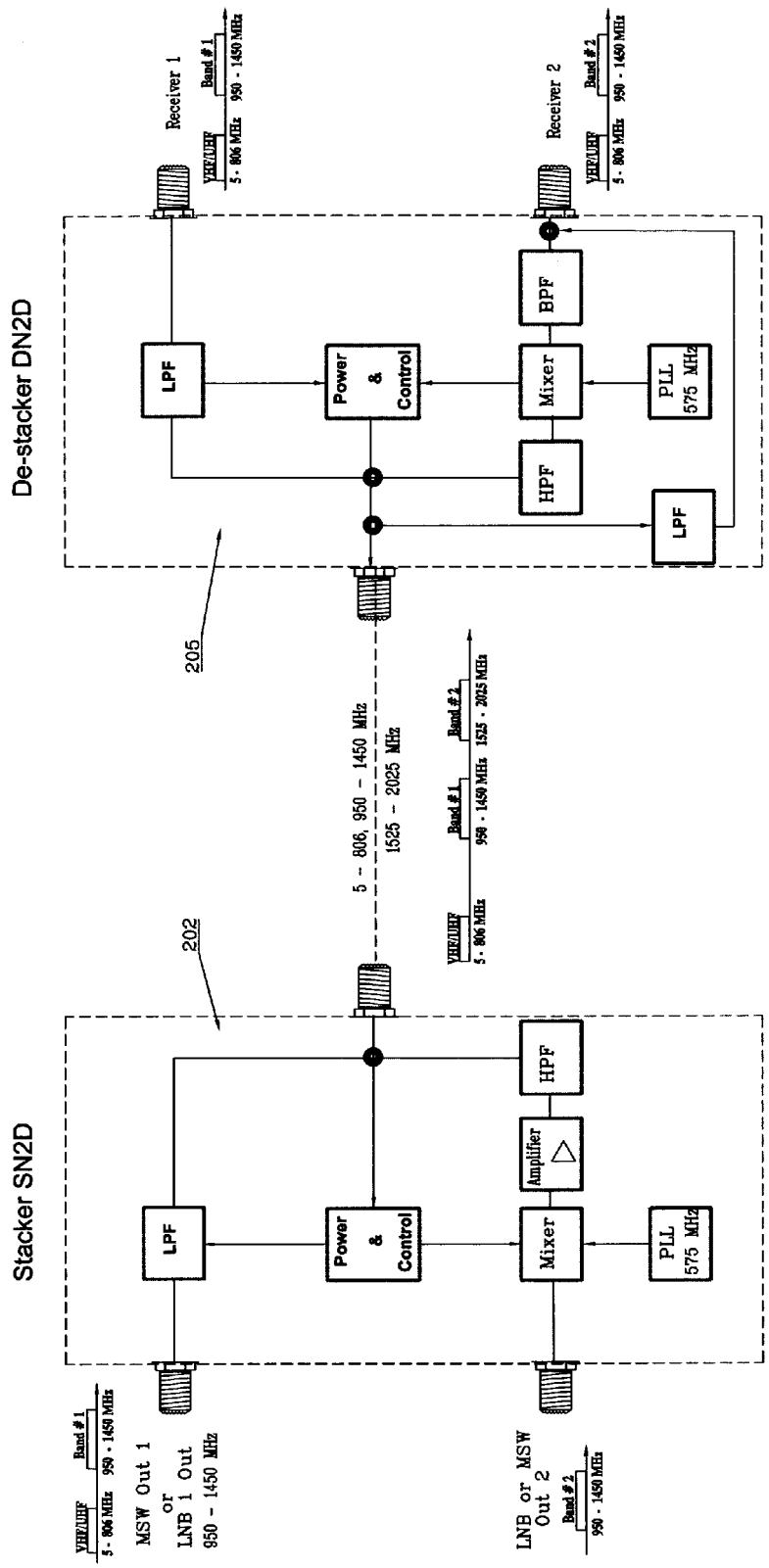
FIG. 51 is another simplified diagram showing a system wherein satellite signals are multiplexed according to user selection of signals.

A satellite receiver 206 having a single cable 216 is connected to an output terminal of multiswitch 200 which can be operated to provide any desired satellite signal to satellite receiver 206 from among the six satellite signals provided to multiswitch 200. In contrast to the previously described arrangements, the cables 211, 214, and 216 connected to the equipment 205, 206, 208 associated with individual satellite receiver carries only the selected band of satellite signals which is required for the particular satellite receiver and television set to which the satellite receivers 210, 210A, 210B, 210C, 212, 206 are connected. In contrast, the signals described with references to FIGS. 1-42 provide a range of satellite signals multiplexed over a cable, independent of whether or not the user has selected such signals for viewing. The device 202 and the users equipment 205 is shown in detail in FIG. 51. Referring to FIG. 51, device 202 includes two input terminals. The signal on one of the terminals is provided with a mixer which is supplied with a local oscillator signal of 575 MHz. The signals are thereafter combined and provide an output signal having a lower frequency band corresponding to VHF and UHF television channels received by off-air antenna 30, a first satellite band corresponding to the satellite signal provided to the first input terminal number 1 of device 202 and a second satellite band consisting of an up-converted satellite signal received from a second satellite signal input number 2 of device 202. The combined signal is provided, for example, over a cable, to destacker device 205 which performs the reverse process and provides at its outputs to receiver 1 and receiver 2 the off-air signal having VHF and UHF television channels received by antenna 30 and a single selected satellite band suitable for reception in a conventional, narrow-band satellite tuner 210, 212. Accordingly, the stacker device 202 and destacker device 205 are arranged to multiplex selected satellite signals over a single cable, thereby providing a "virtual" cable channel to each of the television satellite receivers connected to destacker 205.

Figure 52:
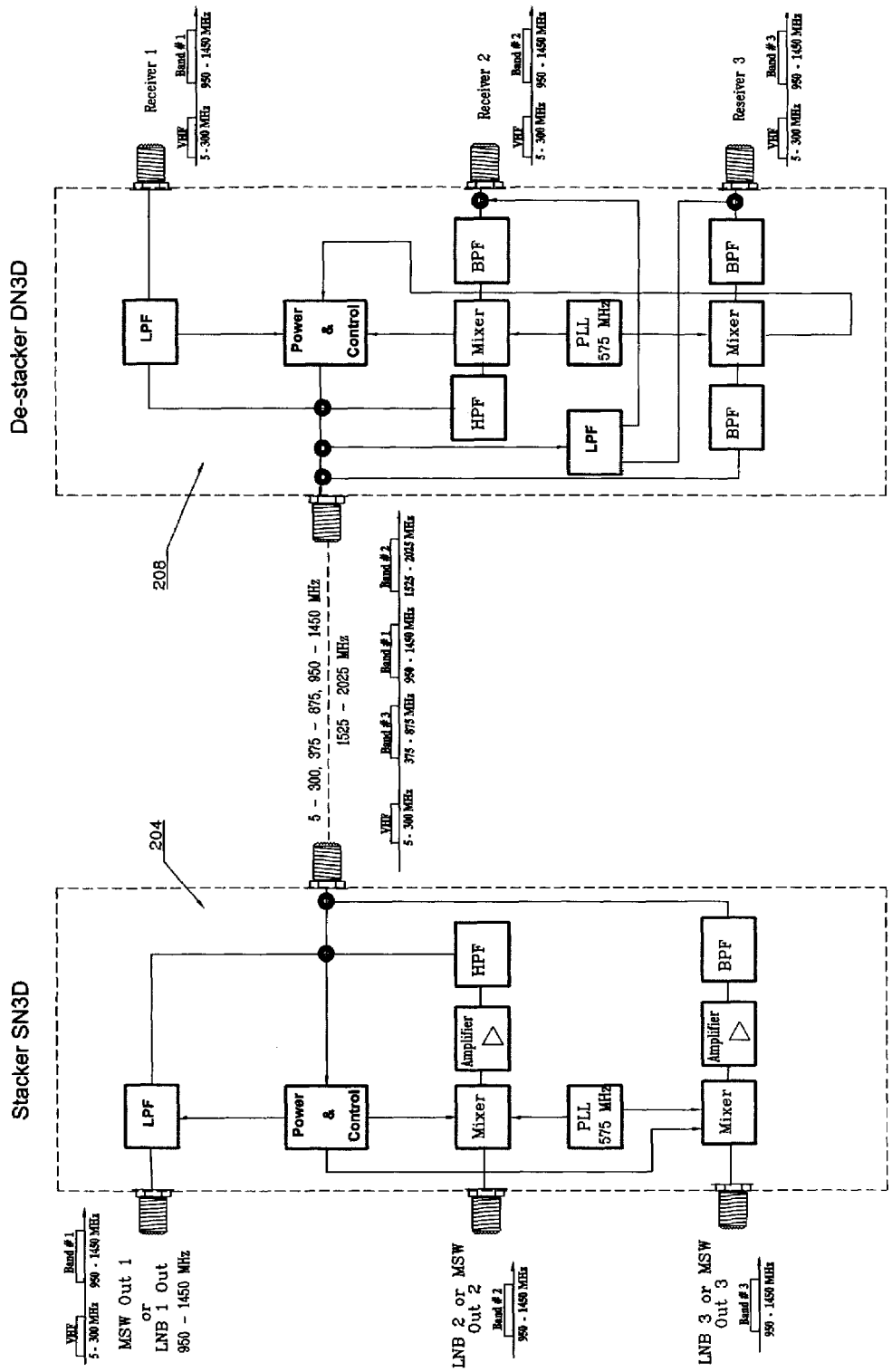
FIG. 52 is another simplified diagram showing a system wherein satellite signals are multiplexed according to user selection of signals.

Devices 204 and 208 of FIG. 43 are shown in detail in FIG. 52. As shown therein, three signals are provided to a stacker, each of which includes a satellite signal having a frequency band 950-1450 MHz. One of the signals includes the antenna signal. These signals are provided at the output of the stacker 204 on a single cable, wherein the signals are stacked in frequency for transmission to a destacker 208, wherein the signals are separated and provided as narrow-band satellite signals to receivers 1, 2, and 3. It is important to note that the satellite signal provided to any selected receiver are selectable by multiswitch 200 from the six satellite signals provided to the multiswitch from satellite antennas A, B, and C.

In connection with the system of FIG. 43 and any systems that include a switch that is remote from the satellite receiver or user equipment, it becomes necessary to signal the required switch configuration from the user location to the switch control or driving circuit. In conventional satellite systems a signal is sent from the receiver to the antenna, for example to change to the other polarization of the satellite signal this signal in some cases is a variation in the DC voltage provided to the antenna between 14 VDC and 18 VDC. In other cases a tone of 22 KHz. with 0.7 V amplitude is superimposed on the DC voltage. A further alternative is to use a standard designated DiSEqC, which is specified at www.eutelsat.com may be used to provide a digital code representing the required switch configuration.

In the system of FIG. 43 the switch command information from the user's receiver or from a customer device can be sent to multiswitch 200 using a separate signalling line. It is preferable, however to use the cable itself for signalling using a digital code to represent the required configuration of the switch.

Figure 38:
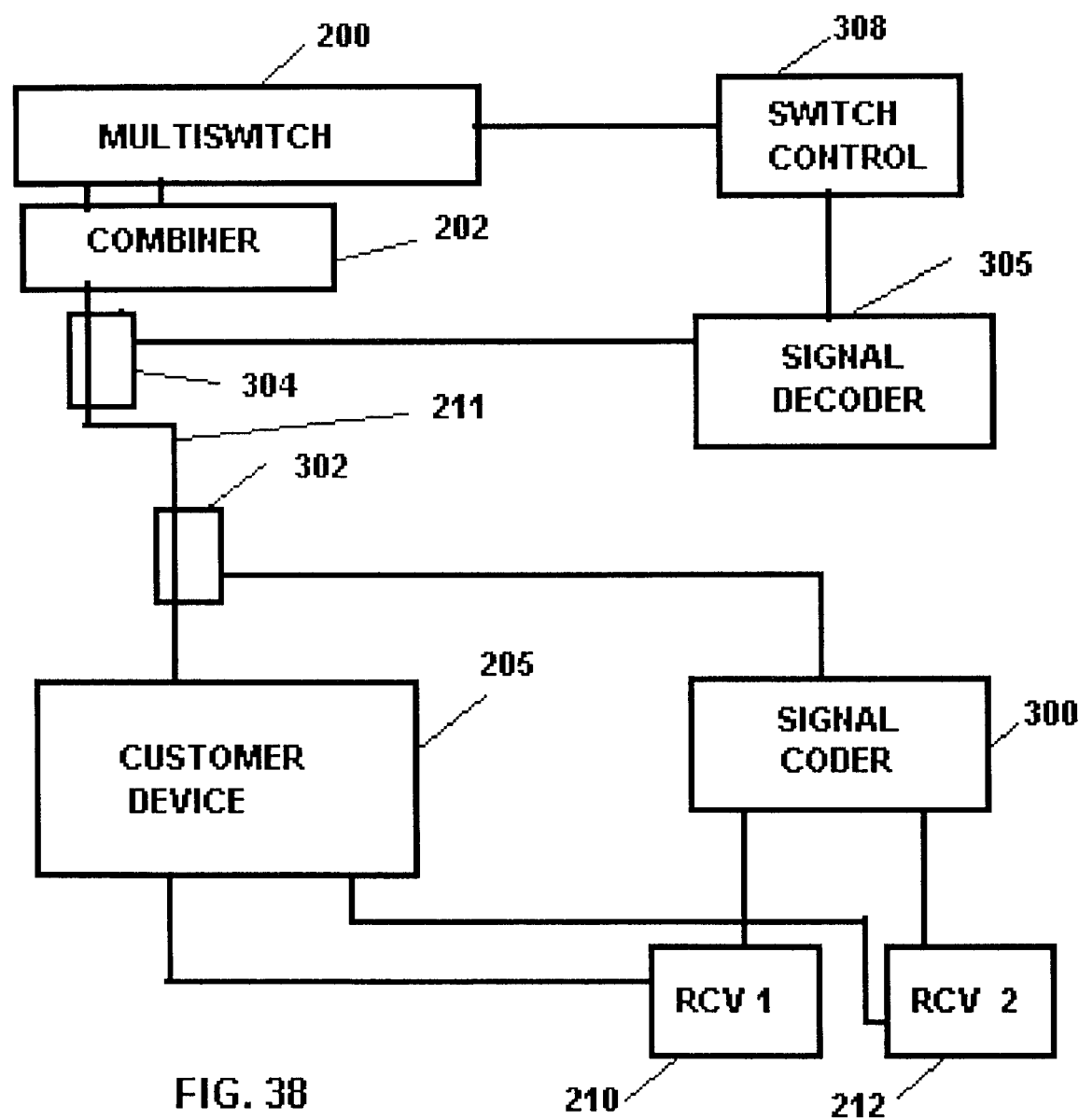
FIG. 38 illustrates a control signal system useful in connection with systems of the present invention.

FIG. 38 illustrates an exemplary arrangement that can be used to signal control signals using the cable 211 which connects the head end equipment to the user equipment. As shown in FIG. 38, multiswitch 200 is controlled by control signals from a control unit 308. Receivers 210 and 212 provide conventional voltage or tone type selection signals to signal coder 300, which may be a part of the customer device 205. Additionally there may be provided satellite selection signals entered by the user directly into device 205 or signal coder 300. Using for example the DiSEqC coding scheme, signal coder 300 generates a signal which is coupled by coupler 302 onto cable 211 and decoupled from cable 211 by decoupler 304. Since the signalling code can be on relatively low frequency compared to the television signals it may be added and removed from the cable 211 by a low frequency diplexer.

The DiSEqC format sends eight bits, which in the example may be divided into two nibbles of four bits that correspond to receivers 210 and 212. The sixteen values of the two nibbles can indicate selection of a satellite signal for each receiver according to the signal received from the receivers 210, 212 and possibly a manual selection entry. These signals are received and decoded in signal decoder 205, which may be combined with switch control 308. The decoded selection signals are used to operate switch control 308 which sends appropriate control signals to multiswitch 200.

Figure 50:
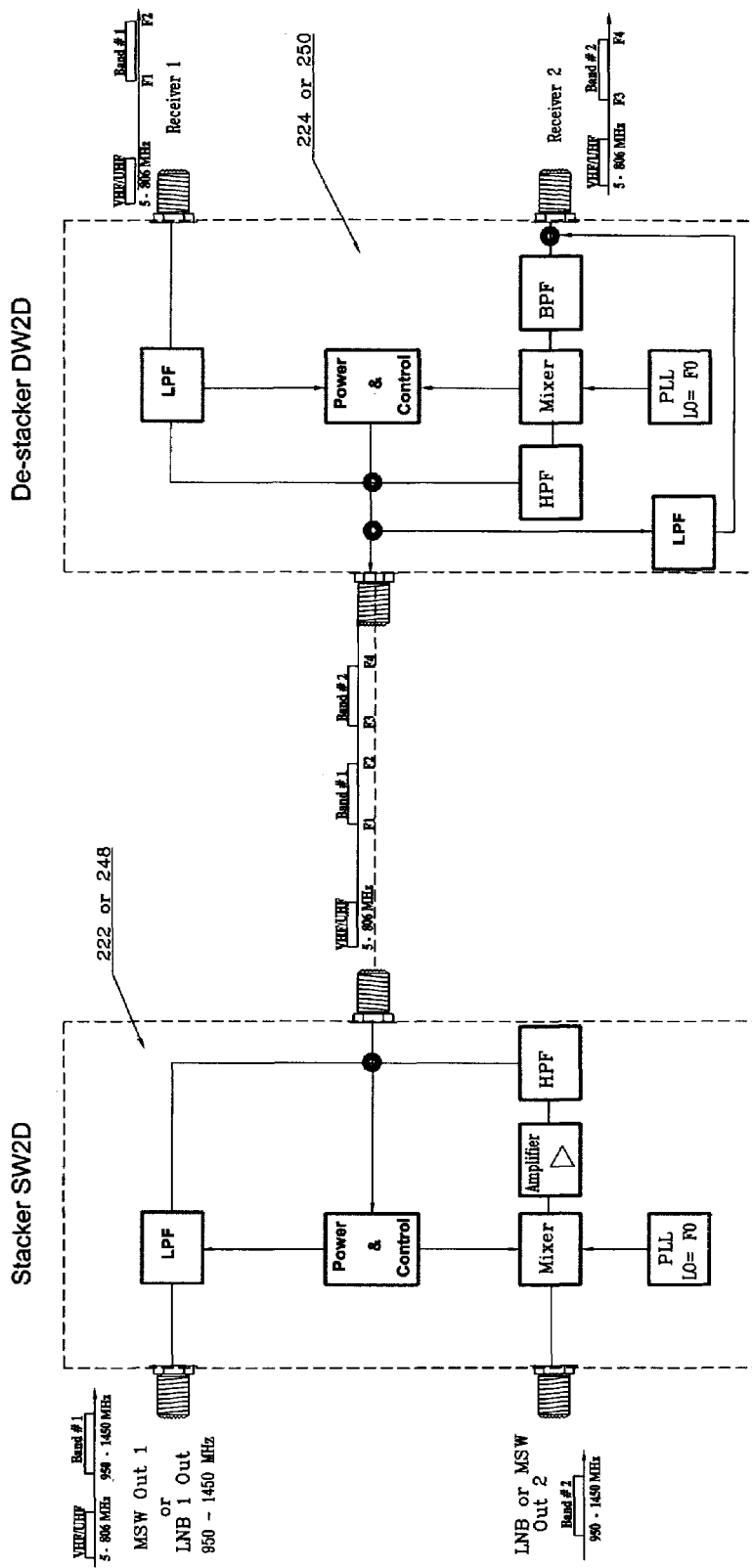
FIG. 50 is a simplified diagram showing a system wherein satellite signals are multiplexed according to user selection of signals.

FIG. 44 shows an arrangement wherein the satellite antenna signals comprise wide-band signals which are stacked in the satellite antenna, to combine left-hand and right-hand circularly polarized satellite signals, into a single band of signals encompassing 950-2025 MHz. The multi-switch 220 has the capability of providing to any of its outputs a satellite signal that is selected from any of the three satellite antennas A, B, or C, and the off-air signal provided by off-air antenna 30. Stacker 222, which is shown in FIG. 50 is similar to the stacker 202 used in the system of FIG. 43, but is configured to provide for the stacking of wider-band satellite signals. These signals are selected by operation of multiswitch 220 by the user's selection of which programming he wishes to view. Destacker 224 is likewise illustrated in FIG. 50. The arrangement of FIG. 44 is configured to provide wide-band satellite signals to any of the receivers. The signals being selected from satellite receiving antennas A, B, or C so that each satellite receiver can independently select the signal which the viewer operating the same wishes to watch. The control system of FIG. 38 can be used to control the multiswitch to select satellite signals.

Figure 53:
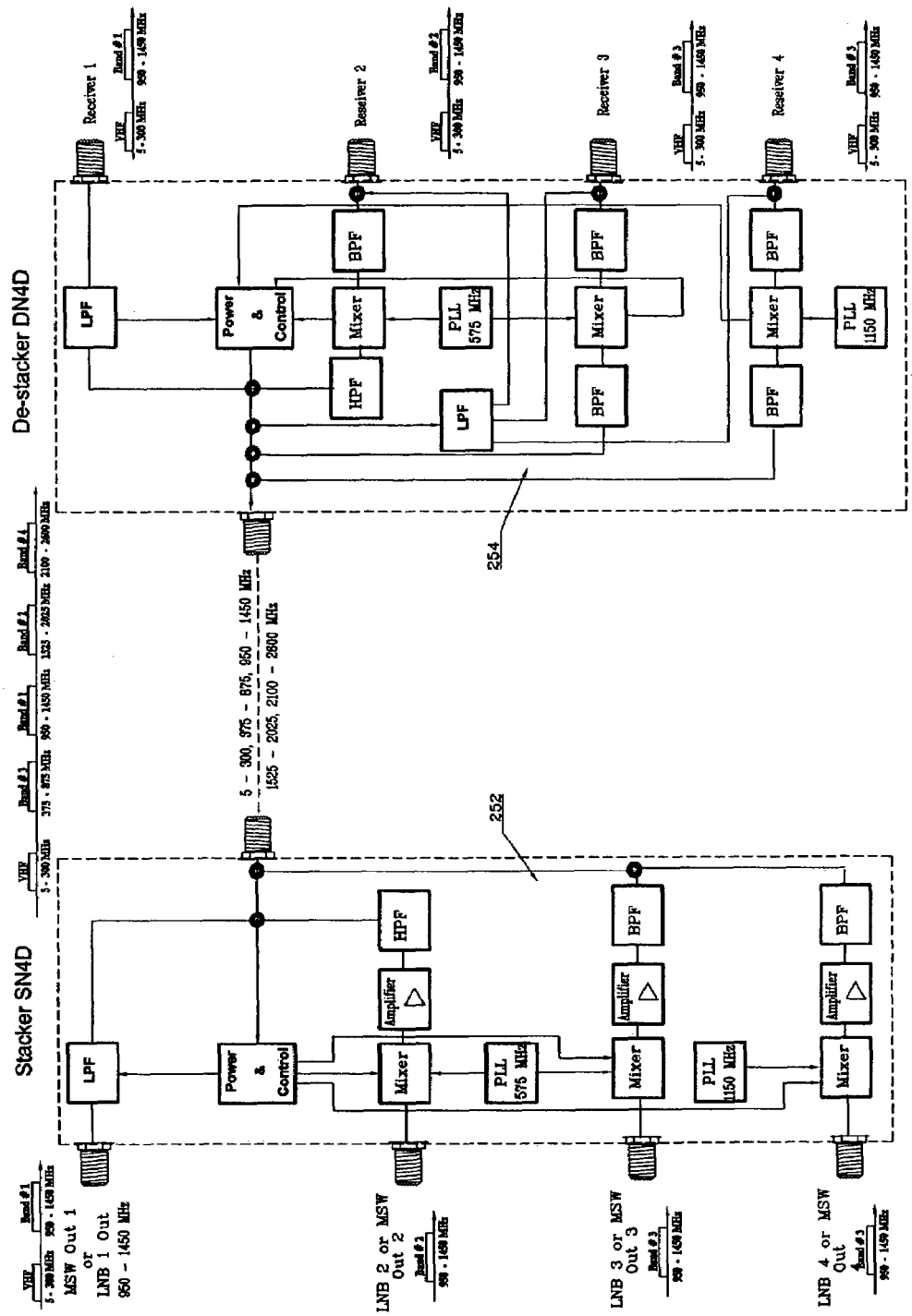
FIG. 53 is another simplified diagram showing a system wherein satellite signals are multiplexed according to user selection of signals.

FIG. 45 illustrates a configuration following the principles of FIGS. 43 and 44 for operation in a multiple dwelling application. In the case of the system of FIG. 45, it is assumed that each satellite receiver is operating with a narrow-band tuner capable of receiving signals in the 950-1450 MHz frequency band. In the system of FIG. 45 the signals received on satellite antennas A, B, and C are provided as separate left-hand and right-hand circularly polarized signals to a head-end amplifying system 230. The outputs of that system are provided to riser cables 232, wherein they are distributed to the various floors in a multiple dwelling building, each signal occupying a frequency band of 950-1450 MHz, for example. In addition, off-air signals provided by antenna 30 are likewise distributed by riser cables 232 throughout the various floors of the building. On each floor, or group of floors, within the building, a customer block multiswitch 234 is provided having, for example, in the embodiment of FIG. 45, seven inputs, corresponding to six satellite bands and one off-air television band, and eight, twelve, sixteen or more outputs each selectable from the seven inputs. The outputs of multiswitch 234 each correspond to a satellite receiver located within a customer apartment. It is recognized that certain customer apartments may have two, three or four satellite receivers, but each apartment usually is provided with usually a single cable servicing the apartment. In the case of a customer having a single receiver such as customer 236, a single switchable output signal from multiswitch 234 which carries the off-air signal and a selected one of the six satellite bands is provided to the customer's apartment and the corresponding satellite receiver through a multiplexer or switch 237. In the case of a customer having two satellite receivers, such as customer 238, a two input stacking device 248 is provided at two outputs of customer block multiswitch 234. Each of the two outputs connected to stacking device 248 is selectable from among the six satellite inputs provided to the customer block and, in addition, carries the off-air signal provided from antenna 30. Stacking device 248 and destacking device 250 located in customer apartment 238 are shown in FIG. 50. These devices enable selectable satellite signals to be carried to apartment 238 using a single cable 249. Likewise, stacking device 252 and destacking device 254 shown in FIG. 53 are provided to give a customer 256 four selected satellite signals for operation by four satellite receivers provided therein. Stacking device 260 and destacking device 262 are provided to provide customer 264 having three satellite receivers with three selectable satellite bands for use by three satellite receivers in apartment 264. The control system of FIG. 38 can be provided to operate the customer block multiswitch 234.

Figure 46:
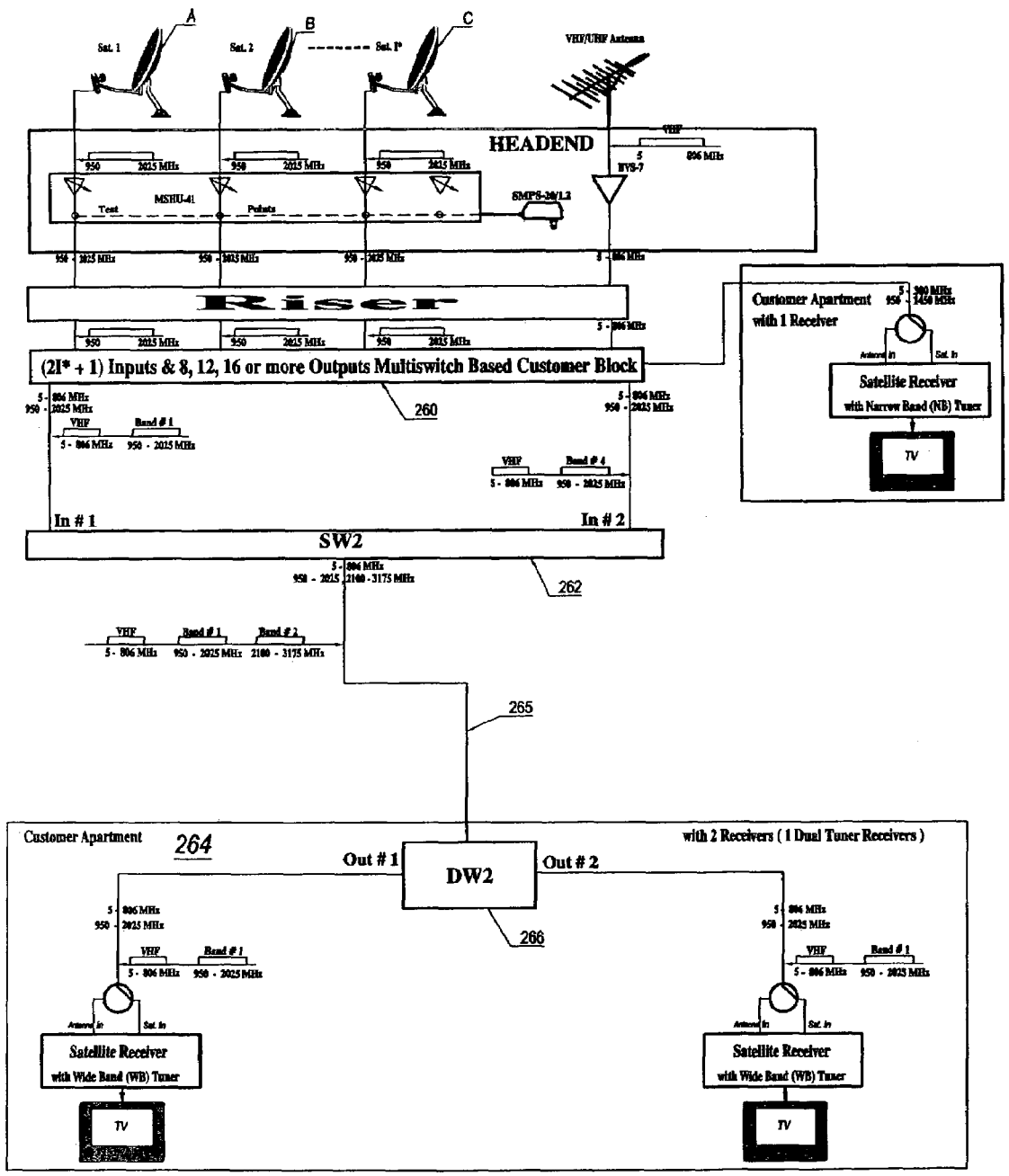
FIG. 46 illustrates another embodiment of the invention wherein satellite signals are multiplexed according to user selection of signals.

FIG. 46 illustrates a configuration for providing wide-band satellite signals to customers over a single cable. In the embodiment illustrated in FIG. 46 each satellite antennas A, B, and C includes a stacking receiver which converts the two polarizations of received signal into a combined signal having a frequency band of 950-2025 MHz. These signals are provided to a customer block switch 260 which operates to provide selected satellite signals to a stacking device 262, the signals being selected according to the programming that is desired by a user in customer apartment 264. A destacking device 266 is provided for converting the stacked signals provided over cable 265 to individual satellite receivers located in apartment 264.

Figure 47:
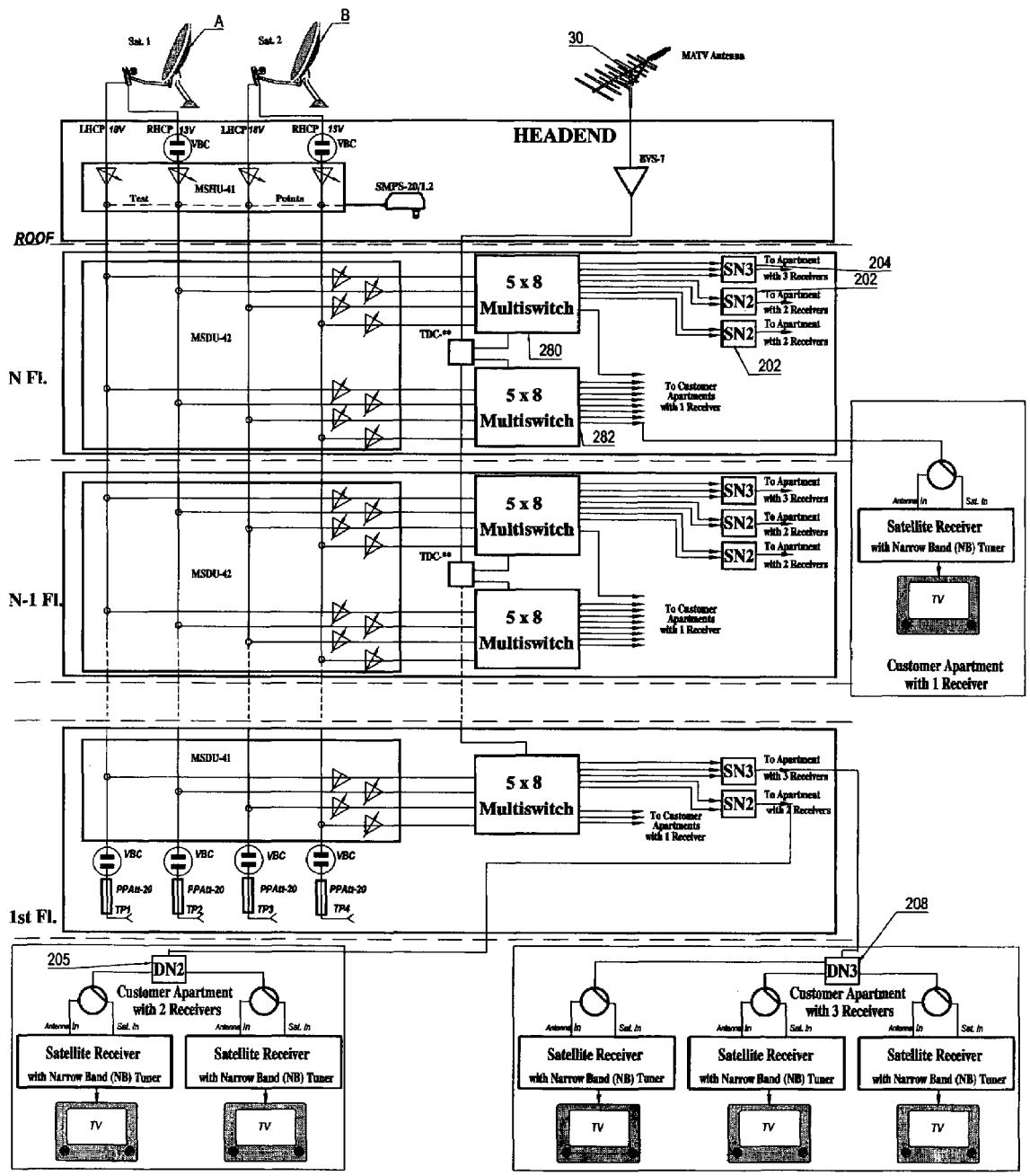
FIG. 47 illustrates another embodiment of the invention wherein satellite signals are multiplexed according to user selection of signals.

FIG. 47 is an example showing an embodiment of the invention as applied to a system having two satellite receiving antennas A and B and an off-air antenna 30. The satellite signals for each polarization and the off-air signals are provided to riser cables which connect to multiswitches 280, 282 located on each floor. Multiswitches 280, 282 selectively connect the cables to stacking devices 202, 204 for providing signals over a single cable to apartments having two or three satellite receivers. Apartments having a single satellite receiver have a cable connected directly to one of multiswitches 280, 282. Destacking devices 205 and 208 are provided in individual apartments having multiple satellite receivers.

Figure 48:
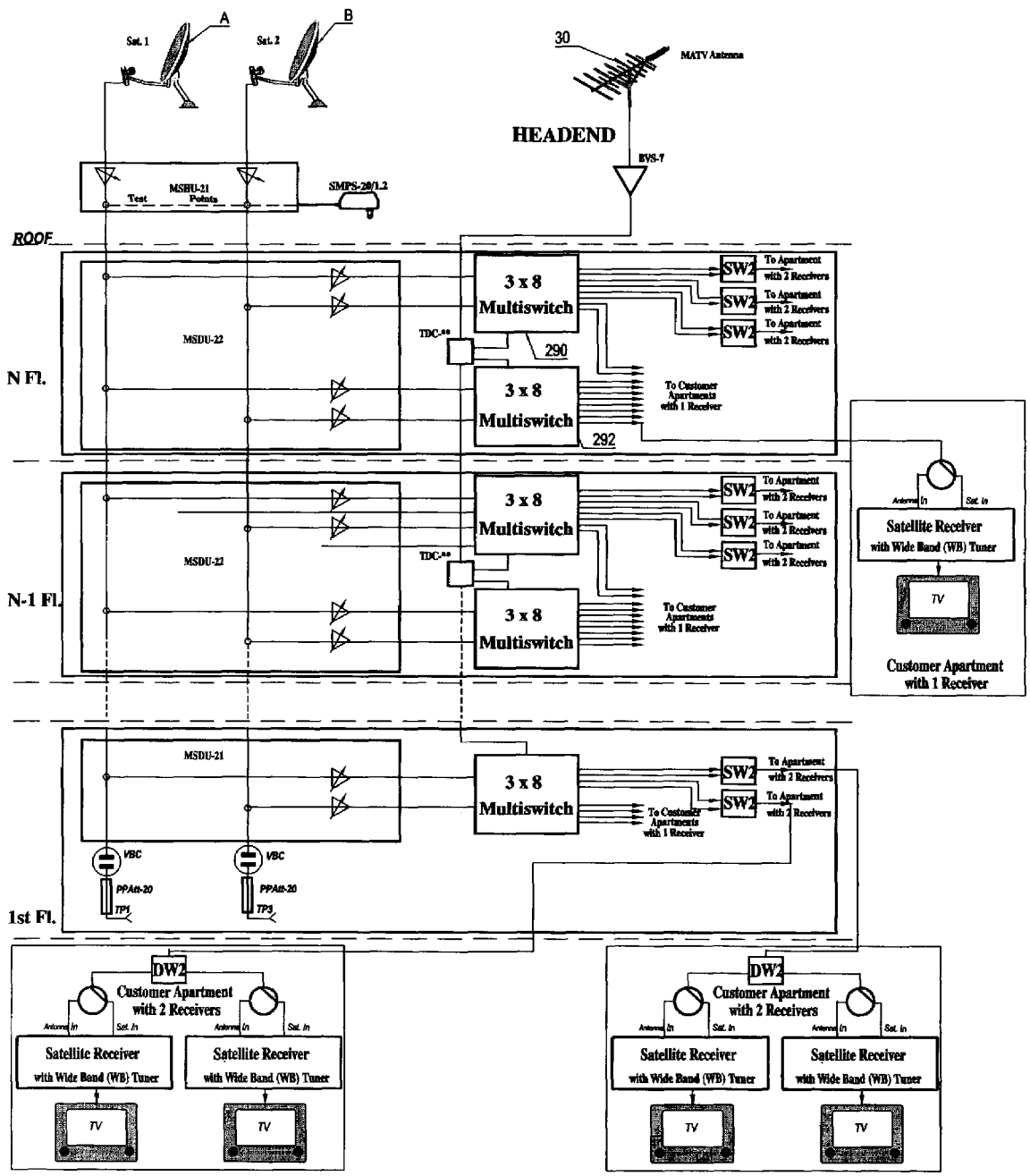
FIG. 48 illustrates another embodiment of the invention wherein satellite signals are multiplexed according to user selection of signals.

FIG. 48 is an example showing an embodiment of the invention as applied to a particular apartment configuration. Wide-band stacked signals from satellite antennas A and B are provided to vertical cables that distribute the signals along with the off-air signal from antenna 30 to each floor. Within each floor 3×8 multiswitches 290, 292 connect the wide-band cable signals selectively to stacking devices or directly to wide-band satellite receivers located in each apartment.

Figure 49:
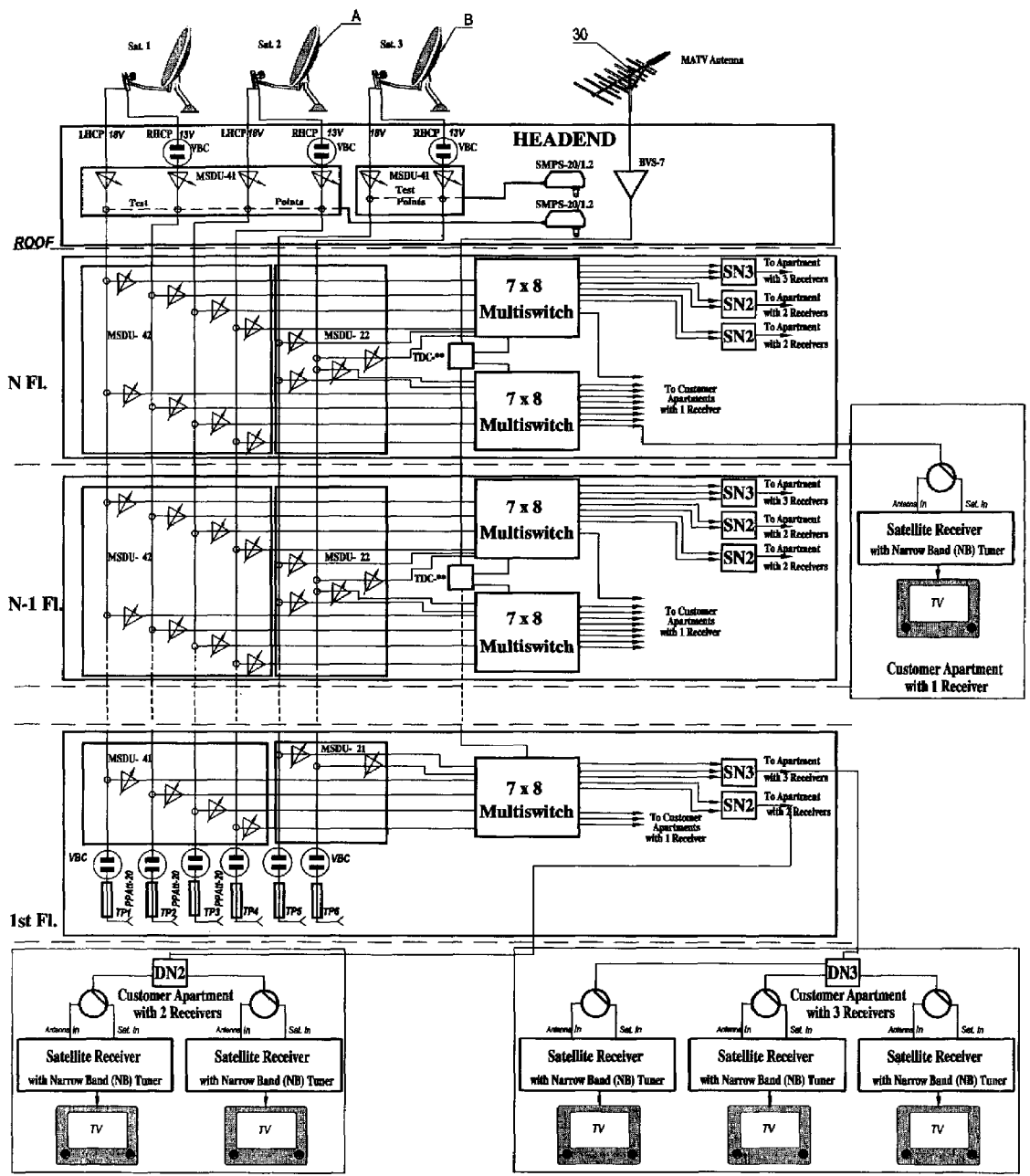
FIG. 49 illustrates another embodiment of the invention wherein satellite signals are multiplexed according to user selection of signals.

FIG. 49 illustrates a specific example of a system wherein three satellite receiving antennas A, B, and C and an off-air antenna 30 are connected via seven vertical cables to 7×8 multiswitches distributed within the building. The multiswitches are connected to single cable lines to each apartment directly or by means of stacking devices where the apartments have more than one satellite receiver.

Figure 54:
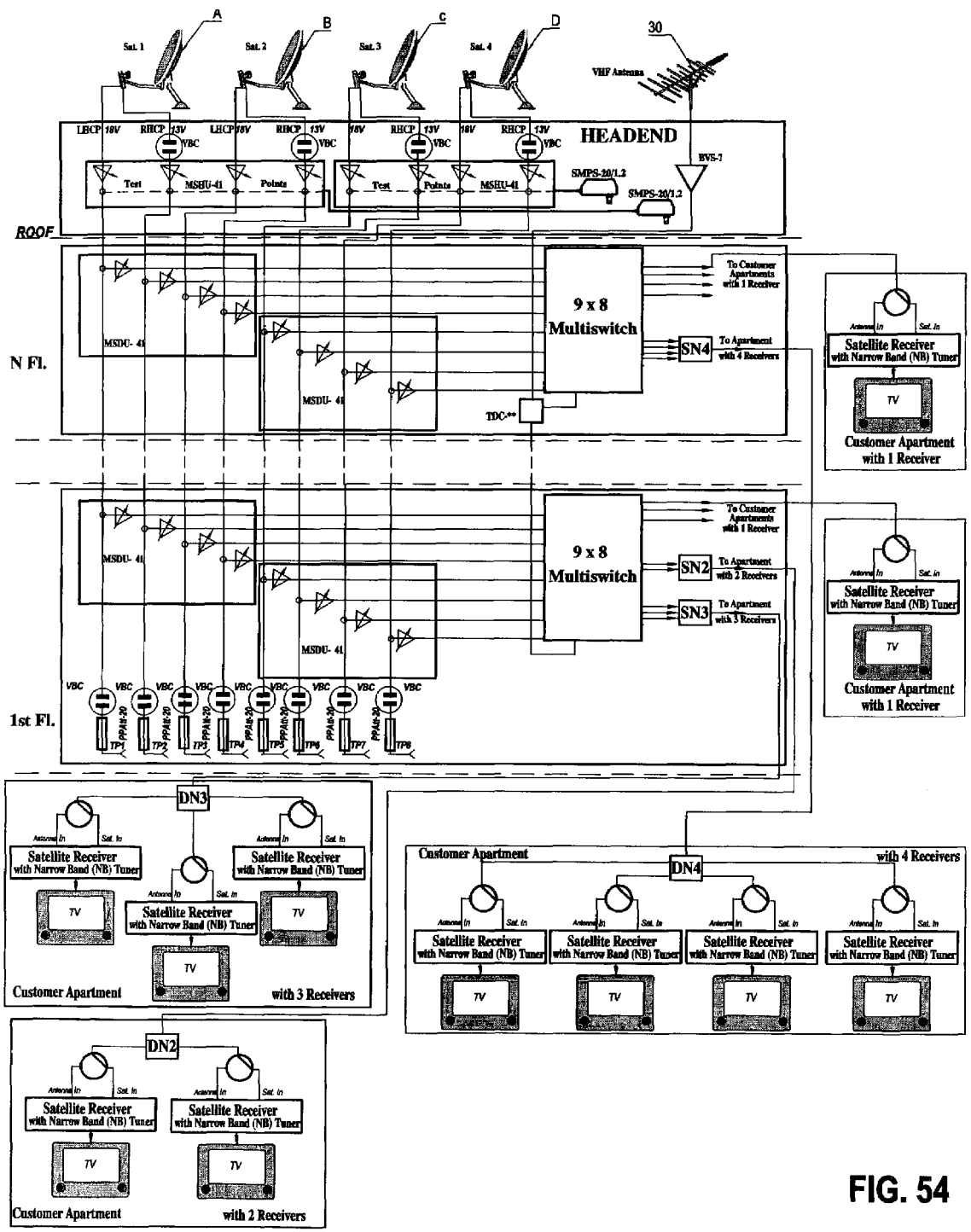
FIG. 54 illustrates another embodiment of the invention wherein satellite signals are multiplexed according to user selection of signals.

FIG. 54 illustrates an example of a device according to the invention wherein there are provided four satellite receiving antennas A, B, C, and D as well as off-air antenna 30, and wherein there are provided nine vertical drop cables to distribute the satellite signals within the building. Each multiswitch has an output corresponding to each satellite receiver located in an apartment and in cases where more than one satellite receiver is located in an apartment, stacking devices are provided connected to the multiswitch, and destacking devices are provided in the apartment.

Figure 55:
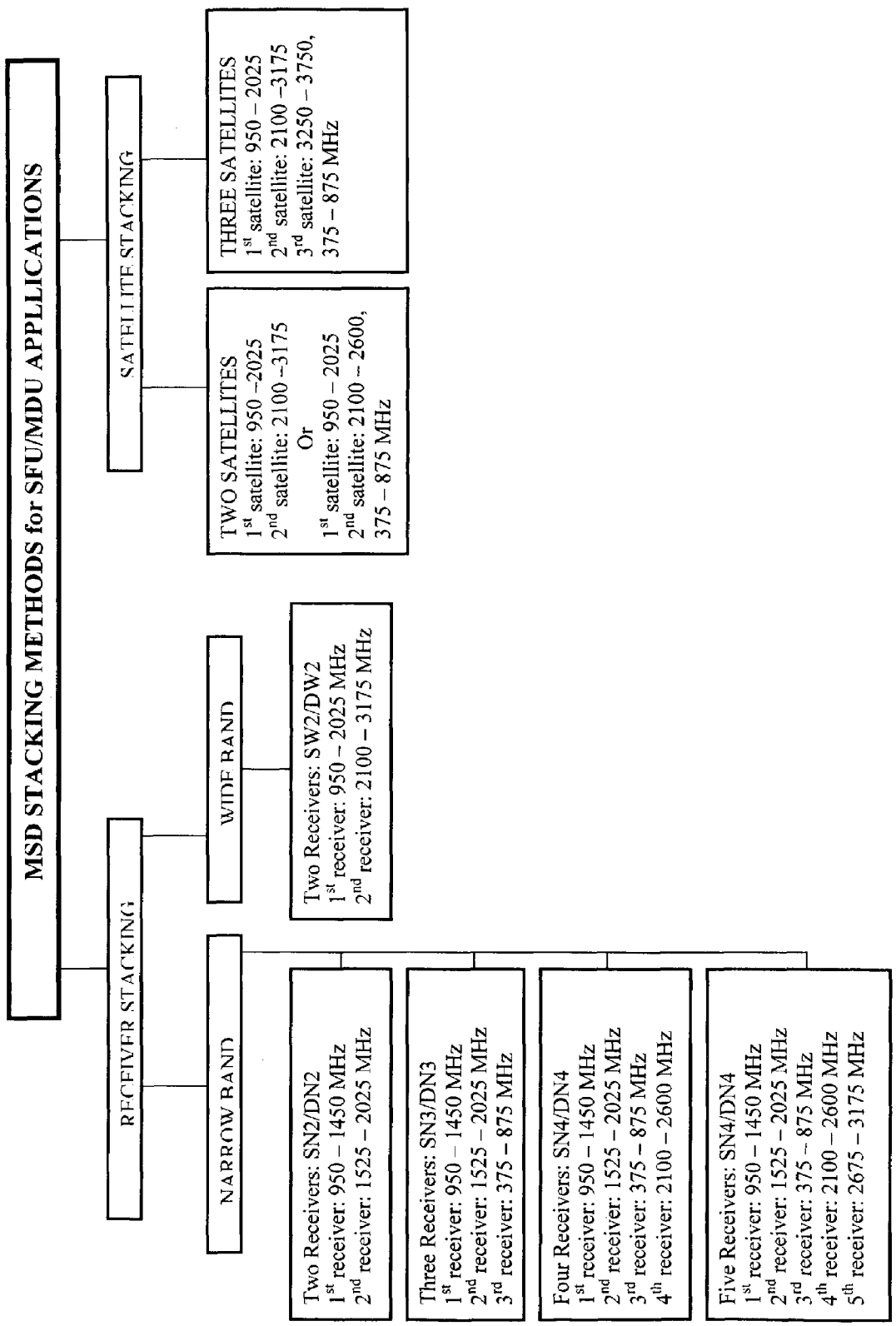
FIG. 55 is a diagram showing alternate stacking arrangements according to the invention.

FIG. 55 is a diagram illustrating the two alternates of stacking. The first being a receiver stacking and the second being satellite stacking. The difference is that the receiver stacking as illustrated in the examples in FIGS. 43-49, and 54 is that not all satellite signals are distributed to each satellite receiver location, but only those signals that are selected by the owner of the receiver corresponding to programming that it is desired to watch.

From the number and variety of the examples given it will be evident to those skilled in the art that the present invention has a broad range of variations and the variation selected will be chosen according to the requirements of a particular installation, either in a multiple-dwelling unit, a community, a hotel or a private home. Likewise the installation will be dependent on the satellite services to be provided.

While there have been described what are believed to be the preferred embodiments of the invention, those skilled in the art will recognize that other changes and modifications may be made thereto without departing from the true spirit of the invention and it is intended to claim all such changes and modifications as fall within the true scope of the invention.

We claim:

1. A multiplexer for frequency multiplexing at least three satellite antenna output signals having selected overlapping frequency bands onto a cable, comprising:
  a plurality of mixers, said plurality being one less than the number of said satellite signals, each receiving one of said satellite antenna output signals;
  a plurality of local oscillators, each associated with one of said mixers, each of said local oscillators having a frequency higher than said satellite antenna output signal frequency bands which is selected to convert one of said satellite antenna signals to a selected component frequency band higher than said satellite antenna output signal frequency bands as a difference signal output of each of said mixers, said component frequency bands being selected to provide non-overlapping signals according to the frequency bands of each of said satellite antenna output signals;
  a plurality of filters, one coupled to receive the output of each of said mixers and each having a passband selected to correspond to one of said component frequency bands;
  and a combiner for combining one of said satellite antenna output signals with component frequency band signals output from said filters.

2. A multiplexer as specified in claim 1 for multiplexing three satellite antenna signals and having two of said mixers, local oscillators and filters.

3. A multiplexer as specified in claim 2 wherein said satellite antenna output signals comprise wideband signals having a frequency band of 950 to 2025 MHz.

4. A multiplexer as specified in claim 1 for multiplexing four satellite antenna signals and having three of said mixers, local oscillators and filters.

5. A multiplexer for frequency multiplexing at least four satellite antenna output signals onto a cable, said signals including first and second wideband satellite antenna output signals and third and fourth narrowband satellite antenna output signals, comprising:
  three mixers coupled to receive said second, third and fourth satellite antenna output signals;
  a first local oscillator providing a signal to said mixer coupled to receive said second satellite antenna output signal, said first local oscillator having an output signal having a frequency higher than said frequency band of said first satellite antenna output signal, said first local oscillator frequency being selected to provide a mixer output difference signal having a first component frequency band higher than said first satellite antenna output signal;
  a second local oscillator providing a signal to said mixer coupled to receive said third satellite antenna signal, said second local oscillator having an output signal having a frequency lower than said frequency band of said first satellite antenna output signal and selected to provide a mixer output difference signal having a second component frequency band lower than said first satellite antenna output signal;
  a third local oscillator providing a signal to said mixer coupled to receive said fourth satellite antenna signal, said third local oscillator having an output signal having a frequency higher than said frequency band of said first satellite antenna output signal and selected to provide a mixer output sum signal having a third component frequency band higher than said first satellite antenna output signal;

a plurality of filters, one coupled to receive the output of each of said mixers and each having a passband selected to correspond to a corresponding one of said component frequency bands;

and a combiner for combining said first satellite antenna output signal with component frequency band signals output from said filters.

6. A multiplexer as specified in claim 5 wherein said wideband satellite antenna output signals comprise wideband signals having a frequency band of 950 to 2025 MHz.

7. A demultiplexer for use with a satellite signal receiver, arranged to receive satellite signals in a satellite antenna output signal frequency band, for demultiplexing at least three satellite antenna signals provided with frequency multiplexing on a cable, including a first multiplexed satellite antenna signal in said satellite antenna output signal frequency band, and other component satellite antenna signals multiplexed with frequency inversion to higher, non-overlapping frequency bands, comprising:

a first plurality of filters, each for selecting one of said multiplexed satellite signals;

a second plurality of mixers, said second plurality being one less than said first plurality, each arranged to receive from corresponding ones of said filters one of said other component satellite antenna signals and a local oscillator signal;

a second plurality of local oscillators, each associated with one of said mixers, each having a frequency higher than said satellite antenna output signal frequency band, and each having a frequency selected to convert one of said other component satellite antenna signals to said satellite antenna signal frequency band as a difference output signal of said associated mixer; and a switch for selecting a signal output from the output of a filter corresponding to said satellite antenna output signal frequency or the output signal from one of said mixers.

8. A demultiplexer as specified in claim 7 further comprising a second plurality of filters each having a passband corresponding to said satellite antenna output signal frequency band and arranged between said mixers and said switch.

9. A demultiplexer as specified in claim 7 wherein said switch is a multiswitch having a first plurality of inputs for receiving signal outputs from said filter and said mixers and a third plurality of outputs, said switch connecting any of said inputs to any of said outputs.

10. A system for providing independently selectable satellite television signals to a user having a plurality of satellite television receivers from shared satellite signal receiving antennas, comprising:

a multiswitch having a first number of inport ports corresponding to a first number of available satellite signals derived from a plurality of satellite antennas and having a second number of output terminals corresponding to the satellite receiver capacity of said system, said multiswitch being responsive to supplied control signals to selectively connect any of said input ports to any of said output terminals;

a frequency converting multiplexer for receiving at least two satellite signals from at least two output terminals of said multiswitch and for supplying a user output signal having said first and second satellite signals on first and second non-overlapping frequency bands;

a cable connected to said multiplexer for transferring said user output signal to a user location;

a frequency converting demultiplexer at said user location for providing said first and second satellite signals to first and second satellite receivers in the same satellite frequency band; and a control signal apparatus associated with said frequency converting demultiplexer for receiving selection signals from said receivers, for signalling said selection signals over said cable to a control unit associated with said multiswitch, wherein said control unit provides control signals to said multiswitch in accordance with selection signals provided by said receivers.

11. A system as specified in claim 10 wherein said selection signals are converted to digital code signals and sent over said cable to said control unit.

* * * * *